US008812281B2

(12) United States Patent
Tang et al.

(10) Patent No.: US 8,812,281 B2
(45) Date of Patent: *Aug. 19, 2014

(54) METHODS FOR DESIGNING SECONDARY CUTTING STRUCTURES FOR A BOTTOM HOLE ASSEMBLY

(71) Applicant: Smith International, Inc., Houston, TX (US)

(72) Inventors: Wei Tang, Katy, TX (US); Gordon Whipple, Spring, TX (US); Sujian J. Huang, Beijing (CN); Navish Makkar, Houston, TX (US); Tommy Laird, Cypress, TX (US); Gail Nelson, Tomball, TX (US)

(73) Assignee: Smith International, Inc., Houston, TX (US)

( * ) Notice: Subject to any disclaimer, the term of this patent is extended or adjusted under 35 U.S.C. 154(b) by 0 days.
This patent is subject to a terminal disclaimer.

(21) Appl. No.: 13/846,486

(22) Filed: Mar. 18, 2013

(65) Prior Publication Data
US 2013/0262048 A1 Oct. 3, 2013

Related U.S. Application Data

(63) Continuation of application No. 12/179,516, filed on Jul. 24, 2008, now Pat. No. 8,401,831, which is a
(Continued)

(51) Int. Cl.
G06G 7/50 (2006.01)
G06F 17/50 (2006.01)
E21B 44/00 (2006.01)
E21B 17/10 (2006.01)
E21B 10/43 (2006.01)
E21B 47/12 (2012.01)
E21B 10/54 (2006.01)
E21B 10/00 (2006.01)

(52) U.S. Cl.
CPC ............ G06F 17/5086 (2013.01); E21B 44/00 (2013.01); E21B 17/1014 (2013.01); E21B 10/43 (2013.01); E21B 47/12 (2013.01); E21B 10/54 (2013.01); E21B 10/00 (2013.01)
USPC .................................................. 703/7; 702/9

(58) Field of Classification Search
CPC ......... E21B 10/00; E21B 10/43; E21B 10/54; E21B 17/1014; E21B 44/00; E21B 47/12; G06F 17/5086
USPC ................................................ 703/6–7; 702/9
See application file for complete search history.

(56) References Cited

U.S. PATENT DOCUMENTS 4,630,692 A 12/1986 Ecer
4,630,694 A 12/1986 Walton et al.
(Continued)

FOREIGN PATENT DOCUMENTS

GB 2367843 4/2002
(Continued)

OTHER PUBLICATIONS

Ma et al. "Dynmaics of roller Cone Bits"., Journal of Energy resources Technology, Dec. 1985. vol. 107/543., 7 Pages.*
(Continued)

Primary Examiner — Eun Kim
(74) Attorney, Agent, or Firm — Osha Liang LLP

(57) ABSTRACT

A method for designing a secondary cutting structure for use in a bottom hole assembly, the method including defining initial design parameters for the secondary cutting structure and analyzing forces acting on the secondary cutting structure. Additionally, the method includes modifying at least one design element of the secondary cutting structure and simulating an effect of the modifying on both the secondary cutting structure and a primary cutting structure to determine if an improved condition is met. Also, a method for designing a drilling tool assembly, the method including defining initial drilling tool assembly design parameters including a primary cutting structure and a secondary cutting structure, and simulating a dynamic response of the drilling tool assembly. Additionally, the method includes adjusting at least one design element of the secondary cutting structure based on the dynamic response of the drilling tool assembly, determining if the adjusted design element improved a condition of the drilling, and repeating the simulating and adjusting until the condition is optimized.

19 Claims, 43 Drawing Sheets

Related U.S. Application Data continuation-in-part of application No. 11/733,955, filed on Apr. 11, 2007, which is a continuation of application No. 11/385,969, filed on Mar. 21, 2006, now Pat. No. 7,251,590, which is a continuation-in-part of application No. 11/100,337, filed on Apr. 6, 2005, now Pat. No. 7,464,013, which is a continuation-in-part of application No. 09/524,088, filed on Mar. 13, 2000, now Pat. No. 6,516,293, and a continuation-in-part of application No. 09/635,116, filed on Aug. 9, 2000, now Pat. No. 6,873,947, which is a continuation of application No. 09/524,088, filed on Mar. 13, 2000, now Pat. No. 6,516,293, said application No. 11/100,337 is a continuation-in-part of application No. 09/689,299, filed on Oct. 11, 2000, now Pat. No. 6,785,641, and a continuation-in-part of application No. 10/749,019, filed on Dec. 29, 2003, now abandoned, which is a continuation of application No. 09/635,116, filed on Aug. 9, 2000, now Pat. No. 6,873,947, said application No. 11/100,337 is a continuation-in-part of application No. 10/851,677, filed on May 21, 2004, now Pat. No. 7,020,597, which is a continuation-in-part of application No. 09/689,299, filed on Oct. 11, 2000, now Pat. No. 6,785,641, said application No. 11/100,337 is a continuation-in-part of application No. 10/852,574, filed on May 24, 2004, now Pat. No. 7,139,689, which is a continuation of application No. 09/689,299, filed on Oct. 11, 2000, now Pat. No. 6,785,641, said application No. 11/100,337 is a continuation-in-part of application No. 10/888,446, filed on Jul. 9, 2004, and a continuation-in-part of application No. 10/888,358, filed on Jul. 9, 2004, now Pat. No. 7,693,695, said application No. 11/100,337 is a continuation-in-part of application No. 10/888,466, filed on Jul. 9, 2004.

(60) Provisional application No. 60/485,642, filed on Jul. 9, 2003.

(56) References Cited

U.S. PATENT DOCUMENTS

| | | | |
|---|---|---|---|
| 5,035,293 A | | 7/1991 | Rives |
| 5,733,664 A | | 3/1998 | Kelley et al. |
| 5,842,149 A | | 11/1998 | Harrell et al. |
| 5,881,310 A | | 3/1999 | Airhart et al. |
| 5,937,958 A | | 8/1999 | Mensa-Wilmot et al. |
| 5,950,747 A | * | 9/1999 | Tibbitts et al. ............ 175/432 |
| 5,992,542 A | | 11/1999 | Rives |
| 6,233,524 B1 | * | 5/2001 | Harrell et al. ............ 702/9 |
| 6,241,034 B1 | * | 6/2001 | Steinke et al. ............ 175/331 |
| 6,386,297 B1 | | 5/2002 | Cooley et al. |
| 6,424,919 B1 | | 7/2002 | Moran et al. |
| 6,516,293 B1 | | 2/2003 | Huang et al. |
| 6,732,052 B2 | | 5/2004 | Macdonald et al. |
| 6,732,817 B2 | | 5/2004 | Dewey et al. |
| 6,785,641 B1 | | 8/2004 | Huang |
| 6,873,947 B1 | | 3/2005 | Huang et al. |
| 6,935,442 B2 | | 8/2005 | Boulet et al. |
| 7,020,597 B2 | | 3/2006 | Oliver et al. |
| 7,139,689 B2 | | 11/2006 | Huang |
| 2004/0222025 A1 | | 11/2004 | Beaton |

FOREIGN PATENT DOCUMENTS

| | | |
|---|---|---|
| GB | 2424975 | 10/2006 |
| WO | 00/12859 A3 | 3/2000 |
| WO | 00/12860 A2 | 3/2000 |

OTHER PUBLICATIONS

Dekun Ma, et al.; "The Computer Simulation of the Interaction Between Roller Bit and Rock"; International Meeting on Petroleum Engineering; PR China; Nov. 14-17, 1995; pp. 309-317, SPE29922.
Yu Wang and Matthew T. Mason, "Two-Dimensional Rigid-Body Collisions with Friction", Journal of Applied Mechanics, Sep. 1992, vol. 59; pp. 635 through 642.
T.M. Warren and A. Sinor, "Drag Bit Performance Modeling", Society of Petroleum Engineers, 61st Annual Technical Conference and Exhibition held in New Orleans, LA, Oct. 5-8, 1986, SPE 18618 (2 pages).
PCT International Search Report issued in PCT Application No. PCT/US05/17943 flied Feb. 14, 2006 (5 pages).
Non-Final Office Action for related U.S. Appl. No. 11/495,149 dated Oct. 8, 2009. (20 Pages).
"Drilling Index—a New Approach to Bit Performance", Perrin et al. SPE/IADC Drilling Conference Mar. 4-6, 1997. Amsterdam, Netherlands (7 pages).
Office Action for related U.S. Appl. No. 10/888,446 dated Nov. 3, 2009. (13 pages).
Search and Examination Report for related Great Britian Application No. GB0912772.1 dated Nov. 9, 2009. (7 pages).
Examination Report issued in corresponding British Patent Application No. GB0912772,1; Dated Oct. 18, 2010 (2 pages).
Examination Report issued in corresponding British Application No. GB0912772.1; Dated Mar. 2, 2011 (1 page).
Warren., "Laboratory Drilling Performance of PDC Bits"., SPE Drilling Engineering, Jun. 1988. p. 125-135.
Yigit et al. "Coupled Torsional and Bending Vibrations of Drillstrings Subject to Impact With Friction"., Journal of Sound and Vibration (1988). p. 167-181.
Warren et al. "Drag Bit Performance Modeling"., SPE, 1986 (2 pages).
Office Action issued in the United Kingdom Application No. GB0912772.1 dated Sep. 23, 2011 (2 pages).
PCT Written Opinion issued in PCT Application No. PCT/US05/17943 dated Feb. 14, 2006 (4 pages).
U.S. Non-Final Office Action dated Apr. 17, 2009, for related U.S. Appl. No. 11/137,713 (21 pages).
Notice of Allowance issued in related U.S. Appl. No. 11/733,955, mailed Mar. 6, 2014 (8 pages).
Gas TIPS, vol. 9, No. 2, Spring 2003 (36 pages).

* cited by examiner

| cut#<br>blade | radius | ang_arnd | height | prf_ang | bk_rake | sd_rake | cut_dia | size_type | blade |
|---|---|---|---|---|---|---|---|---|---|
| 1 | 4.77 | 0.00 | 15.19 | 45.54 | 29.80 | -0.00 | 0.529 | 1313 | 1 |
| 2 | 4.79 | -19.00 | 15.19 | 45.54 | 29.80 | 0.00 | 0.529 | 1313 | 2 |
| 3 | 4.93 | 238.99 | 15.02 | 48.43 | 29.80 | 0.00 | 0.529 | 1313 | 5 |
| 4 | 4.95 | 220.00 | 15.02 | 48.43 | 29.80 | 0.00 | 0.529 | 1313 | 6 |
| 5 | 5.10 | 101.00 | 14.84 | 51.33 | 29.80 | 0.00 | 0.529 | 1313 | 4 |
| 6 | 5.09 | 120.00 | 14.84 | 51.33 | 29.80 | -0.00 | 0.529 | 1313 | 3 |
| 7 | 5.23 | 0.00 | 14.65 | 54.22 | 29.80 | -0.00 | 0.529 | 1313 | 1 |
| 8 | 5.24 | -19.00 | 14.65 | 54.22 | 29.80 | 0.00 | 0.529 | 1313 | 2 |
| 9 | 5.36 | 238.99 | 14.46 | 57.12 | 29.80 | 0.00 | 0.529 | 1313 | 6 |
| 10 | 5.38 | 220.00 | 14.46 | 57.12 | 29.80 | 0.00 | 0.529 | 1313 | 5 |
| 11 | 5.50 | 101.00 | 14.26 | 60.02 | 29.80 | 0.00 | 0.529 | 1313 | 3 |
| 12 | 5.48 | 120.00 | 14.26 | 60.02 | 29.80 | -0.00 | 0.529 | 1313 | 4 |
| 13 | 5.60 | 0.00 | 14.05 | 62.91 | 29.80 | 0.00 | 0.529 | 1313 | 1 |
| 14 | 5.61 | -19.00 | 14.05 | 62.91 | 29.80 | 0.00 | 0.529 | 1313 | 2 |
| 15 | 5.70 | 238.99 | 13.84 | 65.81 | 29.80 | 0.00 | 0.529 | 1313 | 6 |
| 16 | 5.71 | 220.00 | 13.84 | 65.81 | 29.80 | 0.00 | 0.529 | 1313 | 5 |
| 17 | 5.80 | 101.00 | 13.62 | 68.71 | 29.80 | 0.00 | 0.529 | 1313 | 4 |
| 18 | 5.79 | 120.00 | 13.62 | 68.71 | 29.80 | -0.00 | 0.529 | 1313 | 3 |
| 19 | 5.87 | 0.00 | 13.40 | 71.60 | 29.80 | -0.00 | 0.529 | 1313 | 1 |
| 20 | 5.88 | -19.00 | 13.40 | 71.60 | 29.80 | 0.00 | 0.529 | 1313 | 2 | ns
METHODS FOR DESIGNING SECONDARY CUTTING STRUCTURES FOR A BOTTOM HOLE ASSEMBLY

CROSS-REFERENCE TO RELATED APPLICATIONS

This application is a divisional application of U.S. patent application Ser. No. 12/179,516 (now U.S. Pat. No. 8,401,831), filed on Jul. 24, 2008, which claims the benefit, pursuant to 35 U.S.C. §120, as a continuation-in-part application of U.S. patent application Ser. No. 11/733,955, filed Apr. 11, 2007, which is a continuation of U.S. patent application Ser. No. 11/385,969, filed on Apr. 6, 2005 (now U.S. Pat. No. 7,251,590), which is a continuation-in-part of U.S. patent application Ser. No. 11/100,337 (now U.S. Pat. No. 7,464,013), filed on Apr. 6, 2005, which is a continuation-in-part of Ser. No. 09/524,088 (now U.S. Pat. No. 6,516,293), Ser. No. 09/635,116 (now U.S. Pat. No. 6,873,947), Ser. No. 10/749,019, Ser. No. 09/689,299 (now U.S. Pat. No. 6,785,641), Ser. No. 10/852,574 (now U.S. Pat. No. 7,139,689), Ser. No. 10/851,677 (now U.S. Pat. No. 7,020,597), Ser. No. 10/888,358 (now U.S. Pat. No. 7,693,695), Ser. No. 10/888,446, all of which are expressly incorporated by reference in their entirety.

BACKGROUND OF INVENTION

1. Field of the Invention

The invention relates generally to methods and systems involving cutting tools in oilfield applications.

2. Background Art

FIG. 1 shows one example of a conventional drilling system for drilling an earth formation. The drilling system includes a drilling rig 10 used to turn a drilling tool assembly 12 that extends downward into a well bore 14. The drilling tool assembly 12 includes a drilling string 16, and a bottom-hole assembly (BHA) 18, which is attached to the distal end of the drill string 16. The "distal end" of the drill string is the end furthest from the drilling rig.

The drill string 16 includes several joints of drill pipe 16a connected end to end through tool joints 16b. The drill string 16 is used to transmit drilling fluid (through its hollow core) and to transmit rotational power from the drill rig 10 to the BHA 18. In some cases the drill string 16 further includes additional components such as subs, pup joints, etc.

The BHA 18 includes at least a drill bit 20. Typical BHA's may also include additional components attached between the drill string 16 and the drill bit 20. Examples of additional BHA components include drill collars, stabilizers, measurement-while-drilling (MWD) tools, logging-while-drilling (LWD) tools, subs, hole enlargement devices (e.g., hole openers and reamers), jars, accelerators, thrusters, downhole motors, and rotary steerable systems. In certain BHA designs, the BHA may include either a drill bit 20 or at least one secondary cutting structure.

In general, drilling tool assemblies 12 may include other drilling components and accessories, such as special valves, such as kelly cocks, blowout preventers, and safety valves. Additional components included in a drilling tool assembly 12 may be considered a part of the drill string 16 or a part of the BHA 18 depending on their locations in the drilling tool assembly 12.

The drill bit 20 in the BHA 18 may be any type of drill bit suitable for drilling earth formation. Two common types of drill bits used for drilling earth formations are fixed-cutter (or fixed-head) bits and roller cone bits. FIG. 2 shows one example of a fixed-cutter bit. FIG. 3 shows one example of a roller cone bit.

Referring to FIG. 2, fixed-cutter bits (also called drag bits) 21 typically comprise a bit body 22 having a threaded connection at one end 24 and a cutting head 26 formed at the other end. The head 26 of the fixed-cutter bit 21 typically includes a plurality of ribs or blades 28 arranged about the rotational axis of the drill bit and extending radially outward from the bit body 22. Cutting elements 29 are embedded in the raised ribs 28 to cut formation as the drill bit is rotated on a bottom surface of a well bore. Cutting elements 29 of fixed-cutter bits typically comprise polycrystalline diamond compacts (PDC) or specially manufactured diamond cutters. These drill bits are also referred to as PDC bits.

Referring to FIG. 3, roller cone bits 30 typically comprise a bit body 32 having a threaded connection at one end 34 and one or more legs (typically three) extending from the other end. A roller cone 36 is mounted on each leg and is able to rotate with respect to the bit body 32. On each cone 36 of the drill bit 30 are a plurality of cutting elements 38, typically arranged in rows about the surface of the cone 36 to contact and cut through formation encountered by the drill bit. Roller cone bits 30 are designed such that as a drill bit rotates, the cones 36 of the roller cone bit 30 roll on the bottom surface of the well bore (called the "bottomhole") and the cutting elements 38 scrape and crush the formation beneath them. In some cases, the cutting elements 38 on the roller cone bit 30 comprise milled steel teeth formed on the surface of the cones 36. In other cases, the cutting elements 38 comprise inserts embedded in the cones. Typically, these inserts are tungsten carbide inserts or polycrystalline diamond compacts. In some cases hardfacing is applied to the surface of the cutting elements and/or cones to improve wear resistance of the cutting structure.

For a drill bit 20 to drill through formation, sufficient rotational moment and axial force must be applied to the drill bit 20 to cause the cutting elements of the drill bit 20 to cut into and/or crush formation as the drill bit is rotated. The axial force applied on the drill bit 20 is typically referred to as the "weight on bit" (WOB). The rotational moment applied to the drilling tool assembly 12 at the drill rig 10 (usually by a rotary table or a top drive mechanism) to turn the drilling tool assembly 12 is referred to as the "rotary torque". The speed at which the rotary table rotates the drilling tool assembly 12, typically measured in revolutions per minute (RPM), is referred to as the "rotary speed". Additionally, the portion of the weight of the drilling tool assembly supported at the rig 10 by the suspending mechanism (or hook) is typically referred to as the hook load.

As the drilling industry continues to evolve, methods of simulating and/or modeling the performance of components used in the drilling industry have begun to be developed. Drilling tool assemblies can extend more than a mile in length while being less than a foot in diameter. As a result, these assemblies are relatively flexible along their length and may vibrate when driven rotationally by the rotary table. Drilling tool assembly vibrations may also result from vibration of the drill bit during drilling. Several modes of vibration are possible for drilling tool assemblies. In general, drilling tool assemblies may experience torsional, axial, and lateral vibrations. Although partial damping of vibration may result due to viscosity of drilling fluid, friction of the drill pipe rubbing against the wall of the well bore, energy absorbed in drilling the formation, and drilling tool assembly impacting with well bore wall, these sources of damping are typically not enough to suppress vibrations completely.

One example of a method that may be used to simulate a drilling tool assembly is disclosed in U.S. patent application Ser. No. 09/689,299 entitled "Simulating the Dynamic Response of a Drilling Tool Assembly and its Application to Drilling Tool Assembly Design Optimizing and Drilling Performance Optimization", which is incorporated by reference in its entirety.

Vibrations of a drilling tool assembly are difficult to predict because different forces may combine to produce the various modes of vibration, and models for simulating the response of an entire drilling tool assembly including a drill bit interacting with formation in a drilling environment have not been available. Drilling tool assembly vibrations are generally undesirable, not only because they are difficult to predict, but also because the vibrations can significantly affect the instantaneous force applied on the drill bit. This can result in the drill bit not operating as expected.

For example, vibrations can result in off-centered drilling, slower rates of penetration, excessive wear of the cutting elements, or premature failure of the cutting elements and the drill bit. Lateral vibration of the drilling tool assembly may be a result of radial force imbalances, mass imbalance, and drill bit/formation interaction, among other things. Lateral vibration results in poor drilling tool assembly performance, over-gage hole drilling, out-of-round, or "lobed" well bores and premature failure of both the cutting elements and drill bit bearings. Lateral vibration is particularly problematic if hole openers are used.

During drilling operations, it may be desirable to increase the diameter of the drilled wellbore to a selected larger diameter. Further, increasing the diameter of the wellbore may be necessary if, for example, the formation being drilled is unstable such that the wellbore diameter changes after being drilled by the drill bit. Accordingly, tools known in the art such as "hole openers" and "underreamers" have been used to enlarge diameters of drilled wellbores.

In some drilling environments, it may be advantageous, from an ease of drilling standpoint, to drill a smaller diameter borehole (e.g., an 8½ inch diameter hole) before opening or underreaming the borehole to a larger diameter (e.g., to a 17½ inch diameter hole). Other circumstances in which first drilling smaller hole and then underreaming or opening the hole include directionally drilled boreholes. It is difficult to directionally drill a wellbore with a large diameter bit because, for example, larger diameter bits have an increased tendency to "torque-up" (or stick) in the wellbore. When a larger diameter bit "torques-up", the bit tends to drill a tortuous trajectory because it periodically sticks and then frees up and unloads torque. Therefore it is often advantageous to directionally drill a smaller diameter hole before running a hole opener in the wellbore to increase the wellbore to a desired larger diameter.

A typical prior art hole opener is disclosed in U.S. Pat. No. 4,630,694 issued to Walton et al. The hole opener disclosed in the '694 patent includes a bull nose, a pilot section, and an elongated body adapted to be connected to a drillstring used to drill a wellbore. The hole opener also includes a triangularly arranged, hardfaced blade structure adapted to increase a diameter of the wellbore.

Another prior art hole opener is disclosed in U.S. Pat. No. 5,035,293 issued to Rives. The hole opener disclosed in the '293 patent may be used either as a sub in a drill string, or may be coupled to the bottom end of a drill string in a manner similar to a drill bit. This particular hole opener includes radially spaced blades with cutting elements and shock absorbers disposed thereon.

Other prior art hole openers include, for example, rotatable cutters affixed to a tool body in a cantilever fashion. Such a hole opener is shown, for example, in U.S. Pat. No. 5,992,542 issued to Rives. The hole opener disclosed in the '542 patent includes hardfaced cutter shells that are similar to roller cones used with roller cone drill bits.

U.S. Patent Publication No. 2004/0222025, which is assigned to the assignee of the present invention, and is incorporated by reference in its entirety, discloses a hole opener wherein cutting elements may be positioned on the respective blades so as to balance a force or work distribution and provide a force or work balanced cutting structure. "Force balance" may refer to a substantial balancing of any force during drilling (lateral, axial, torsional, and/or vibrational, for example). One method of later force balancing has been described in detail in, for example, T. M. Warren et al., *Drag Bit Performance Modeling*, paper no. 15617, Society of Petroleum Engineers, Richardson, Tex., 1986. Similarly, "work balance" refers to a substantial balancing of work performed between the blades and between cutting elements on the blades.

The term "work" used in that publication is defined as follows. A cutting element on the blades during drilling operations cuts the earth formation through a combination of axial penetration and lateral scraping. The movement of the cutting element through the formation can thus be separated into a "lateral scraping" component and an "axial crushing" component. The distance that the cutting element moves laterally, that is, in the plane of the bottom of the wellbore, is called the lateral displacement. The distance that the cutting element moves in the axial direction is called the vertical displacement. The force vector acting on the cutting element can also be characterized by a lateral force component acting in the plane of the bottom of the wellbore and a vertical force component acting along the axis of the drill bit. The work done by a cutting element is defined as the product of the force required to move the cutting element and the displacement of the cutting element in the direction of the force.

Thus, the lateral work done by the cutting element is the product of the lateral force and the lateral displacement. Similarly, the vertical (axial) work done is the product of the vertical force and the vertical displacement. The total work done by each cutting element can be calculated by summing the vertical work and the lateral work. Summing the total work done by each cutting element on any one blade will provide the total work done by that blade.

Force balancing and work balancing may also refer to a substantial balancing of forces and work between corresponding cutting elements, between redundant cutting elements, etc. Balancing may also be performed over the entire hole opener (e.g., over the entire cutting structure).

What is still needed, however, are methods for coupling the behavior of drill bits, hole openers, and other tools to one another in order to optimize the drilling performance of a BHA assembly.

SUMMARY OF INVENTION

In one aspect, the invention provides a method for designing a secondary cutting structure for use in a bottom hole assembly, the method including defining initial design parameters for the secondary cutting structure and analyzing forces acting on the secondary cutting structure. Additionally, the method includes modifying at least one design element of the secondary cutting structure and simulating an effect of the modifying on both the secondary cutting structure and a primary cutting structure to determine if an improved condition is met.

In another aspect, the invention provides a method for designing a drilling tool assembly, the method including defining initial drilling tool assembly design parameters including a primary cutting structure and a secondary cutting structure, and simulating a dynamic response of the drilling tool assembly. Additionally, the method includes adjusting at least one design element of the secondary cutting structure based on the dynamic response of the drilling tool assembly, determining if the adjusted design element improved a condition of the drilling, and repeating the simulating and adjusting until the condition is optimized.

In another aspect, the invention relates to a method for improving secondary cutting structure for use in a bottom hole assembly, the method including defining initial design elements for the secondary cutting structure of the bottom hole assembly, simulating the secondary cutting structure drilling in earth formation to determine cutting action of the secondary cutting structure, and adjusting at least one design element to improve the cutting action of the secondary cutting structure.

In another aspect, the invention relates to a method for designing a secondary cutting structure for a drilling tool assembly, the method including defining a first cutting element arrangement for a first blade of a block, modifying a design element of the first cutting element arrangement to produce a second cutting element arrangement for a second blade, and disposing the first and second blades on the block, wherein the first and second cutting element arrangements are redundant.

Other aspects and advantages of the invention will be apparent from the following description and the appended claims.

DETAILED DESCRIPTION

The present invention relates to a simulation method and/or selection tool wherein the detailed interaction of the drill bit with the bottom hole surface during drilling is considered in conjunction with hole openers, or any other cutting tool used during the drilling of earth formation. Specific embodiments of the present invention relate to methods for calculating and simulating the combined axial, torsional, and/or lateral vibrations of at least one hole opener and a drill bit.

Figure 4:
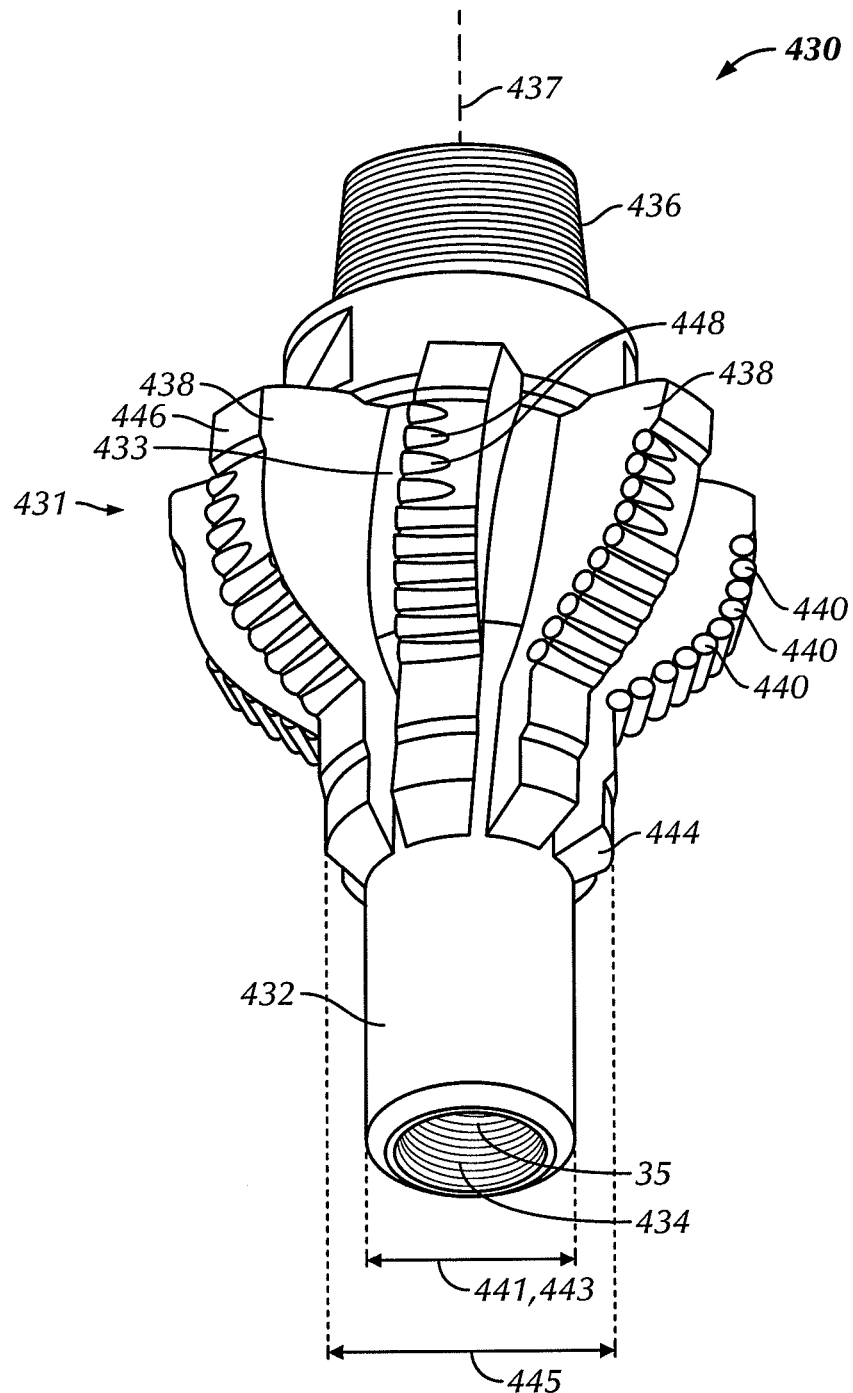
FIG. 4 shows a perspective view of an embodiment of the invention.

FIG. 4 shows a general configuration of a hole opener 430 that may be used in embodiments of the present invention. The hole opener 430 includes a tool body 432 and a plurality of blades 438 disposed at selected azimuthal locations about a circumference thereof. The hole opener 430 generally comprises connections 434, 436 (e.g., threaded connections) so that the hole opener 430 may be coupled to adjacent drilling tools that comprise, for example, a drillstring and/or bottom hole assembly (BHA) (not shown). The tool body 432 generally includes a bore 35 therethrough so that drilling fluid may flow through the hole opener 430 as it is pumped from the surface (e.g., from surface mud pumps (not shown)) to a bottom of the wellbore (not shown). The tool body 432 may be formed from steel or from other materials known in the art. For example, the tool body 432 may also be formed from a matrix material infiltrated with a binder alloy.

The blades 438 shown in FIG. 4 are spiral blades and are generally positioned asymmetrically at substantially equal angular intervals about the perimeter of the tool body 432 so that the hole opener 430 will be positioned substantially concentric with the wellbore (not shown) during drilling operations (e.g., a longitudinal axis 437 of the well opener 430 will remain substantially coaxial with a longitudinal axis of the wellbore (not shown)). Alternatively, the hole opener may be eccentric.

Other blade arrangements may be used with the invention, and the embodiment shown in FIG. 4 is not intended to limit the scope of the invention. For example, the blades 438 may be positioned symmetrically about the perimeter of the tool body 432 at substantially equal angular intervals so long as the hole opener 430 remains positioned substantially concentric with the wellbore (not shown) during drilling operations. Moreover, the blades 438 may be straight instead of spiral.

The blades 438 each typically include a plurality of cutting elements 440 disposed thereon, and the blades 438 and the cutting elements 440 generally form a cutting structure 431 of the hole opener 430. The cutting elements 440 may be, for example, polycrystalline diamond compact (PDC) inserts, tungsten carbide inserts, boron nitride inserts, and other similar inserts known in the art. The cutting elements 440 are generally arranged in a selected manner on the blades 438 so as to drill a wellbore having a larger diameter than, for example, a diameter of a wellbore (not shown) previously drilled with a drill bit. For example, FIG. 4 shows the cutting elements 440 arranged in a manner so that a diameter subtended by the cutting elements 440 gradually increases with respect to an axial position of the cutting elements 440 along the blades 438 (e.g., with respect to an axial position along the hole opener 430). Note that the subtended diameter may be selected to increase at any rate along a length of the blades 438 so as to drill a desired increased diameter wellbore (not shown).

In other embodiments, the blades 438 may be formed from a diamond impregnated material. In such embodiments, the diamond impregnated material of the blades 438 effectively forms the cutting structure 431. Moreover, such embodiments may also have gage protection elements as described below. Accordingly, embodiments comprising cutting elements are not intended to limit the scope of the invention.

The hole opener 430 also generally includes tapered surfaces 444 formed proximate a lower end of the blades 438. The tapered surfaces 444 comprise a lower diameter 443 that may be, for example, substantially equal to a diameter 441 of the tool body 432. However, in other embodiments, the lower diameter 443 may be larger than the diameter 441 of the tool body 432. The tapered surfaces 444 also comprise an upper diameter 445 that may, in some embodiments, be substantially equal to a diameter of the wellbore (not shown) drilled by a drill bit (not shown) positioned below the hole opener 430 in the drillstring (not shown). In other embodiments, the upper diameter 445 may be selected so as to be less than the diameter of the wellbore (not shown) drilled by the drill bit (not shown). Note that the tapered surfaces are not intended to be limiting.

In some embodiments, the tapered surfaces 444 may also include at least one cutting element disposed thereon. As described above, the cutting elements may comprise polycrystalline diamond compact (PDC) inserts, tungsten carbide inserts, boron nitride inserts, and other similar inserts known in the art. The cutting elements may be selectively positioned on the tapered surfaces 444 so as to drill out an existing pilot hole (not shown) if, for example, an existing pilot hole (not shown) is undersize.

The hole opener 430 also comprises gage surfaces 446 located proximate an upper end of the blades 438. The gage surfaces 446 shown in the embodiment of FIG. 4 are generally spiral gage surfaces formed on an upper portion of the spiral blades 438. However, other embodiments may comprise substantially straight gage surfaces.

In other embodiments, the cutting elements 440 may comprise different diameter cutting elements. For example, 13 mm cutting elements are commonly used with PDC drill bits. The cutting elements disposed on the blades 438 may comprise, for example, 9 mm, 11 mm, 13 mm, 16 mm, 19 mm, 22 mm, and/or 25 mm cutters, among other diameters. Further, different diameter cutting elements may be used on a single blade (e.g., the diameter of cutting elements maybe selectively varied along a length of a blade).

In another aspect of the invention, the cutting elements 440 may be positioned at selected backrake angles. A common backrake angle used in, for example, prior art PDC drill bits is approximately 20 degrees. However, the cutting elements in various embodiments according to this aspect of the invention may be positioned at backrake angles of greater than or less than 20 degrees. Moreover, the backrake angle of the cutting elements may be varied on the same blade or bit. In one embodiment, the backrake angle is variable along the length of the blade. In a particular embodiment, the backrake angle of each cutting element is related to the axial position of the particular cutting element along the length of the blade.

In some embodiments, the blades 438 and/or other portions of the cutting structure 431 may be formed from a non-magnetic material such as monel. In other embodiments, the blades 438 and/or other portions of the cutting structure 431 may be formed from materials that include a matrix infiltrated with binder materials. Examples of these infiltrated materials may be found in, for example, U.S. Pat. No. 4,630,692 issued to Ecer and U.S. Pat. No. 5,733,664 issued to Kelley et al. Such materials are advantageous because they are highly resistant to erosive and abrasive wear, yet are tough enough to withstand shock and stresses associated with harsh drilling conditions.

Figure 1:
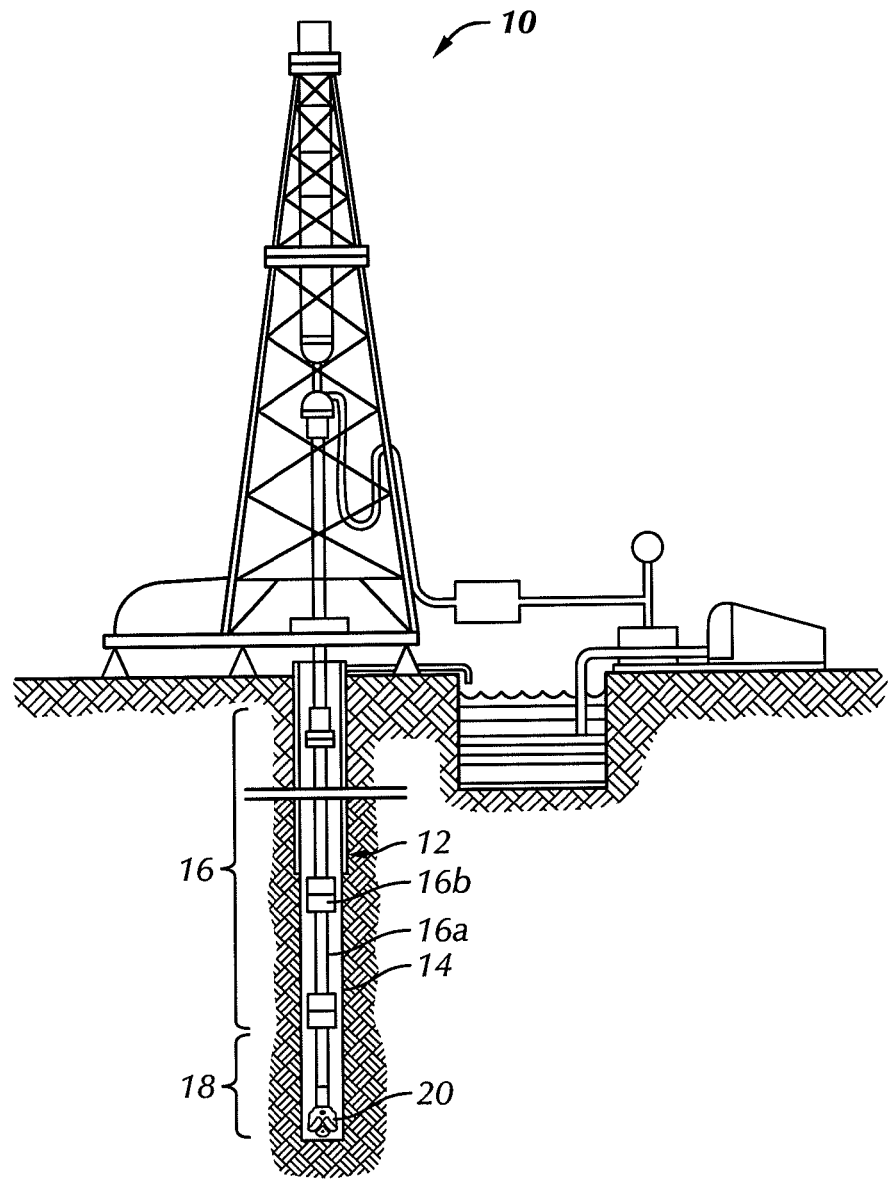
FIG. 1 shows a conventional drilling system for drilling an earth formation.
Figure 2:
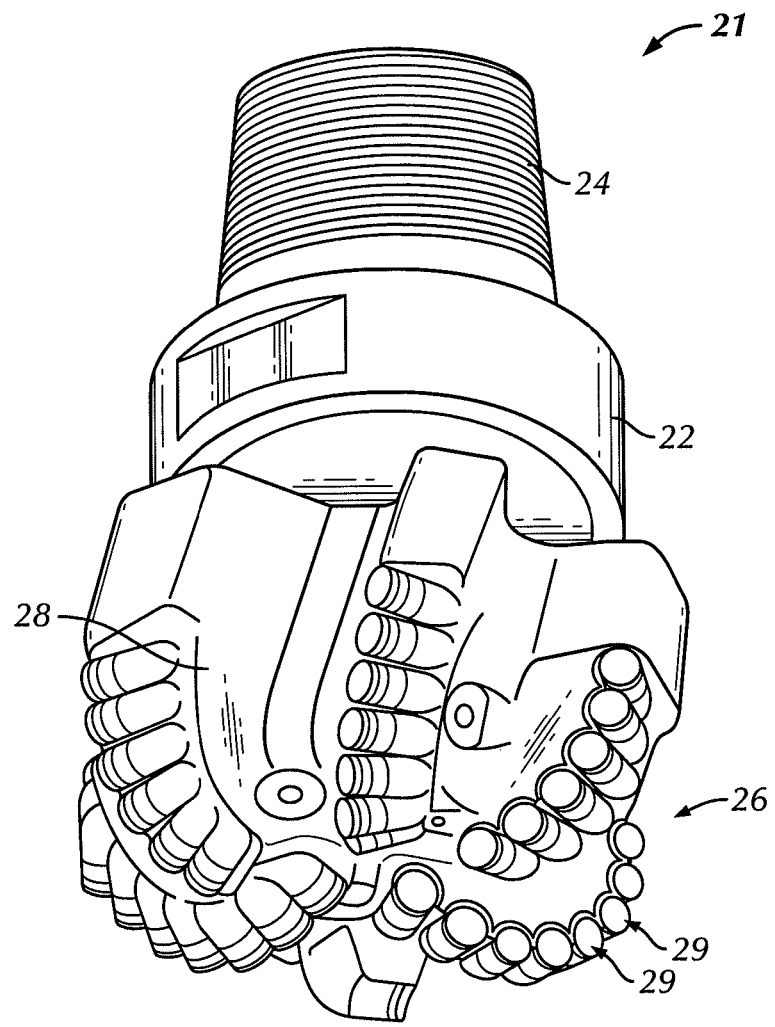
FIG. 2 shows a conventional fixed-cutter bit.
Figure 3:
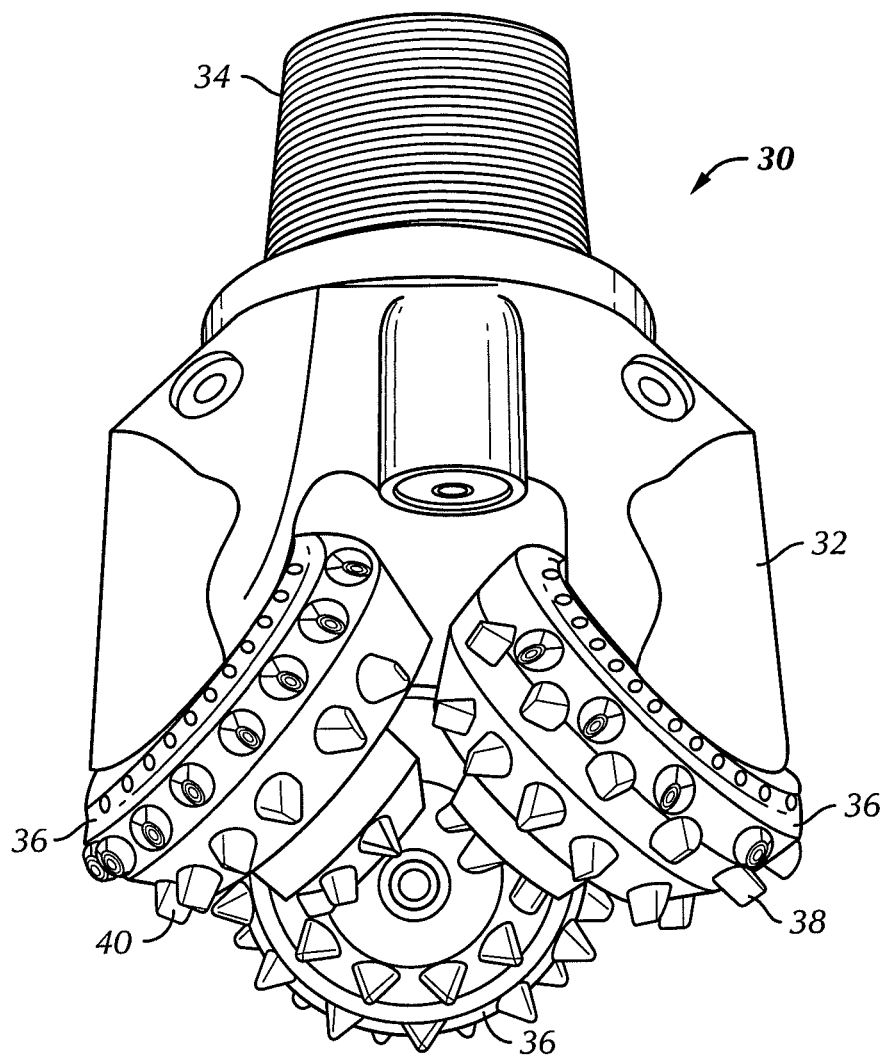
FIG. 3 shows a conventional roller cone bit.

Exemplary drill bits for use with embodiments of the present invention are shown in FIGS. 2 and 3. Examples of simulation methods for drill bits are provided in U.S. Pat. No. 6,516,293, entitled "Method for Simulating Drilling of Roller Cone Bits and its Application to Roller Cone Bit Design and Performance," and U.S. Provisional Application No. 60/485, 642, filed Jul. 9, 2003 and entitled "Methods for Modeling, Designing, and Optimizing Fixed Cutter Bits," which are both assigned to the assignee of the present invention and now incorporated herein by reference in their entirety.

As noted above, embodiments of the present invention build upon the simulation techniques disclosed in the incorporated drill bit patents and patent applications to couple the cutting action of other cutting tools in a BHA.

Method of Dynamically Simulating Bit/Cutting Tool/BHA

Figure 5:
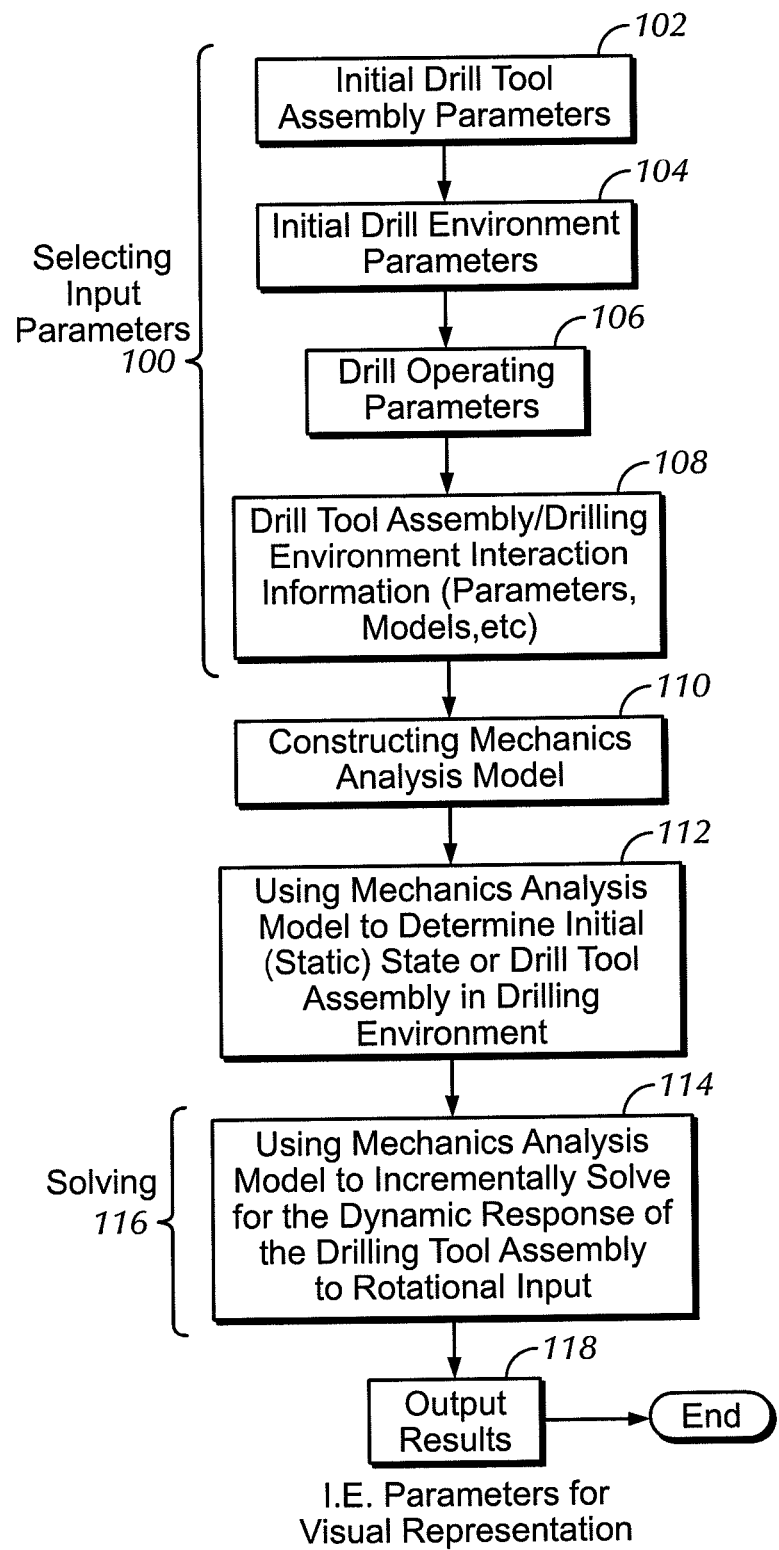
FIG. 5 shows a flow chart of one embodiment of a method for simulating the dynamic response of a drilling tool assembly.

A flow chart for one embodiment of the invention is illustrated in FIG. 5. The first step in this embodiment is selecting (defining or otherwise providing) in part parameters 100, including initial drilling tool assembly parameters 102, initial drilling environment parameters 104, drilling operating parameters 106, and drilling tool assembly/drilling environment interaction information (parameters and/or models) 108. The step involves constructing a mechanics analysis model of the drilling tool assembly 110. The mechanics analysis model can be constructed using the drilling tool assembly parameters 102 and Newton's law of motion. The next step involves determining an initial static state of the drilling tool assembly 112 in the selected drilling environment using the mechanics analysis model 110 along with drilling environment parameters 104 and drilling tool assembly/drilling environment interaction information 108.

Once the mechanics analysis model is constructed and an initial static state of the drill string is determined, the resulting static state parameters can be used with the drilling operating parameters 106 to incrementally solve for the dynamic response 114 of the drilling tool assembly to rotational input from the rotary table and the hook load provided at the hook. Once a simulated response for an increment in time (or for the total time) is obtained, results from the simulation can be provided as output 118, and used to generate a visual representation of drilling if desired.

Figure 6:
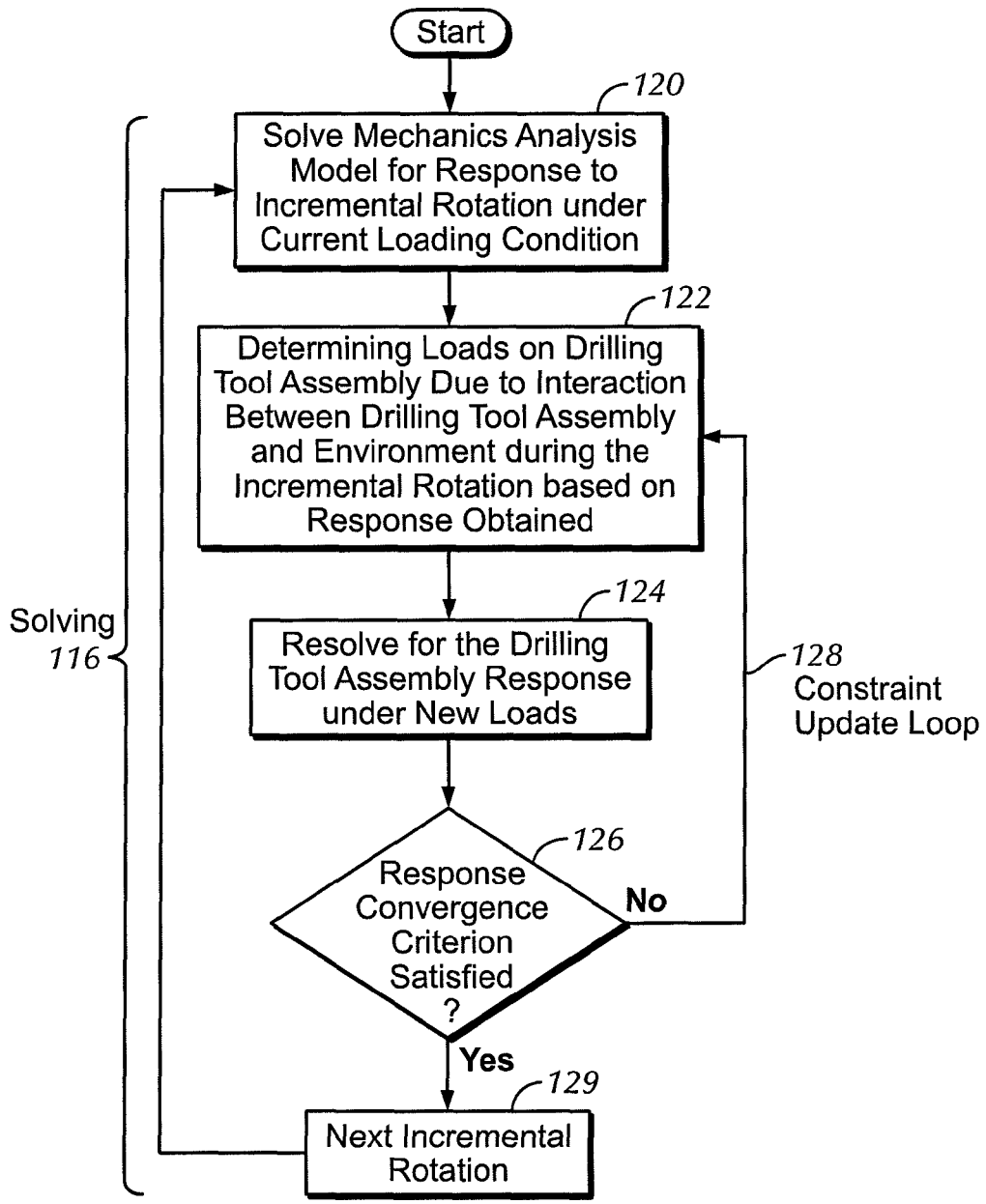
FIG. 6 shows a flow chart of one embodiment of a method of incrementally solving for the dynamic response of a drilling tool assembly.

In one example, illustrated in FIG. 6, incrementally solving for the dynamic response (indicated as 116) may not only include solving the mechanical analysis model for the dynamic response to an incremental rotation, at 120, but may also include determining, from the response obtained, loads (e.g., drilling environment interaction forces) on the drilling tool assembly due to interaction between the drilling tool assembly and the drilling environment during the incremental rotation, at 122, and resolving for the response of the drilling tool assembly to the incremental rotation, at 124, under the newly determined loads. The determining and resolving may be repeated in a constraint update loop 128 until a response convergence criterion 126 is satisfied. Once a convergence criterion is satisfied, the entire incremental solving process 116 may be repeated for successive increments until an end condition for simulation is reached.

During the simulation, the constraint forces initially used for each new incremental calculation step may be the constraint forces determined during the last incremental rotation. In the simulation, incremental rotation calculations are repeated for a select number of successive incremental rotations until an end condition for simulation is reached. A more detailed example of an embodiment of the invention is shown in FIG. 7

Figure 7:
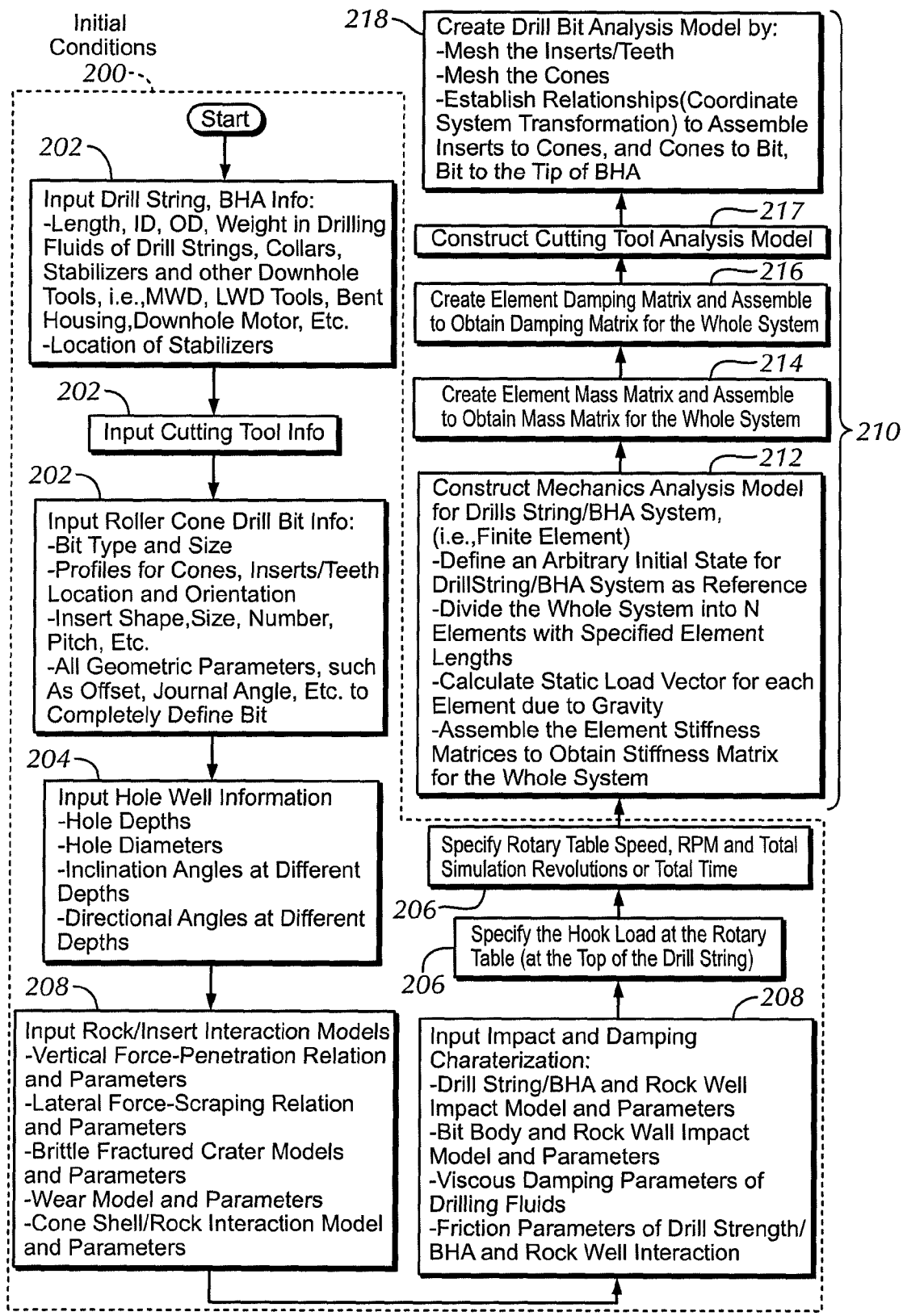
FIG. 7 shows a more detailed flow chart of one embodiment of a method for incrementally solving for the dynamic response of a drilling tool assembly.

For the example shown in FIG. 7, the parameters provided as input (initial conditions) 200 include drilling tool assembly design parameters 202, initial drilling environment parameters 204, drilling operating parameters 206, and drilling tool assembly/drilling environment interaction parameters and/or models 208.

Drilling tool assembly design parameters 202 may include drill string design parameters, BHA design parameters, cutting tool parameters, and drill bit design parameters. In the example shown, the drill string comprises a plurality of joints of drill pipe, and the BHA comprises drill collars, stabilizers, bent housings, and other downhole tools (e.g., MWD tools, LWD tools, downhole motor, etc.), and a drill bit. As noted above, while the drill bit, generally, is considered a part of the BHA, in this example the design parameters of the drill bit are shown separately to illustrate that any type of drill bit may be defined and modeled using any drill bit analysis model.

Drill string design parameters include, for example, the length, inside diameter (ID), outside diameter (OD), weight (or density), and other material properties of the drill string in the aggregate. Alternatively, drill string design parameters may include the properties of each component of the drill string and the number of components and location of each component of the drill string. For example, the length, ID, OD, weight, and material properties of one joint of drill pipe may be provided along with the number of joints of drill pipe which make up the drill string. Material properties used may include the type of material and/or the strength, elasticity, and density of the material. The weight of the drill string, or individual components of the drill string may be provided as "weight in drilling fluids" (the weight of the component when submerged in the selected drilling fluid).

BHA design parameters include, for example, the bent angle and orientation of the motor, the length, equivalent inside diameter (ID), outside diameter (OD), weight (or density), and other material properties of each of the various components of the BHA. In this example, the drill collars, stabilizers, and other downhole tools are defined by their lengths, equivalent IDs, ODs, material properties, weight in drilling fluids, and position in the drilling tool assembly.

Cutting tool design parameters include, for example, the material properties and the geometric parameters of the cutting tool. Geometric parameters of the cutting tool may include size of the tool, number of blades, location of blades, expandable nature, number of cutting elements, and the location, shape, size, and orientation of the cutting elements.

The drill bit design parameters include, for example, the bit type (roller cone, fixed-cutter, etc.) and geometric parameters of the bit. Geometric parameters of the bit may include the bit size (e.g., diameter), number of cutting elements, and the location, shape, size, and orientation of the cutting elements. In the case of a roller cone bit, drill bit design parameters may further include cone profiles, cone axis offset (offset from perpendicular with the bit axis of rotation), the number of cutting elements on each cone, the location, size, shape, orientation, etc. of each cutting element on each cone, and any other bit geometric parameters (e.g., journal angles, element spacings, etc.) to completely define the bit geometry. In general, bit, cutting element, and cone geometry may be converted to coordinates and provided as input. One preferred method for obtaining bit design parameters is the use of 3-dimensional CAD solid or surface models to facilitate geometric input. Drill bit design parameters may further include material properties, such as strength, hardness, etc. of components of the bit.

Initial drilling environment parameters 204 include, for example, wellbore parameters. Wellbore parameters may include wellbore trajectory (or geometric) parameters and wellbore formation parameters. Wellbore trajectory parameters may include an initial wellbore measured depth (or length), wellbore diameter, inclination angle, and azimuth direction of the wellbore trajectory. In the typical case of a wellbore comprising segments having different diameters or differing in direction, the wellbore trajectory information may include depths, diameters, inclination angles, and azimuth directions for each of the various segments. Wellbore trajectory information may further include an indication of the curvature of the segments (which may be used to determine the order of mathematical equations used to represent each segment). Wellbore formation parameters may include the type of formation being drilled and/or material properties of the formation such as the formation strength, hardness, plasticity, and elastic modulus.

Those skilled in the art will appreciate that any drill string design parameter may be adjusted in the model. Moreover, in selected embodiments of the model, the assembly may be considered to be segmented into a primary cutting tool, first BHA segment, secondary cutting tool, second BHA segment, etc.

Drilling operating parameters 206, in this embodiment, include the rotary table speed at which the drilling tool assembly is rotated (RPM), the downhole motor speed if a downhole motor is included, and the hook load. Drilling operating parameters 206 may further include drilling fluid parameters, such as the viscosity and density of the drilling fluid, for example. It should be understood that drilling operating parameters 206 are not limited to these variables. In other embodiments, drilling operating parameters 206 may include other variables, such as, for example, rotary torque and drilling fluid flow rate. Additionally, drilling operating parameters 206 for the purpose of simulation may further include the total number of bit revolutions to be simulated or the total drilling time desired for simulation. However, it should be understood that total revolutions and total drilling time are simply end conditions that can be provided as input to control the stopping point of simulation, and are not necessary for the calculation required for simulation. Additionally, in other embodiments, other end conditions may be provided, such as total drilling depth to be simulated, or by operator command, for example.

Drilling tool assembly/drilling environment interaction information 208 includes, for example, cutting element/earth formation interaction models (or parameters) and drilling tool assembly/formation impact, friction, and damping models and/or parameters. Cutting element/earth formation interaction models may include vertical force-penetration relations and/or parameters which characterize the relationship between the axial force of a selected cutting element on a selected formation and the corresponding penetration of the cutting element into the formation. Cutting element/earth formation interaction models may also include lateral force-scraping relations and/or parameters which characterize the relationship between the lateral force of a selected cutting element on a selected formation and the corresponding scraping of the formation by the cutting element.

Cutting element/formation interaction models may also include brittle fracture crater models and/or parameters for predicting formation craters which will likely result in brittle fracture, wear models and/or parameters for predicting cutting element wear resulting from contact with the formation, and cone shell/formation or bit body/formation interaction models and/or parameters for determining forces on the bit resulting from cone shell/formation or bit body/formation interaction. One example of methods for obtaining or determining drilling tool assembly/formation interaction models or parameters can be found in the previously noted U.S. Pat. No. 6,516,293, assigned to the assignee of the present invention and incorporated herein by reference. Other methods for modeling drill bit interaction with a formation can be found in the previously noted SPE Papers No. 29922, No. 15617, and No. 15618, and PCT International Publication Nos. WO 00/12859 and WO 00/12860.

Drilling tool assembly/formation impact, friction, and damping models and/or parameters characterize impact and friction on the drilling tool assembly due to contact with the wall of the wellbore and the viscous damping effects of the drilling fluid. These models/parameters include, for example, drill string-BHA/formation impact models and/or parameters, bit body/formation impact models and/or parameters, drill string-BHA/formation friction models and/or parameters, and drilling fluid viscous damping models and/or parameters. One skilled in the art will appreciate that impact, friction and damping models/parameters may be obtained through laboratory experimentation, in a method similar to that disclosed in the prior art for drill bits interaction models/parameters. Alternatively, these models may also be derived based on mechanical properties of the formation and the drilling tool assembly, or may be obtained from literature. Prior art methods for determining impact and friction models are shown, for example, in papers such as the one by Yu Wang and Matthew Mason, entitled "Two-Dimensional Rigid-Body Collisions with Friction", Journal of Applied Mechanics, September 1992, Vol. 59, pp. 635-642.

As shown in FIGS. 6-7, once input parameters/models 200 are selected, determined, or otherwise provided, a multi-part mechanics analysis model of the drilling tool assembly is constructed (at 210) and used to determine the initial static state (at 112 in FIG. 6) of the drilling tool assembly in the wellbore. The first part of the mechanics analysis model 212 takes into consideration the overall structure of the drilling tool assembly, with the drill bit, and any cutting tools being only generally represented.

In this embodiment, for example, a finite element method may be used wherein an arbitrary initial state (such as hanging in the vertical mode free of bending stresses) is defined for the drilling tool assembly as a reference and the drilling tool assembly is divided into N elements of specified element lengths (i.e., meshed). The static load vector for each element due to gravity is calculated.

Then element stiffness matrices are constructed based on the material properties (e.g., elasticity), element length, and cross sectional geometrical properties of drilling tool assembly components provided as input and are used to construct a stiffness matrix, at 212, for the entire drilling tool assembly (wherein the drill bit may be generally represented by a single node). Similarly, element mass matrices are constructed by determining the mass of each element (based on material properties, etc.) and are used to construct a mass matrix, at 214, for the entire drilling tool assembly.

Additionally, element damping matrices can be constructed (based on experimental data, approximation, or other method) and used to construct a damping matrix, at 216, for the entire drilling tool assembly. Methods for dividing a system into finite elements and constructing corresponding stiffness, mass, and damping matrices are known in the art and thus are not explained in detail here. Examples of such methods are shown, for example, in "Finite Elements for Analysis and Design" by J. E. Akin (Academic Press, 1994).

Furthermore, it will be noted that spaces between a secondary cutting structure (hole opener for example) and a bit may be accurately modeled.

The second part 217 of the mechanics analysis model 210 of the drilling tool assembly is a mechanics analysis model of the at least one cutting tool 217, which takes into account details of one or more cutting tools. The cutting tool mechanics analysis model 217 may be constructed by creating a mesh of the cutting elements and blades of the tool, and establishing a coordinate relationship (coordinate system transformation)

between the cutting elements and the blades, between the blades and the tip of the BHA.

The third part 218 of the mechanics analysis model 210 of the drilling tool assembly is a mechanical analysis model of the drill bit, which takes into account details of selected drill bit design. The drill bit mechanics analysis model 218 is constructed by creating a mesh of the cutting elements and cones (for a roller cone bit) of the bit, and establishing a coordinate relationship (coordinate system transformation) between the cutting elements and the cones, between the cones and the bit, and between the bit and the tip of the BHA.

Once the (three-part) mechanics analysis model for the drilling tool assembly is constructed 210 (using Newton's second law) and wellbore constraints specified, the mechanics model and constraints can be used to determine the constraint forces on the drilling tool assembly when forced to the wellbore trajectory and bottomhole from its original "stress free" state. Such a methodology is disclosed for example, in U.S. Pat. No. 6,785,641, which is incorporated by reference in its entirety.

Once a dynamic response conforming to the borehole wall constraints is determined (using the methodology disclosed in the '641 patent for example) for an incremental rotation, the constraint loads on the drilling tool assembly due to interaction with the bore hole wall and the bottomhole during the incremental rotation are determined.

As noted above, output information from a dynamic simulation of a drilling tool assembly drilling an earth formation may include, for example, the drilling tool assembly configuration (or response) obtained for each time increment, and corresponding bit forces, cone forces, cutting element forces, impact forces, friction forces, dynamic WOB, resulting bottomhole geometry, etc. This output information may be presented in the form of a visual representation (indicated at 118 in FIG. 5), such as a visual representation of the borehole being drilled through the earth formation with continuous updated bottomhole geometries and the dynamic response of the drilling tool assembly to drilling, on a computer screen. Alternatively, the visual representation may include graphs of parameters provided as input and/or calculated during the simulation, such as lateral and axial displacements of the tools/bits during simulated drilling.

For example, a time history of the dynamic WOB or the wear of cutting elements during drilling may be presented as a graphic display on a computer screen. It should be understood that the invention is not limited to any particular type of display. Further, the means used for visually displaying aspects of simulated drilling is a matter of convenience for the system designer, and is not intended to limit the invention.

The example described above represents only one embodiment of the invention. Those skilled in the art will appreciate that other embodiments can be devised which do not depart from the scope of the invention as disclosed herein. For example, an alternative method can be used to account for changes in constraint forces during incremental rotation. For example, instead of using a finite element method, a finite difference method or a weighted residual method can be used to model the drilling tool assembly. Similarly, other methods may be used to predict the forces exerted on the bit as a result of bit/cutting element interaction with the bottomhole surface. For example, in one case, a method for interpolating between calculated values of constraint forces may be used to predict the constraint forces on the drilling tool assembly. Similarly, a different method of predicting the value of the constraint forces resulting from impact or frictional contact may be used.

Further, a modified version of the method described above for predicting forces resulting from cutting element interaction with the bottomhole surface may be used. These methods can be analytical, numerical (such as finite element method), or experimental. Alternatively, methods such as disclosed in SPE Paper No. 29922 noted above or PCT Patent Application Nos. WO 00/12859 and WO 00/12860 may be used to model roller cone drill bit interaction with the bottomhole surface, or methods such as disclosed in SPE papers no. 15617 and no. 15618 noted above may be used to model fixed-cutter bit interaction with the bottomhole surface if a fixed-cutter bit is used.

Method of Dynamically Simulating Cutting Tool/Bit

Some embodiments of the invention provide methods for analyzing drill string assembly or drill bit vibrations during drilling. In one embodiment, vibrational forces acting on the bit and the cutting tool may be considered as frequency response functions (FRF), which may be derived from measurements of an applied dynamic force along with the vibratory response motion, which could be displacement, velocity, or acceleration. For example, when a vibratory force, f(t), is applied to a mass (which may be the bit or the hole opener), the induced vibration displacement, x(t) may be determined. The FRF may be derived from the solution of the differential equation of motion for a single degree of freedom (SDOF) system. This equation is obtained by setting the sum of forces acting on the mass equal to the product of mass times acceleration (Newton's second law):

$$f(t) + c\frac{dx(t)}{dt} + kx(t) = m\frac{d^2x(t)}{dt^2} \quad (1)$$

where:

f(t)=time-dependent force (lb.)

x(t)=time-dependent displacement (in.)

m=system mass k=spring stiffness (lb.-in.)

c=viscous damping (lb./in./s)

The FRF is a frequency domain function, and it is derived by first taking the Fourier transform of Equation (1). One of the benefits of transforming the time-dependent differential equation is that a fairly easy algebraic equation results, owing to the simple relationship between displacement, velocity, and acceleration in the frequency domain. These relationships lead to an equation that includes only the displacement and force as functions of frequency. Letting $F(\omega)$ represent the Fourier transform of force and $X(\omega)$ represent the transform of displacement:

$$(-\omega^2 m + ic\omega + k)x(\omega) = F(\omega) \quad (2)$$

The circular frequency, $\omega$, is used here (radians/s). The damping term is imaginary, due to the 90° phase shift of velocity with respect to displacement for sinusoidal motion. FRF may be obtained by solving for the displacement with respect to the force in the frequency domain. The FRF is usually indicated by the notation, $h(\omega)$:

$$h(\omega) = \frac{1}{-\omega^2 m + ic\omega + k} \quad (3)$$

Some key parameters in Equation 3 may be defined as follows:

$$h(\omega) = \frac{(1-\beta^2) - 2i\varsigma\beta}{-m\omega_t^2[(1-\beta^2)^2 + 4\zeta^2\beta^2]} \quad (4)$$

This form of the FRF allows one to recognize the real and imaginary parts separately. The new parameters introduced in Equation (4) are the frequency ratio, $\beta=\omega/\omega_r$, and the damping factor, $\xi$, wherein $\omega_r$ is the resonance frequency of the system. The resonance frequency depends on the system mass and stiffness:

$$\omega_t = \sqrt{\frac{k}{m}} \quad (5)$$

The above discussion pertains to single degree of freedom vibration theory. However, in the embodiments discussed herein, the cutting tools and bit act as a multiple degree of freedom system (MDOF) having many modes of vibration. The FRF for MDOF can be understood as a summation of SDOF FRFs, each having a resonance frequency, damping factor, modal mass, modal stiffness, and modal damping ratio.

A matrix of mode coefficients, $\Psi_{jr}$, represents all the mode shapes of interest of a structure. The mode coefficient index, j, locates a numbered position on the structure (a mathematical degree of freedom) and the index, r, indicates the mode shape number. Modes are numbered in accordance with increasing resonance frequencies. The vector component coordinate transformation from abstract modal coordinates, $\underline{X}$, to physical coordinates, X, is:

$$\{X\} = [\Psi]\{\underline{X}\} \quad (6)$$

Each column in the [$\Psi$] matrix is a list of the mode coefficients describing a mode shape.

Now, any system having mass, stiffness and damping distributed throughout can be represented with matrices. Using them, a set of differential equations can be written. The frequency domain form is:

$$[-\omega^2[M] + i\omega[C] + [K]]\{X\} = \{F\} \quad (7)$$

Displacements and forces at the numbered positions on a structure appear as elements in column matrices. The mass, damping, and stiffness matrix terms are usually combined into a single dynamic matrix, [D]:

$$[D]\{X\} = \{F\} \quad (8)$$

A complete matrix, [H], of FRFs would be the inverse of the dynamic matrix. Thus, we have the relationship:

$$\{X\} = [H]\{F\} \quad (9)$$

Individual elements of the [H] matrix are designated with the notation, $h_{jk}(\omega)$, where the j index refers to the row (location of response measurement) and the k index to the column (location of force). A column of the [H] matrix may be obtained experimentally by applying a single force at a numbered point, k, on the structure while measuring the response motion at all n points on the structure, j=1, 2, 3 . . . n. The [H] matrix completely describes a structure dynamically. A one-time measurement of the [H] matrix defines the structure for all time—until a defect begins to develop. Then subtle changes crop up all over the [H] matrix. From linear algebra we have the transformation from the [$\underline{H}$] matrix in modal coordinates to the physical [H] matrix.

$$[H] = [\Psi][\underline{H}][\Psi]^T \quad (10)$$

This provides an understanding of a measured FRF, $h_{jk}(\omega)$, as the superposition of modal FRFs. Equation (10) may be expanded for any element of the [H] matrix (selecting out a row and column) to obtain the result:

$$h_{jk}(\omega) = \sum_{r=1}^{N} \frac{\Psi_{jr}\Psi_{kr}}{m_t\omega_t^2}\left[\frac{(1-\beta_t^2) - 2i\zeta_t\beta_r}{(1-\beta_t^2)^2 + 4\zeta_t^2\beta_t^2}\right] \quad (11)$$

In order to fully characterize the system, the distance between the two or more components (e.g., the drilling tool (hole opener) and the drill bit) may need to be considered as well as the coupled nature of the elements. For example, the hole opener and the bit may be considered to be masses $m_1$ and $m_2$ coupled via a spring. Those having ordinary skill in the art will appreciate that a number of computational techniques may be used to determine this interaction, and that no limitation on the scope of the present invention is intended thereby.

In another embodiment of the invention, the vibrational, torsional, axial, and/or lateral forces encountered by the hole opener and/or bit may be physically measured and stored in a database. In this embodiment, with respect to the drill bit for example, as explained in U.S. Pat. No. 6,516,293, a number of inserts can be tested against various formations of interest to determine the forces acting on the inserts. These forces may then be summed to yield the forces acting on the bit.

Similarly, strain gages, vibrational gages and/or other devices may be used to determine the force encountered by the bit or drilling tool under a given set of conditions. Those of ordinary skill in the art will further appreciate that a combination of theoretical and experimental approaches may be used in order to determine the forces acting on the bit and drilling tool (or tools).

In some embodiments, the driller may require that an angle be "built" ("build angle") into the well. A build angle is the rate that the direction of the longitudinal axis of the well bore changes, which is commonly measured in degrees per 100 feet. The extent of the build angle may also be referred to as the "dogleg severity." Another important directional aspect is the "walk" rate. The walk rate refers to the change in azimuthal (compass) direction of the well bore. Control and prediction of the drilling direction is important for reaching target zones containing hydrocarbons. In addition, the drop tendency of the bit/secondary cutting structures may be modeled. In one embodiment, methods in accordance with embodiments of the present application may be used to match the drop/walk tendency of a bit with the drop/walk tendency of secondary cutting structures. Alternatively, the axial locations of the components may be adjusted to achieve a desired effect on trajectory.

For such an embodiment, a drill bit used in accordance with an embodiment of the present invention may be similar to that disclosed in U.S. Pat. No. 5,937,958, which is assigned to the assignee of the present invention, and is incorporated by reference in its entirety.

Figure 8:
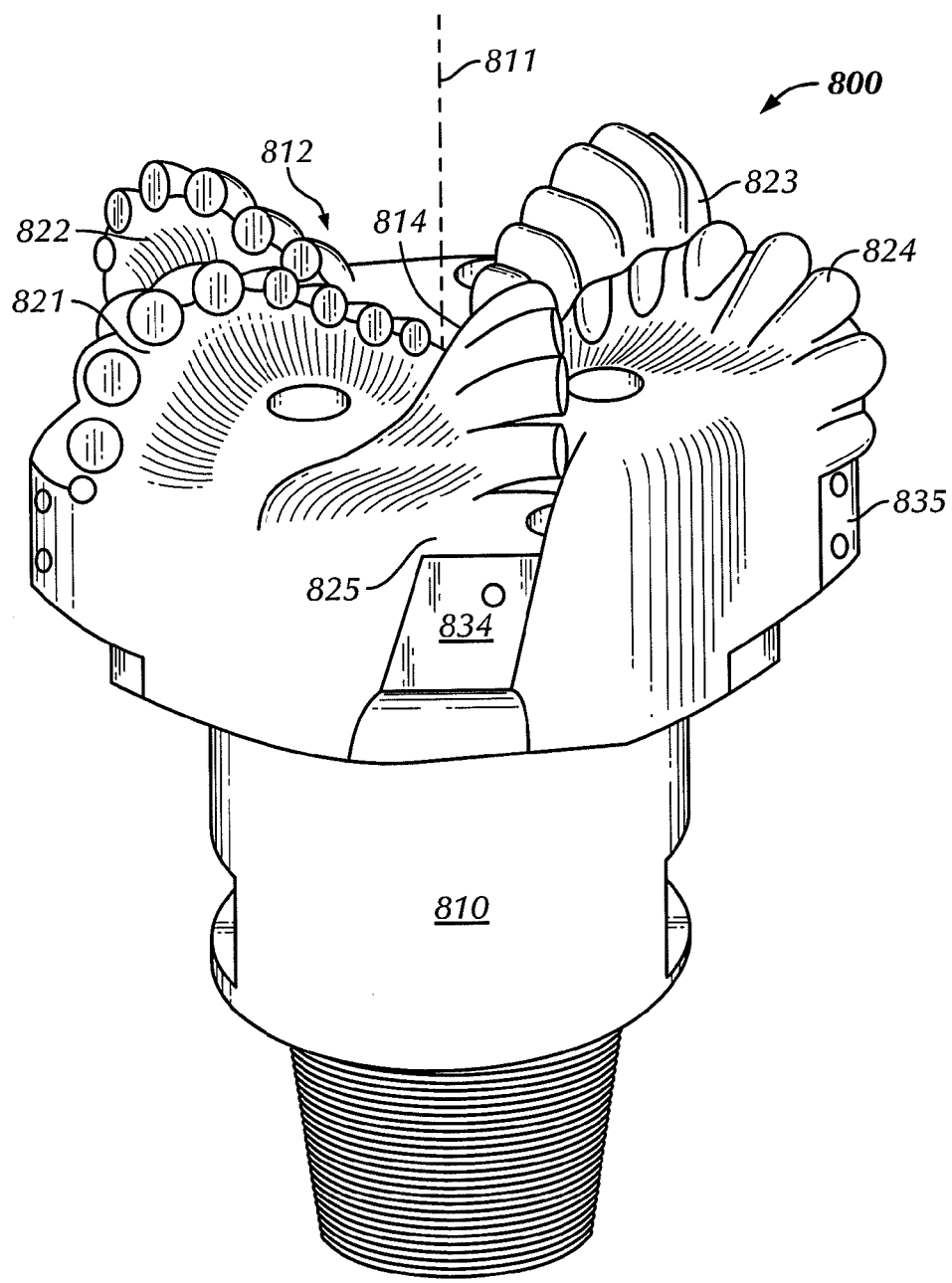
FIG. 8 shows a bit in accordance with an embodiment of the invention.
Figure 9:
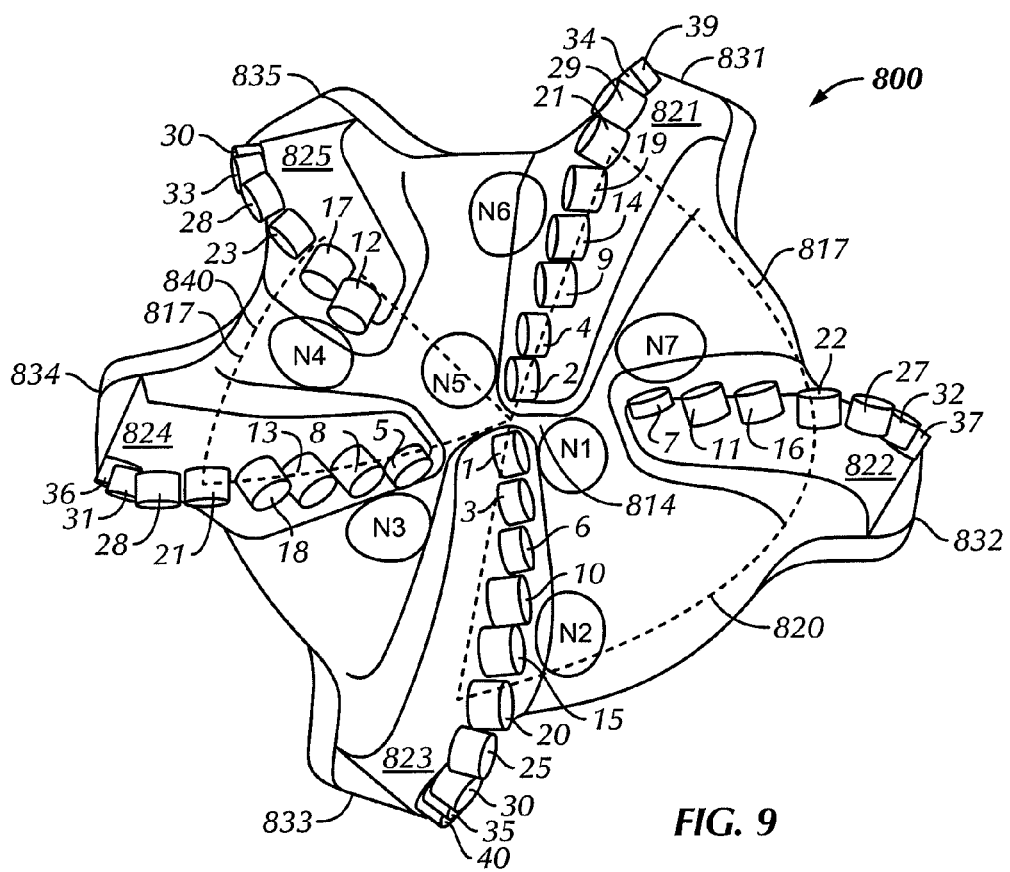
FIG. 9 shows a bit in accordance with an embodiment of the invention.

Referring initially to FIGS. 8 and 9, a PDC bit 500 typically comprises a generally cylindrical, one-piece body 810 having a longitudinal axis 811 and a conical cutting face 812 at one end. Face 812 includes a plurality of blades 821, 822, 823, 824 and 825 extending generally radially from the center of the cutting face 812. Each blade supports a plurality of PDC cutter elements as discussed in detail below. As best shown in FIG. 8, cutting face 812 has a central depression 814, a gage portion and a shoulder therebetween. The highest point (as drawn) on the cutter tip profiles defines the bit nose 817 (FIG. 9). This general configuration is well known in the art. Nevertheless, applicants have discovered that the walking tendencies of the bit can be enhanced and that a bit that walks predictably and precisely can be constructed by implementing several novel concepts. These novel concepts are set out in no particular order below and can generally be implemented independently of each other, although it is preferred that at least three be implemented simultaneously in order to achieve more satisfactory results. A preferred embodiment of the present invention entails implementation of multiple ones of the concepts described in detail below. The bit shown in FIGS. 8 and 9 is a 12¼ inch bit. It will be understood that the dimensions of various elements described below correspond to this 12¼ inch bit and that bits of other sizes can be constructed according to the same principles using components of different sizes to achieve similar results.

Active and Passive Zones

Referring again to FIGS. 8 and 9, the cutting face 812 of a bit constructed in accordance with the present invention includes an active zone 820 and a passive zone 840. Active zone 820 is a generally semi-circular zone defined herein as the portion of the bit face lying within the radius of nose 817 and extending from blade 821 to blade 823 and including the cutters of blades 821, 822 and 823. According to a preferred embodiment, active zone 820 spans approximately 120-180 degrees and preferably approximately 160 degrees. Passive zone 840 is a generally semi-circular zone defined herein as the portion of the bit face lying within the radius of nose 817 and extending from blade 824 to blade 825 and including the cutters of blades 824 and 825. According to a preferred embodiment, passive zone 840 spans approximately 50-90 degrees and preferably approximately 60 degrees.

Primary and Secondary Cutter Tip Profiles

Figure 10A:
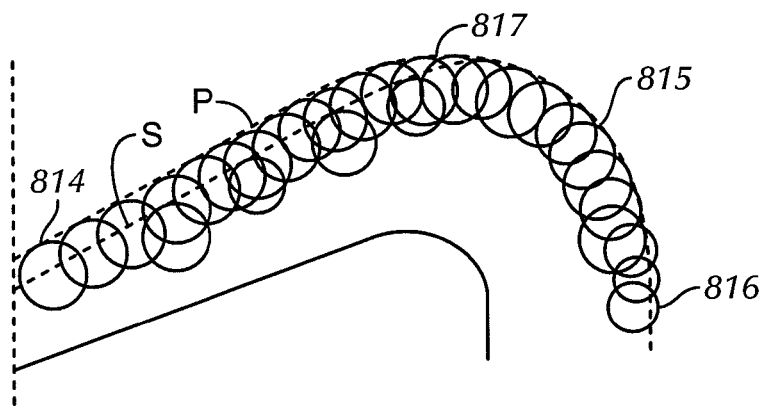
FIGS. 10A-10B show primary and secondary cutter tip profiles in accordance with an embodiment of the invention.
Figure 10B:
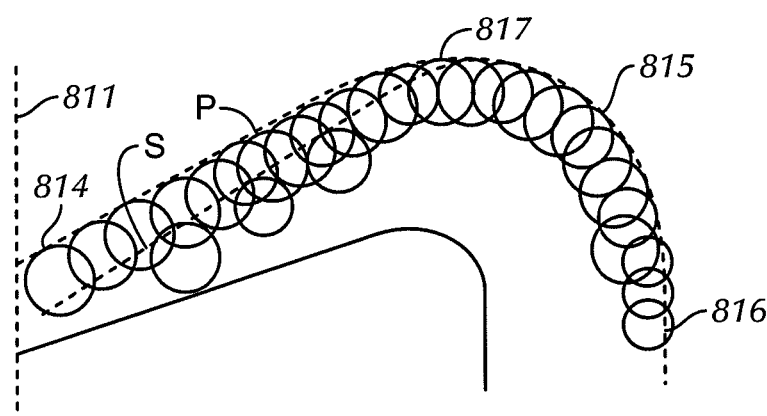

Referring now to FIG. 10, a primary cutter tip profile that is used in the active zone and a secondary cutter tip profile s that is used in the passive zone are superimposed on one another. While the gage portions 816 of the two blades have similar profiles up to the bit nose 817, the secondary profile s drops away from the bit nose 817 more steeply toward the center of face 812 than does the primary profile p. According to a preferred embodiment, the tips of the cutters on blades 824 and 825 lying between the bit's central axis 811 and its nose 817 are located on the secondary profile s while the tips of the cutters on blades 821, 822, and 823 lying between the bit's central axis 811 and its nose 817 are located on the primary profile p.

In general, this difference in profiles means that cutters toward the center of face 812 in passive zone 840 will contact the bottom of the borehole to a reduced extent and the cutting will be performed predominantly by cutters on the primary profile, on blades 821, 823. For this reason, the forces on cutters on the primary profile lying in the active zone are greater than the forces on cutters on the secondary profile lying in the passive zone. Likewise, the torque generated by the cutters on the primary profile that lie in the active zone is greater than the torque generated by the cutters on the secondary profile that lie in the passive zone. The two conditions described above, coupled with the fact that the torque on the portion of the bit face that lies within the radius of nose 817 is greater than the torque generated in the shoulder and gage portions of cutting surface 812, tend to cause the bit to walk in a desired manner. The degree to which walking occurs depends on the degree of difference between the primary and secondary profiles. As the secondary profile becomes more steep, the walk tendency increase. In many instances, it will be desirable to provide a secondary profile that is not overly steep, so as to provide a bit that walks slowly and in a controlled manner.

In an alternative embodiment shown in FIG. 10A, the secondary cutter tip profile can be parallel to but offset from the primary cutter tip profile p. The net effect on the torque distribution and resultant walking tendencies is comparable to that of the previous embodiment.

Blade Relationship

Referring again to FIG. 9, another factor that influences the bit's tendency to walk is the relationship of the blades and the manner in which they are arranged on the bit face. Specifically, the angles between adjacent pairs of blades and the angles between blades having cutters in redundant positions affects the relative aggressiveness of the active and passive zones and hence the torque distribution on the bit. To facilitate the following discussion, the blade position is used herein to mean the position of a radius drawn through the last or outermost non-gage cutter on a blade. According to the embodiment shown in the Figures, significant angles include those between blades 821 and 823 and between blades 824 and 825. These may be approximately 180 degrees and 60 degrees, respectively. According to an embodiment, the blades in the passive zone, having redundant cutters, are no more than 60 degrees apart.

Imbalance Vectors

In addition to the foregoing factors, a bit in accordance with embodiments of the present invention may have an imbalance vector that has a magnitude of approximately 10 to 25 percent of its weight on bit and more at least 15 percent of its weight on bit, depending on its size. The imbalance force vector may lie in the active zone 820 and preferably in the leading half of the active zone 820. In some embodiments, the imbalance force vector is oriented as closely as possible to the leading edge of active zone 820 (blade 821). The tendency of a bit to walk increases as the magnitude of the imbalance force vector increases. Similarly, the tendency of a bit to walk increases as the imbalance force vector approaches leading blade 821. The magnitude of the imbalance force can be increased by manipulating the geometric parameters that define the positions of the PDC cutters on the bit, such as back rake, side rake, height, angular position and profile angle. Likewise, the desired direction of the imbalance force vector can be achieved by manipulation of the same parameters.

In other embodiments, the present invention may be used to model the performance of rotary steerable systems that include both a bit and a hole opener. Vibrational analysis may be particularly important in these systems, given the demands and constraints that such systems are under.

While reference has been made to a fixed blade hole opener, those having ordinary skill in the art will recognize that expandable hole openers may also be used. Exapandable hole openers are disclosed, for example, in U.S. Pat. No. 6,732,817, which is assigned to the assignee of the present invention and is incorporated by reference. In addition, those having ordinary skill will recognize that concentric or eccentric hole openers may be used.

Figure 11:
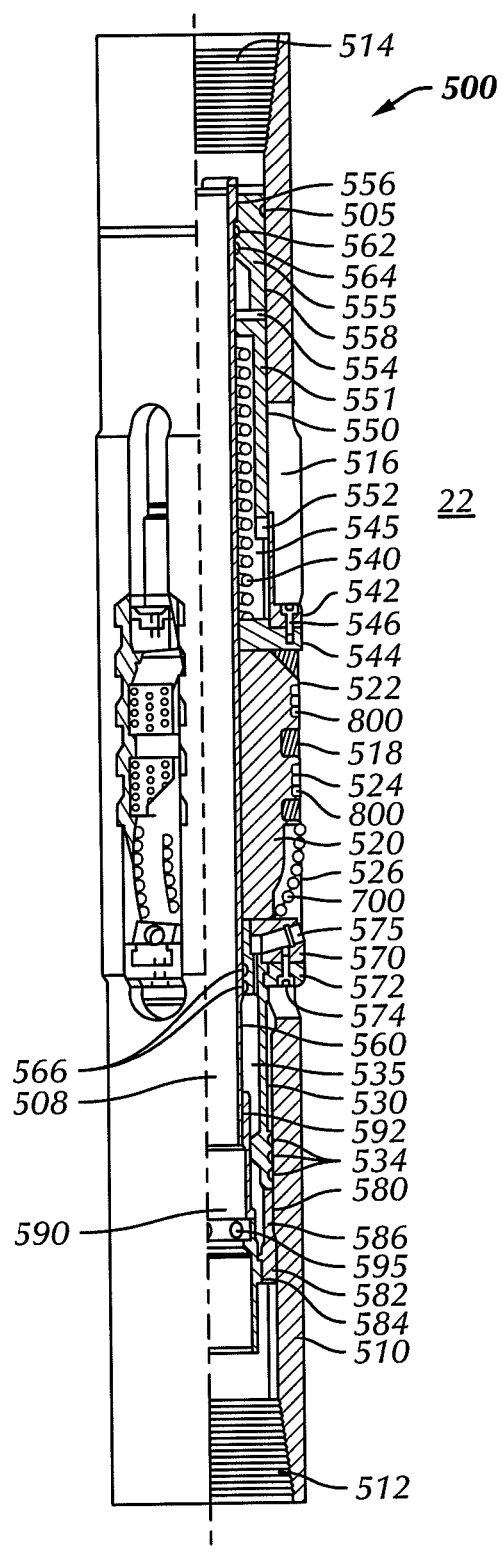
FIG. 11 is a cross sectional elevation view of one embodiment of the expandable tool of the present invention, showing the moveable arms in the collapsed position.
Figure 12:
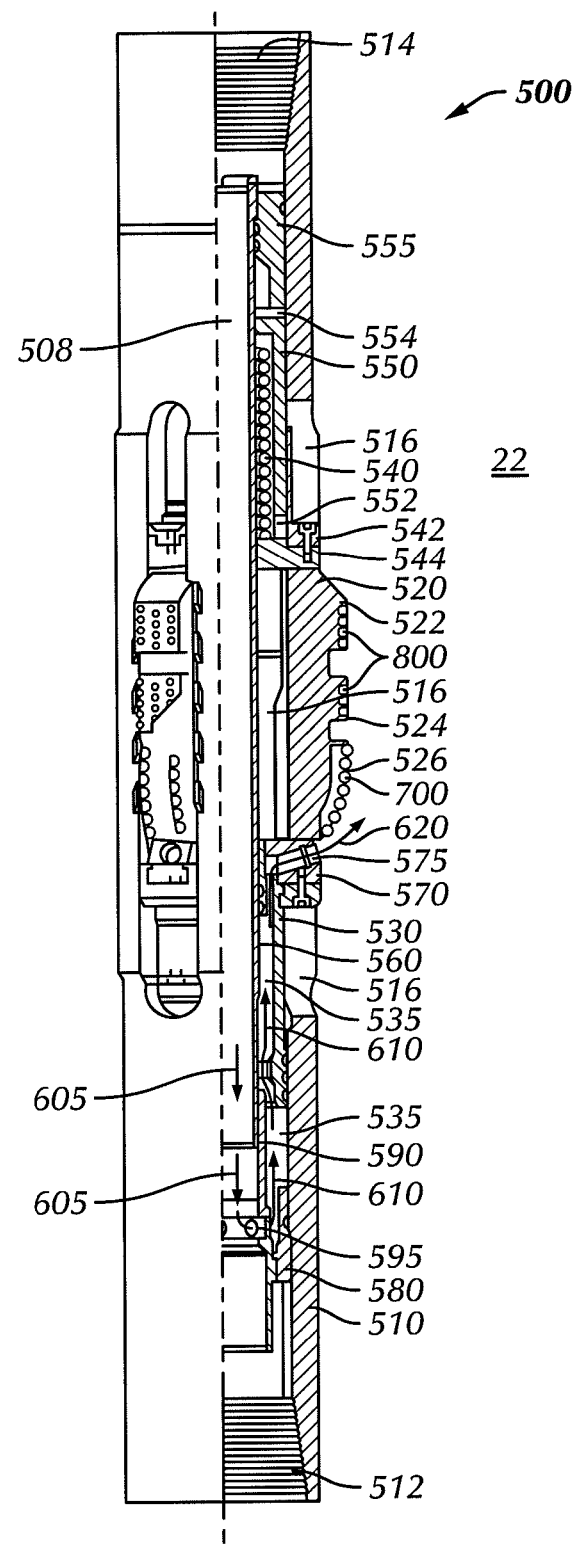
FIG. 12 is a cross-sectional elevation view of the expandable tool of FIG. 11, showing the moveable arms in the expanded position.

Referring now to FIGS. 11 and 12, an expandable tool which may be used in embodiments of the present invention, generally designated as 500, is shown in a collapsed position in FIG. 11 and in an expanded position in FIG. 12. The expandable tool 500 comprises a generally cylindrical tool body 510 with a flowbore 508 extending there through. The tool body 510 includes upper 514 and lower 512 connection portions for connecting the tool 500 into a drilling assembly. In approximately the axial center of the tool body 510, one or more pocket recesses 516 are formed in the body 510 and spaced apart azimuthally around the circumference of the body 510. The one or more recesses 516 accommodate the axial movement of several components of the tool 500 that move up or down within the pocket recesses 516, including one or more moveable, non-pivotable tool arms 520. Each recess 516 stores one moveable arm 520 in the collapsed position.

FIG. 12 depicts the tool 500 with the moveable arms 520 in the maximum expanded position, extending radially outwardly from the body 510. Once the tool 500 is in the borehole, it is only expandable to one position. Therefore, the tool 500 has two operational positions—namely a collapsed position as shown in FIG. 11 or an expanded position as shown in FIG. 12. However, the spring retainer 550, which is a threaded sleeve, can be adjusted at the surface to limit the full diameter expansion of arms 520. The spring retainer 550 compresses the biasing spring 540 when the tool 500 is collapsed, and the position of the spring retainer 550 determines the amount of expansion of the arms 520. The spring retainer 550 is adjusted by a wrench in the wrench slot 554 that rotates the spring retainer 550 axially downwardly or upwardly with respect to the body 510 at threads 551. The upper cap 555 is also a threaded component that locks the spring retainer 550 once it has been positioned. Accordingly, one advantage of the present tool is the ability to adjust at the surface the expanded diameter of the tool 500. Unlike conventional underreaming tools, this adjustment can be made without replacing any components of the tool 500.

In the expanded position shown in FIG. 12, the arms 520 will either underream the borehole or stabilize the drilling assembly, depending upon how the pads 522, 524 and 526 are configured. In the configuration of FIG. 12, cutting structures 700 on pads 526 would underream the borehole. Wear buttons 800 on pads 522 and 524 would provide gauge protection as the underreaming progresses. Hydraulic force causes the arms 520 to expand outwardly to the position shown in FIG. 12 due to the differential pressure of the drilling fluid between the flowbore 508 and the annulus 22.

The drilling fluid flows along path 605, through ports 595 in the lower retainer 590, along path 610 into the piston chamber 535. The differential pressure between the fluid in the flowbore 508 and the fluid in the borehole annulus 22 surrounding tool 500 causes the piston 530 to move axially upwardly from the position shown in FIG. 11 to the position shown in FIG. 12. A small amount of flow can move through the piston chamber 535 and through nozzles 575 to the annulus 22 as the tool 500 starts to expand. As the piston 530 moves axially upwardly in pocket recesses 516, the piston 530 engages the drive ring 570, thereby causing the drive ring 570 to move axially upwardly against the moveable arms 520. The arms 520 will move axially upwardly in pocket recesses 516 and also radially outwardly as the arms 520 travel in channels 518 disposed in the body 510. In the expanded position, the flow continues along paths 605, 610 and out into the annulus 22 through nozzles 575. Because the nozzles 575 are part of the drive ring 570, they move axially with the arms 520. Accordingly, these nozzles 575 are optimally positioned to continuously provide cleaning and cooling to the cutting structures 700 disposed on surface 526 as fluid exits to the annulus 22 along flow path 620.

The underreaming tool 500 may be designed to remain concentrically disposed within the borehole. In particular, the tool 500 of the present invention preferably includes three extendable arms 520 spaced apart circumferentially at the same axial location on the tool 510. In the preferred embodiment, the circumferential spacing would be 120 degrees apart. This three arm design provides a full gauge underreaming tool 500 that remains centralized in the borehole at all times.

In some embodiments, the simulation provides visual outputs. In one embodiment, the visual outputs may include performance parameters. Performance parameters, as used herein may include rate of penetration (ROP), forces encountered, force imbalance, degree of imbalance, maximum, minimum, and/or average forces (including but not limited to vibrational, torsional, lateral, and axial). The outputs may include tabular data of one or more performance parameters. Additionally, the outputs may be in the form of graphs of a performance parameter, possibly with respect to time. A graphical visualization of the drill bit, drill string, and/or the drilling tools (e.g., a hole opener) may also be output. The graphical visualization (e.g., 2-D, 3-D, or 4-D) may include a color scheme for the drill string and BHA to indicate performance parameters at locations along the length of the drill string and bottom hole assembly.

Visual outputs that may be used in the present invention include any output shown or described in any of U.S. patent application Ser. No. 09/524,088 (now U.S. Pat. No. 6,516, 293), Ser. No. 09/635,116 (now U.S. Pat. No. 6,873,947), Ser. No. 10/749,019, Ser. No. 09/689,299 (now U.S. Pat. No. 6,785,641), Ser. No. 10/852,574, Ser. No. 10/851,677, Ser. No. 10/888,358, Ser. No. 10/888,446, all of which are expressly incorporated by reference in their entirety.

The overall drilling performance of the drill string and bottom hole assembly may be determined by examining one or more of the available outputs. One or more of the outputs may be compared to the selected drilling performance criterion to determine suitability of a potential solution. For example, a 3-D graphical visualization of the drill string may have a color scheme indicating vibration quantified by the sudden changes in bending moments through the drilling tool assembly. Time based plots of accelerations, component forces, and displacements may also be used to study the occurrence of vibrations. Other drilling performance parameters may also be illustrated simultaneously or separately in the 3-D graphical visualization. Additionally, the 3-D graphical visualization may display the simulated drilling performed by the drilling tool assembly.

Embodiments of the present invention, therefore, provide a coupled analysis of the forces (which include, but are not limited to, torsional, vibrational, axial, and lateral) that are dynamically operating on a drill bit and at least one other drilling tool. In particular embodiments, the at least one other drilling tool may be a hole opener. By providing such an analysis one may be able to determine the forces acting on the bit and drilling tool, in order to minimize vibrations for example. In other embodiments, lateral forces may be minimized. In other embodiments, the ROP of the hole opener and the drill bit may be selected to be substantially the same. In typical prior art applications, the hole opener may have a certain rate of penetration, which may be significantly different from the expected rate of penetration of the drill bit. By using the methodology of the present invention, however, the relative rates of penetration can be predicted, and then different bits and/or hole openers may be selected in order to improve performance.

Method of Dynamically Balancing

Figure 13:
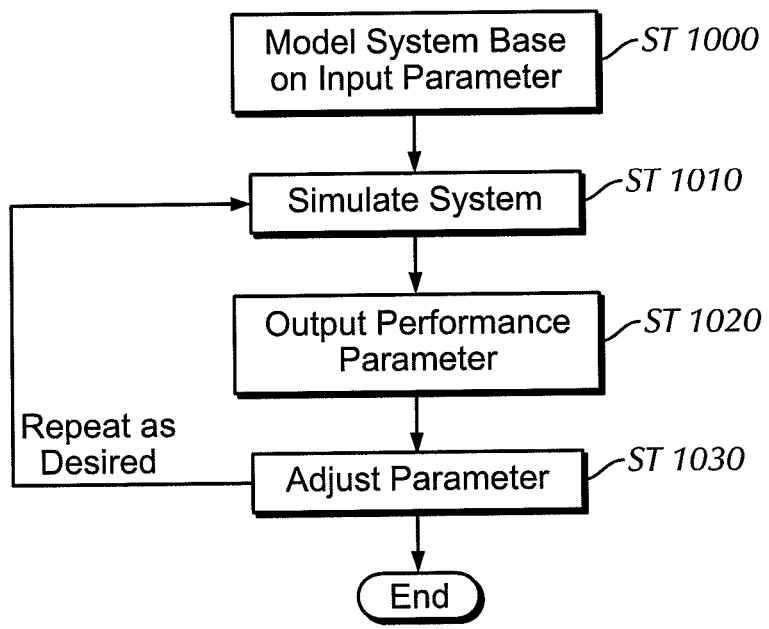
FIG. 13 shows a flow chart of one embodiment of a method of dynamically balancing a hole enlargement system.

A method of dynamically balancing a hole enlargement system (bit and hole-opener combination) is shown in FIG. 13. In ST 1000, a model for the hole enlargement system and the well bore is created using input parameters. The input parameters may include drilling tool assembly design parameters, well bore parameters, and/or drilling operating parameters. Those having ordinary skill in the art will appreciate that other parameters may be used as well.

Examples of drilling tool assembly design parameters include the type, location, and number of components included in the drilling tool assembly; the length, ID, OD, weight, and material properties of each component; the type, size, weight, configuration, and material properties of the drill bit; and the type, size, number, location, orientation, and material properties of the cutting elements on the drill bit. Material properties in designing a drilling tool assembly may include, for example, the strength, elasticity, and density of the material. It should be understood that drilling tool assembly design parameters may include any other configuration or material parameter of the drilling tool assembly without departing from the scope of the invention.

Well bore parameters typically include the geometry of a well bore and formation material properties. The trajectory of a well bore in which the drilling tool assembly is to be confined also is defined along with an initial well bore bottom surface geometry. Because the well bore trajectory may include either straight, curved, or a combination of straight and curved sections, well bore trajectories, in general, may be defined by parameters for each segment of the trajectory. For example, a well bore may be defined as comprising N segments characterized by the length, diameter, inclination angle, and azimuth direction of each segment and an indication of the order of the segments (i.e., first, second, etc.). Well bore parameters defined in this manner may then be used to mathematically produce a model of the entire well bore trajectory. Formation material properties at various depths along the well bore may also be defined and used. One of ordinary skill in the art will appreciate that well bore parameters may include additional properties, such as friction of the walls of the well bore and well bore fluid properties, without departing from the scope of the invention.

Drilling operating parameters typically include the rotary table (or top drive mechanism), speed at which the drilling tool assembly is rotated (RPM), the downhole motor speed (if a downhole motor is included) and the hook load. Furthermore, drilling operating parameters may include drilling fluid parameters, such as the viscosity and density of the drilling fluid, for example. It should be understood that drilling operating parameters are not limited to these variables. In other embodiments, drilling operating parameters may include other variables (e.g. rotary torque and drilling fluid flow rate). Additionally, for the purpose of drilling simulation, drilling operating parameters may further include the total number of drill bit revolutions to be simulated or the total drilling time desired for drilling simulation. Once the parameters of the system (i.e., drilling tool assembly under drilling conditions) are defined, they may be used with various interaction models to simulate the dynamic response of the drilling tool assembly drilling earth formation as described below.

After the hole enlargement system has been modeled, the system is simulated using the techniques described above (ST 1010). The simulation may be run, for example, for a selected number of drill bit rotations, depth drilled, duration of time, or any other suitable criteria. After completion of the simulation, performance parameter(s) are output (ST 1020).

Examples of performance parameters include rate of penetration (ROP), rotary torque required to turn the drilling tool assembly, rotary speed at which the drilling tool assembly is turned, drilling tool assembly lateral, axial, or torsional vibrations induced during drilling, weight on bit (WOB), forces acting on components of the drilling tool assembly, and forces acting on the drill bit and components of the drill bit (e.g., on blades, cones, and/or cutting elements). Drilling performance parameters may also include the inclination angle and azimuth direction of the borehole being drilled. One skilled in the art will appreciate that other drilling performance parameters exist and may be considered without departing from the scope of the invention.

After the performance parameter has been output, a designer may adjust an input parameter (ST 1030). For example, the axial location of the hole opener, the number of blades and/or cutting elements modified, the type of bit, and the type of hole opener may be changed. Those having ordinary skill in the art will appreciate that one or more of the input parameters described above may be altered in conjunction as well. After at least one parameter has been adjusted, the simulation may be repeated, and the effect on performance parameter(s) reviewed.

This process may be repeated until the system is dynamically "balanced." As used herein, the term "balanced" does not necessarily require that forces acting on the various components be equal, but rather that the overall behavior of the system is in a state, referred to as a "balanced condition," that is acceptable to a designer. For example a designer may seek to reduce the overall vibration and/or lateral movement occurring in the system.

Similarly, in another embodiment of the present invention, methods in accordance with the present invention are used to dynamically balance a drill string or BHA including multiple formation engaging or cutting tools (e.g., bit and hole-opener or reamer, etc.). The individual cutting tools may be modeled using any techniques described above, and the models may be then coupled together using mathematical techniques (e.g., finite element analysis, finite boundary analysis, vibrational analysis, etc) to form a drill string model for simulation, analysis and design. Alternatively, parameters for models of individual cutting tools may be separately defined and coupled together to form a system model using similar mathematical techniques.

In other embodiments, the performance may be modeled to determine desirable (i.e., good performing) combinations of bits and other drilling tools. In other embodiments, the location of the at least one other drilling tool may be changed in order to determine the effect. In particular, in certain embodiments, a hole opener may be moved up and down the drill string to determine a suitable location, by monitoring the effect on vibrations.

Furthermore, while embodiments of the present invention have specifically referenced certain cutting tools, it should be recognized that the invention more generally applies to the concept of coupling vibrational analysis of two or more cutting tools. In certain embodiments, the second cutting tool may not be used to enlarge the borehole, but may simply be maintaining borehole diameter.

In other embodiments of the invention, methods in accordance with the above disclosure may be used to model and or graphically display various aspects of the drill string, such as dynamic response, and drilling performance. In particular, in one embodiment, the time dependent change in hole size (i.e., hole size vs. time effect) may be modeled and/or graphically displayed. For example, in one embodiment, the hole size in a selected interval may increase due to hole slough off or swelling effects. This aspect may be modeled based on MWD or LWD data taken from similar formations that have been drilled in the past.

Using mathematical techniques, the wellbore may be meshed to determine the interaction between cutters and the wellbore. During selected iterations, the wellbore may be updated and forces on the tool determined during the iterations. In that fashion, a "real-time" simulation, updating both the forces acting on the cutters and its effects on the wellbore, may be displayed to a designer.

Furthermore, as explained above, the drill string may include a first cutting structure axially displaced from a second cutting structure. It is expressly within the scope of the present invention that other components may be present in between (or above or below) one or both of the first and second cutting structures. These other components (which may include, for example, a motor or other rotary driving tool) may be taken into account (or may be ignored). In the event that one or more of these other components is accounted for, the stiffness and mass of the other components may be considered in determining the dynamic response of the drill string. In the case where the other components may include a motor, for example, the torque or speed produced by the component may be taken into account.

Alternatively, in selected embodiments, a simplified model may be used wherein the drill string is modeled as a spring having a mass, stiffness, and damping characteristics.

Information produced during simulations in accordance with embodiments of the present invention may be used to assist a designer in a number of ways. For example, information produced may assist a designer in designing a drill string (i.e., modifying at least one design parameter such as axial locations of the cutting tools, cutter placements on cutting tool, blade geometry, etc.). For a given cutting tool, information generated may be used to assist in optimizing a second cutting tool. For example, for a selected reamer, the information generated may be used to optimize (improve) bit performance (i.e., reduce vibration, torque balance, force balance, etc.).

Alternatively, for a selected bit, the information generated may be used to optimize (improve) reamer performance (i.e., reduce vibration, torque balance, force balance, etc.). In other embodiments, the information may be used to balance the depth of cut of the cutting tools, and/or it may be used to match the rate of penetration between cutting tools, and/or to balance weight on bit between cutting tools. Those having ordinary skill in the art will appreciate that the information generated may be used to do one or more of the above items simultaneously, or may be used to adjust other performance related parameters as well.

In other embodiments, the information may be used to adjust the relative location of cutting tools in order to reduce vibration (and/or force imbalance, and/or torque imbalance, for example). As one example, in directional drilling, to reduce vibrations caused by a hole opener, the blade geometry of the hole opener may be adjusted to provide more continuous contact between blades and the formation as blades turn from bottom side of hole (full contact) to the top side of the hole (often no contact because tool is pulled toward bottom side of hole). In yet other embodiments, the information produced may be used to determine improved drilling parameters (modifying at least one drilling parameter). In one example the overall vibration of the system may be reduced by changing the rotation speed.

Method of Dynamic Vibrational Control

Figure 14:
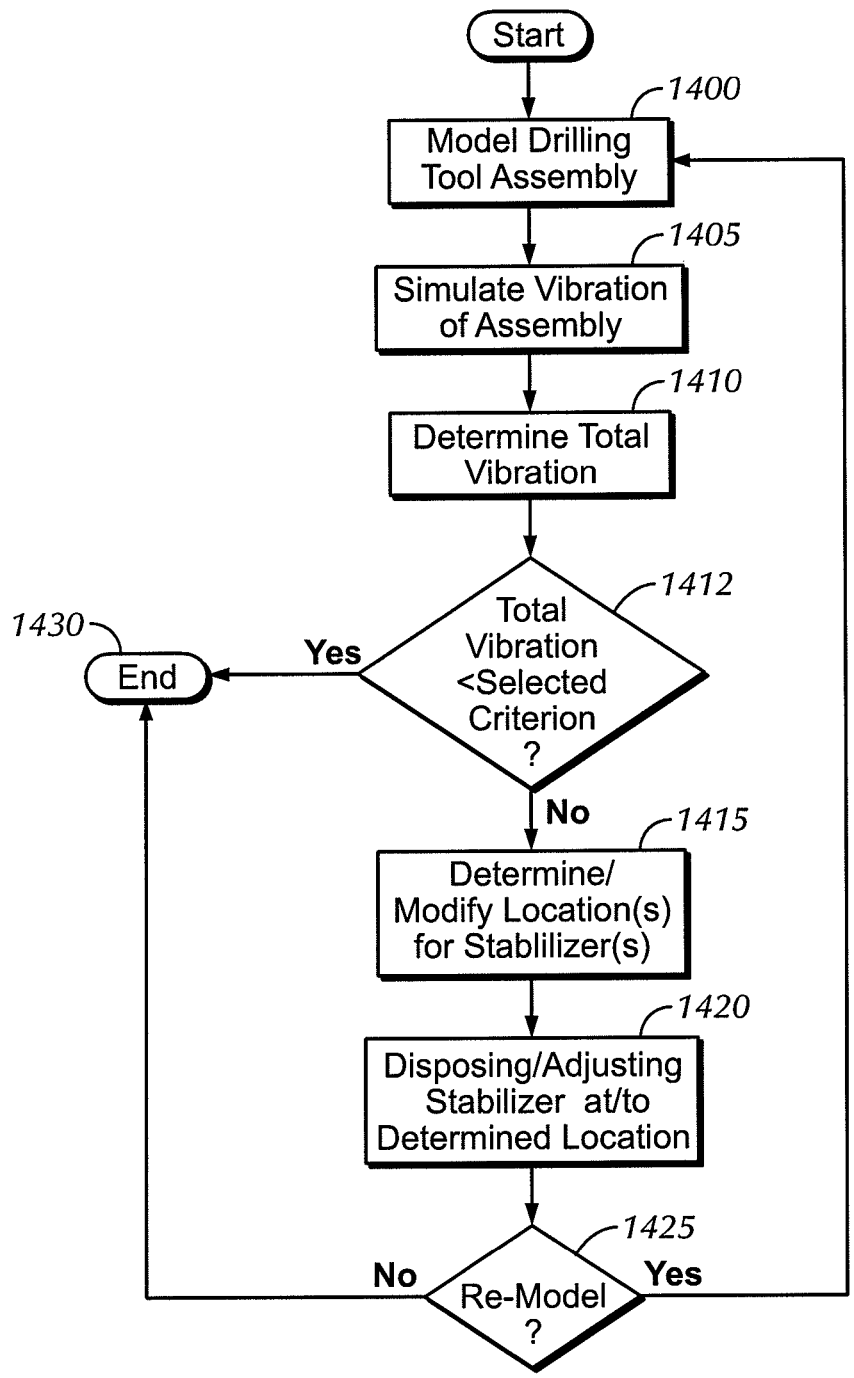
FIG. 14 shows a flow chart of one embodiment of a method of dynamic vibrational control of a drilling tool assembly.

A method of dynamically reducing vibration of a drilling tool assembly is shown in FIG. 14. At 1400, a model of a drill string coupled with a BHA may be created using input parameters. The input parameters may include drilling tool assembly design parameters, wellbore parameters, and/or drilling operating parameters. Those having ordinary skill in the art will appreciate that other parameters may be used as well. The BHA includes at least a drill bit. Typical BHA's may also include additional components attached between the drill string and the drill bit. Examples of additional BHA components include drill collars, stabilizers, measurement-while-drilling (MWD) tools, logging-while-drilling (LWD) tools, subs, hole enlargement devices (e.g., hole openers and reamers), jars, accelerators, thrusters, downhole motors, and rotary steerable systems.

After the drilling tool assembly has been modeled, the assembly may be simulated (1405) using the techniques described above. The simulation may be run, for example, for a selected number of drill bit rotations, depth drilled, duration of time, or any other suitable criteria. In some embodiments, the simulation provides visual outputs. In one embodiment, the visual outputs may include performance parameters. Performance parameters, as used herein may include rate of penetration (ROP), forces encountered, force imbalance, degree of imbalance, maximum, minimum, and/or average forces (including but not limited to vibrational, torsional, lateral, and axial). The outputs may include tabular data of one or more performance parameters. Additionally, the outputs may be in the form of graphs of a performance parameter, possibly with respect to time. A graphical visualization of the drill bit, drill string, and/or the drilling tools (e.g., a hole opener) may also be output. The graphical visualization (e.g., 2-D, 3-D, or 4-D) may include a color scheme for the drill string and BHA to indicate performance parameters at locations along the length of the drill string and bottom hole assembly.

After completion of the simulation, an initial total vibration may be determined 1410 for the drilling tool assembly from the outputs of the simulation. The initial total vibration may include the total vibration of a segment of drill string, the total vibration of the drill bit and drill string, the total vibration of the BHA, including a hole opener, and the drill string, or any combination thereof. The initial total vibration may be determined using the techniques described above. For example, the initial tool vibration may be determined using a FRF, physical measurements of the vibrations that may be stored in a database, or vibrational gages. The total vibration determined from the simulation 1405 may be compared to a selected vibration criterion 1412 to determine suitability of a potential solution. For example, a 3-D graphical visualization of the drill string may have a color scheme indicating vibration quantified by the sudden changes in bending moments through the drilling tool assembly. Time based plots of accelerations, component forces, and displacements may also be used to study the occurrence of vibrations. Other drilling performance parameters may also be illustrated simultaneously or separately in the 3-D graphical visualization. Additionally, the 3-D graphical visualization may display the simulated drilling performed by the drilling tool assembly. Those of ordinary skill in the art will further appreciate that a combination of theoretical and experimental approaches may be used in order to determine the vibrations of the drilling tool assembly. If the total vibration of the system is greater than a selected vibration criterion, set by, for example, the designer, then at least one vibrational control device may be assembled to the drilling tool assembly to dampen the vibrations.

If the initial total vibration of the drilling tool assembly is determined to be greater than a selected vibration criterion, then at least one location for placement of a vibrational control device may be determined 1415 to reduce the vibration of the drilling tool assembly. In one embodiment, the location for a vibrational control device may be determined by a designer. For example, the axial location of the vibrational control device may be selected by the designer so that it substantially coincides with a location on the drilling tool assembly with a smallest (or largest) force (vibrational, torsional, axial, and/or lateral forces) acting on the drilling tool assembly. In this embodiment, the designer may select a location on the drilling tool assembly that substantially coincides with the largest vibrational force acting on the assembly as determined from the simulation 1405. In another embodiment, the designer may determine multiple locations for placement of vibrational control devices to reduce the vibration of the drilling tool assembly. Multiple locations along the drill string may be selected to limit the lateral movement of the drilling tool assembly at antinodes due to vibration. As used herein, antinode refers to a region of maximum amplitude situated between adjacent nodes (a region relatively free of vibration or having about zero amplitude) in the vibrating drilling tool assembly. Once locations for vibrational control devices have been determined, at least one vibrational control device may be disposed 1420 on or assembled to the drilling tool assembly to reduce the dynamic vibrations.

Optionally, the designer may choose to re-model 1425 the drilling tool assembly with the at least one added vibrational control device added to the assembly. The re-modeled drilling tool assembly with the at least one vibrational control device may then be simulated 1405 as described above. If the total vibration of the drilling tool assembly with the at least one added vibrational control device is greater than the selected vibration criterion, the at least one vibrational control device and/or the location of the at least one vibrational control device may be modified in accordance with the outputs from the simulation 1405 of the re-modeled drilling tool assembly. For example, the location of the at least one vibrational control device may be modified to move the vibrational control device axially along the length of the drilling tool assembly, the design of the vibrational control device may be modified (examples described in greater detail below), and/or additional vibrational control devices and locations for each additional vibrational control device may be determined. The modeling, simulating, determining total vibration, and determining/modifying locations of vibrational control devices may be repeated for successive increments until an end condition for vibrational control. An end condition 1430 for vibrational control may be reached when the total vibration of the drilling tool assembly is less than the selected vibration criterion. Alternatively, the designer may determine a location for the vibrational control device and dispose at least one vibrational control device at the determined location on the drilling tool assembly and choose not to re-model the drilling tool assembly.

Vibrational Control Devices

In accordance with embodiments of the invention, the at least one vibrational control device may be chosen from a variety of vibrational control device designs. The designer may choose the design of the at least one vibrational control device in accordance with input parameters of the model 1400 and the outputs of the simulations 1405 (FIG. 14). In one embodiment, the vibrations control device may be a tubular piece comprised of a pre-selected material and having pre-selected dimensions. In one embodiment, the vibrational control device may be a type of drill collar (discussed in greater detail below). As used herein, a drill collar refers to a thick-walled tubular piece with a passage axially disposed through the center of the tubular piece that allows drilling fluids to be pumped therethrough. In one embodiment, the tubular pieces or drill collars may comprise carbon steel, nonmagnetic nickel-copper alloy, or other nonmagnetic alloys known in the art. The at least one vibrational control device may be rigidly fixed between segments of drill string or rigidly assembled to the BHA. Alternatively, the at least one vibrational control device may be disposed between segments of drill string and comprise axially and/or radially moveable components.

In one embodiment, the at least one vibrational control device may be a tubular piece disposed at the determined location along a drilling tool assembly. In this embodiment, the tubular piece may be selected based on Young's modulus of the tubular piece. Young's modulus, also known as the modulus of elasticity, is a measure of stiffness of a material and may be defined as shown in Equation 1:

$$E = \frac{\text{stress}}{\text{strain}} = \frac{F/A}{x/L} = \frac{FL}{Ax} \quad (1)$$

wherein E is Young's modulus in pascals, F is force, measured in Newtons, A is the cross sectional area through which the force is applied, measured in meters squared ($m^2$), x is the extension, measured in meters (m), and l is the natural length, measured in m. In one embodiment, a designer may determine a Young's modulus value of a tubular piece based on the predicted vibrations from the simulation (e.g., 1405 of FIG. 14) to reduce the vibrations of the drilling tool assembly. In this embodiment, the designer may select the dimensions and material of the tubular piece to obtain the determined Young's modulus of the tubular piece. For example, if the outputs of the simulation 1405 (FIG. 14) indicate large vibrations at a given location along the drill tool assembly, the designer may select a material that has a greater Young's modulus value, that is, a stiffer material, for a tubular piece to be disposed at the location of large vibrations. One of ordinary skill in the art will appreciate that any material known in the art for tubular pieces may be used, for example, steel, nickel, copper, iron, and other alloys. Alternatively, the designer may select a more elastic material, or one with a lower Young's modulus value, in view of the outputs of the simulation 1405. In another embodiment, the designer may select or vary the dimensions of the tubular piece, including length, outside diameter, inside diameter, wall thickness, etc., to obtain the determined Young's modulus value needed to reduce vibrations of the drilling tool assembly.

Figure 15:
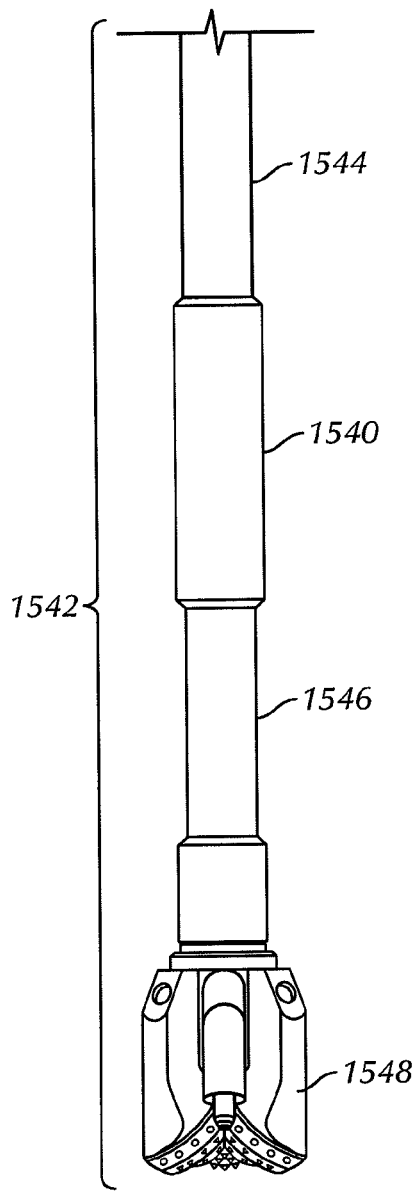
FIG. 15 shows a drilling tool assembly in accordance with an embodiment of the invention.

In one embodiment, the at least one vibrational control device may be a drill collar 1540, as shown in FIG. 15, disposed at the determined location along a drilling tool assembly 1542. In this embodiment, drill collar 1540 may be connected between segments of drill string 1544, 1546 at a location that substantially coincides with antinodes or large amplitudes of vibration. In this embodiment, drill collar 1540 is a fixed drill collar, that is, a drill collar without moving components and rigidly fixed to the drill string. The lower segment of drill string 1546 may be connected to a drill bit 1548 or a BHA, including a drill bit and at least one other drilling tool (not shown). The added weight-on-bit and increased inertia of the drilling tool assembly, as a result of the increase in mass and cross-sectional area due to the drill collar, may dampen, or reduce, the vibrations of the drilling tool assembly 1542.

Figure 16:
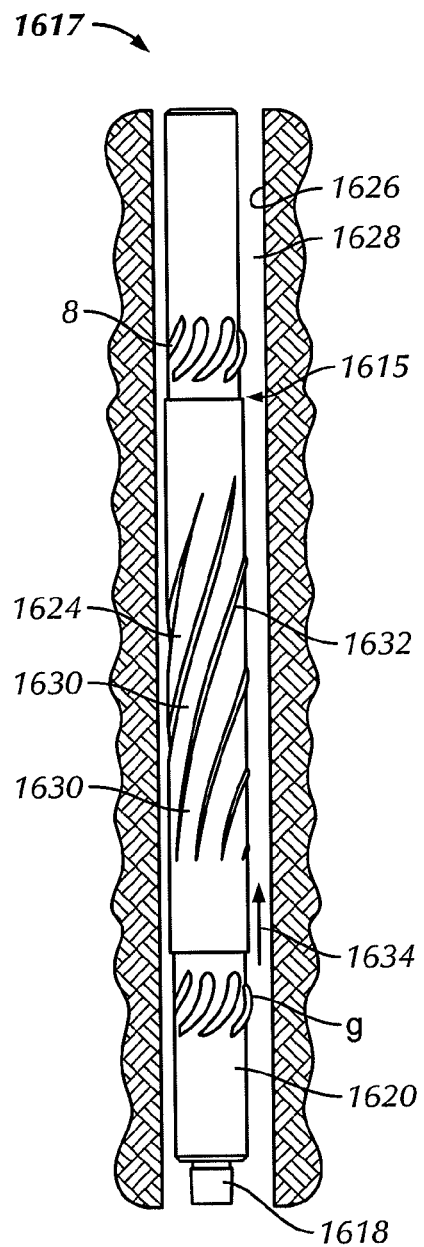
FIG. 16 shows a stabilizer in accordance with an embodiment of the invention.

FIG. 16 shows an alternative vibrational control device in accordance with an embodiment of the invention. In this embodiment, the vibrational control device is a stabilizer 1615. As used herein, a 'stabilizer' refers to a tubular piece with a passage axially disposed through the center of the tubular piece that allows drilling fluids to be pumped therethrough and wherein a least an portion of the outer surface of the stabilizer contacts the wall of a wellbore to dampen the vibration of the drilling tool assembly. In this embodiment, stabilizer 1615 may be connected between segments of drilling string, for example by threaded connections 1617, 1618, at a location determined by the designer. Stabilizer 1615 comprises a central body 1620 on which a tubular element 1624 is mounted. A passageway is axially disposed through the center of the stabilizer 1615 to allow flow of drilling fluid from the surface to the drill bit or BHA (not shown). Tubular element 1624 acts as an external contact casing of stabilizer 1615 and may contact a wall 1626 of a wellbore 1628, thereby reducing vibration of the drilling tool assembly. In this embodiment, tubular element 1624 may be mounted on the stabilizer 1615 so as to slide in an axial direction along the central body 1620. In one embodiment, tubular element 1624 may rotate about the central body 1620. In yet another embodiment, tubular element 1624 may move axially and rotationally about the central body 1620. Accordingly, stabilizer 1615 may be referred to herein as a "floating stabilizer." Central body 1620 may further comprise at least one axial stop (not shown) disposed on an outer circumference of central body 1620 to limit axial movement of tubular element 1624. Central body 1620 may further comprise at least one rotational stop (not shown) disposed on the outer circumference of central body 1620 to limit rotational movement of the tubular element 1624. The distance between opposing axial stops and/or rotational stops may be selected so as to allow or minimize the axial and/or rotational movement of tubular element 1624 so as to reduce the vibration of the drilling tool assembly.

Tubular element 1624 of floating stabilizer 1615 may comprise blades 1630 and interblade spaces 1632. In this embodiment, drilling fluids may circulate in the vertical direction down through the drill string and floating stabilizer 1615 to a drilling tool (not shown) disposed at a lower end of the drill string. The drilling fluid may then flow up an annulus (indicated at 1634) formed between the drilling tool assembly, including stabilizer 1615, and wall 1626 of wellbore 1628. The circulation of the drilling fluid in contact with the external surface of tubular element 1624, namely flowing between blades 1630 in interblade spaces 1632, may create a liquid bearing around stabilizer 1615. The drilling fluid flowing between blades 1630 of stabilizer 1615 may move tubular element 1624 axially or rotationally about central body 1620 of stabilizer 1615. An example of a floating stabilizer that may be used in accordance with embodiments of the invention is disclosed in U.S. Pat. No. 6,935,442, issued to Boulet, et al, hereby incorporated by reference in its entirety.

Figure 17:
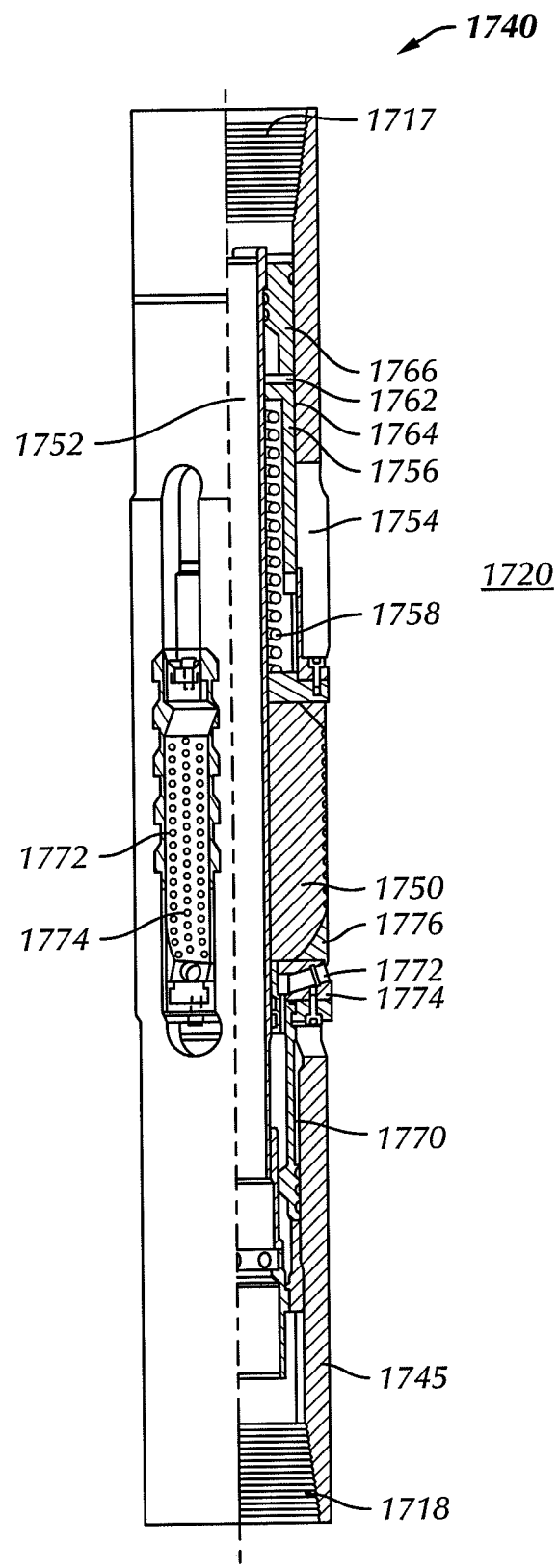
FIG. 17 shows a cross sectional elevation view of one embodiment of a stabilizer in accordance with an embodiment of the invention, showing the stabilizer arms in a collapsed position.
Figure 18:
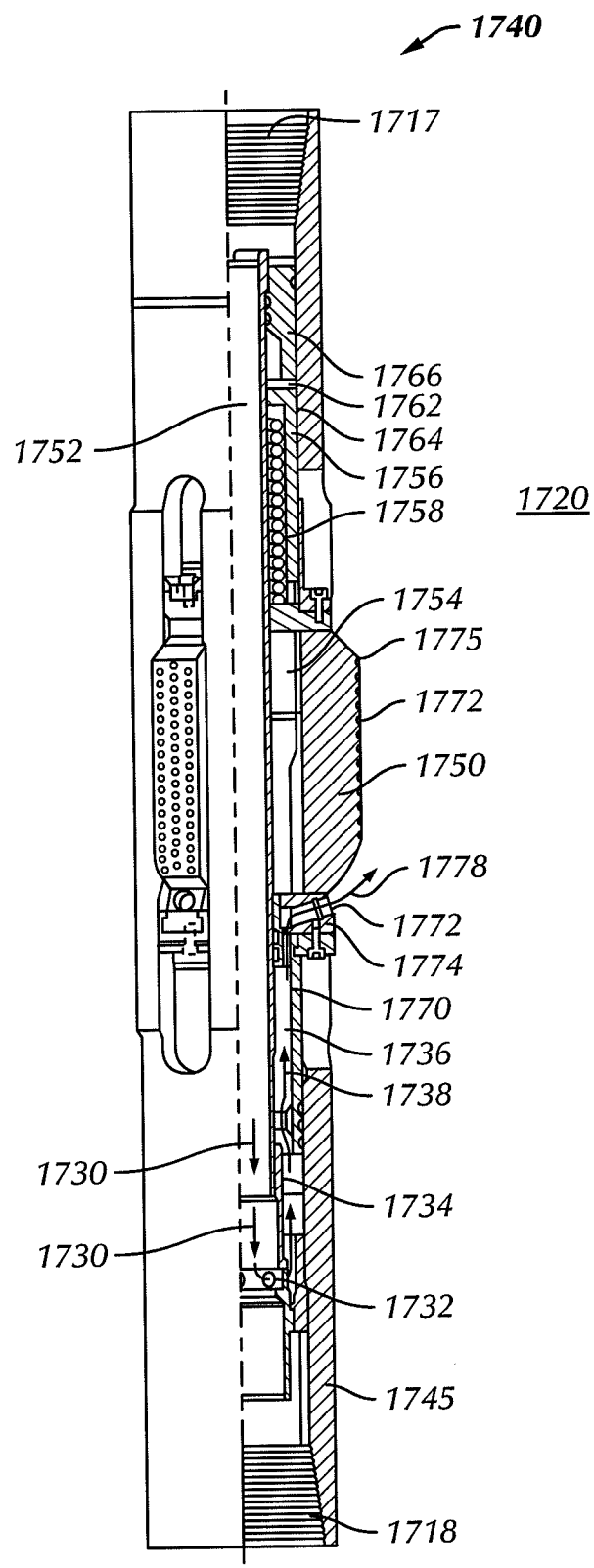
FIG. 18 shows a cross sectional elevation view of one embodiment of a stabilizer in accordance with an embodiment of the invention, showing the stabilizer arms in an expanded position.

FIGS. 17 and 18 show an alternative vibrational control device in accordance with an embodiment of the invention. In this embodiment, the vibrational control device is a stabilizer 1740. In one embodiment, stabilizer 1740 may be actuated to expand or extend stabilizer arms 1750 into contact with a wall of a wellbore (not shown). Accordingly, stabilizer 1740 may be referred to herein as an "expandable stabilizer." Expandable stabilizer 1740 may be operated or actuated in response to a predicted vibration from the simulation (e.g., 1405 of FIG. 14). In one embodiment, multiple expandable stabilizers may be disposed along the length of drill string. In this embodiment, one or more expandable stabilizers may be actuated separately or simultaneously in response to the predicted vibration of the simulation. For example, the simulation may predict that a lower end of the drilling tool assembly experiences large vibrational forces. Accordingly, an expandable stabilizer assembled to a corresponding location on the drill string may be actuated to dynamically control the vibration of the drilling tool assembly.

In one embodiment, stabilizer arms 1750 may be actuated hydraulically. FIG. 17 shows hydraulically actuated stabilizer 1740 in a collapsed position and FIG. 18 shows hydraulically actuated stabilizer 1740 in an expanded position. In this embodiment, stabilizer 1750 may be connected between segments of drilling string, for example, by threaded connections 1717, 1718. Expandable stabilizer 1740 comprises a generally cylindrical tool body 1745 with a flowbore 1752 extending therethrough. One or more pocket recesses 1754 are formed in body 1745 and spaced apart azimuthally around its circumference. The one or more recesses 1754 accommodate the axial movement of several components of stabilizer 1740 that move up or down within pocket recesses 1754, including one or more moveable stabilizer arms 1750. While each recess 1754 stores one moveable stabilizer arm 1750, multiple arms 1750 may be located within each recess 1754.

FIG. 18 depicts stabilizer 1740 with stabilizer arms 1750 in a maximum expanded position, extending radially outwardly from body 1745. Once stabilizer 1740 is in the borehole, it may be expanded to the position shown in FIG. 18. A spring retainer 1756, which may be a threaded sleeve, may be adjusted at the surface to limit the full diameter expansion of stabilizer arms 1750. Spring retainer 1756 compresses a biasing spring 1758 when stabilizer 1740 is in the collapsed position (FIG. 17) and the position of spring retainer 1756 determines the amount of expansion of stabilizer arms 1750. Spring retainer 1756 may be adjusted by any method known in the art. In the embodiment shown in FIGS. 17 and 18, spring retainer 1756 may be adjusted by a wrench in a wrench slot 1762 that rotates spring retainer 1756 axially downwardly or upwardly with respect to body 1745 at threads 1764. An upper cap 1766, a threaded component, may lock spring retainer 1746 in place once it has been positioned.

In the expanded position shown in FIG. 18, stabilizer arms 1750 extend radially out from body 1745 of stabilizer 1740 and contact the wall of the wellbore (not shown), thereby reducing vibrations of the drilling tool assembly. In one embodiment, wear buttons 1772 may be disposed on pads 1774 of stabilizer arms 1750 to prevent damage to the wall of the wellbore.

Hydraulic forces cause stabilizer arms 1750 to be expanded radially outwardly to the expanded position shown in FIG. 18 due to the differential pressure of drilling fluid between flowbore 1752 and a borehole annulus 1720. The drilling fluid flows along a path 1730 through ports 1732 in a lower retainer 1734 along a path 1738 into a piston chamber 1736. The differential pressure between the fluid in flowbore 1752 and the fluid in borehole annulus 1720 surrounding stabilizer 1740 causes piston 1770 to move axially upwardly from the position shown in FIG. 17 to the position shown in FIG. 18. A small amount of fluid may flow through piston chamber 1736 and through nozzles 1772 to annulus 1720 as stabilizer 1740 starts to expand. As piston 1770 moves axially upwardly in pocket recesses 1754, piston 1770 engages a drive ring 1774, thereby causing drive ring 1774 to move axially upwardly against stabilizer arms 1750. Stabilizer arms 1750 will move axially upwardly in pocket recesses 1754 and also radially outwardly as stabilizer arms 1750 travel in channels 1776 disposed in body 1745. In the expanded position (FIG. 18), the fluid flow continues along paths 1730, 1738 and out into annulus 1720 through nozzles 1772. Because the nozzles 1772 may be a part of drive ring 1774, they may move axially with stabilizer arms 1750. Accordingly, these nozzles 1772 are optimally positioned to continuously provide cleaning and cooling of pads 1774 and wear buttons 1772 and may create a liquid bearing around stabilizer 1740 as fluid exits to annulus 1720 along flow path 1778.

Alternatively, an expandable stabilizer may be actuated electrically. In this embodiment, electrical signals may be sent downhole to the expandable stabilizer 1740, thereby actuating the stabilizer arms 1750 to be expanded radially outward to the expanded position shown in FIG. 18. In this embodiment the drilling tool assembly may comprise an intelligent drill string system. One commercially available intelligent drill string system that may be useful in this application is a IntelliServ® network available from Grant Prideco (Houston, Tex.). An intelligent drill string system may comprise high-speed data cable encased in a high-pressure conduit that runs the length of each tubular. The data cable ends at inductive coils that may be installed in the connections of each end of a tubular joint. The intelligent drill string system provides high-speed, high-volume, bi-directional data transmission to and from hundreds of discrete measurement nodes. The intelligent drill string system may provide data transmission rates of up to 2 megabits/sec. Accordingly, transmission of data at high speeds supports high resolution MWD/LWD tools and provides instantaneous control of downhole mechanical devices, for example, expandable stabilizers. Each device may be defined as a node with a unique address and may gather or relay data from a previous node onto a next node. The flow of information between devices may be controlled, for example, by network protocol software and hardware. Because each node is uniquely identifiable, the location where events occur along the length of the well can be determined and modeled. Data may be transmitted both upwards and downwards from the measurement nodes, regardless of circulation conditions, thereby allowing transmission of downhole data to the surface, transmission of commands from the surface to downhole devices, and transmission of commands between downhole devices.

Figure 19:
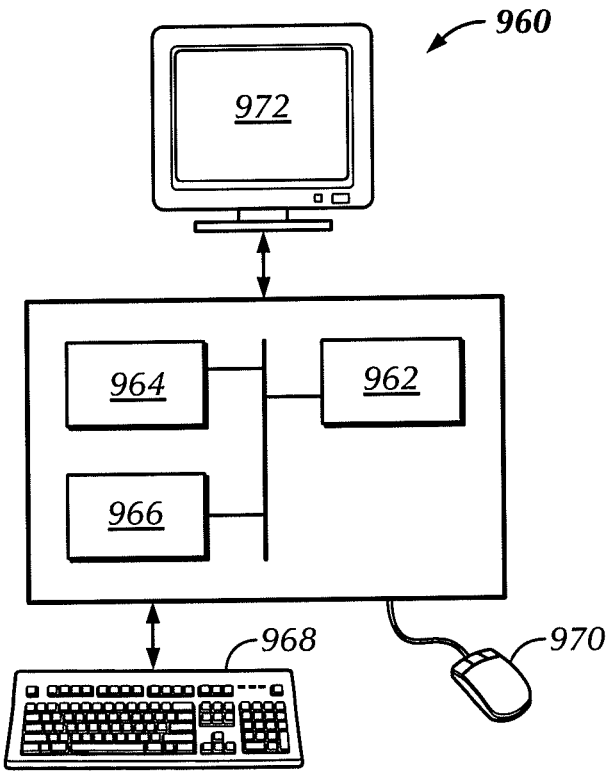
FIG. 19 shows a networked computer system in accordance with an embodiment of the invention.

Aspects of embodiments of the invention, may be implemented on any type of computer regardless of the platform being used. For example, as shown in FIG. 19, a computer system 960 that may be used in an embodiment of the invention includes a processor 962, associated memory 964, a storage device 966, and numerous other elements and functionalities typical of today's computers (not shown). Computer system 960 may also include input means, such as a keyboard 968 and a mouse 970, and output means, such as a monitor 972. Computer system 960 is connected to a local area network (LAN) or a wide area network (e.g., the Internet) (not shown) via a network interface connection (not shown). Those skilled in the art will appreciate that these input and output means may take other forms. Additionally, computer system 960 may not be connected to a network. Further, those skilled in the art will appreciate that one or more elements of the aforementioned computer system 960 may be located at a remote location and connected to the other elements over a network.

Designing Secondary Cutting Structures

As described above with respect to the placement of secondary cutting structures on a drilling tool assembly, cutting structure design may also be designed based on a dynamics analysis. Embodiments of the present disclosure including a dynamic analysis model may thereby allow for the secondary cutting structure of drilling tool assemblies to be analyzed, modeled, simulated, and/or designed so as to increase the functionality of the secondary cutting structure, and thereby improve drilling performance. Those of ordinary skill in the art will appreciate that secondary cutting structures may include reamers, components of reamers, such as individual cutters and/or blades, as well as other hole enlargement tools (e.g., expandable hole enlargement tools).

The design of secondary cutting structures include analyzing, modeling, and simulating secondary cutting structures, as well as modifying design elements of the secondary cutting structure. Design elements of secondary cutting structures may include, for example, cutting element profiles, the positioning of cutting elements, the type of cutting elements used, cutting element materials, side rake angle of cutting elements, back rake angle of cutting elements, the use of single, plural, or spiral sets of cutting elements, the design of blade pattern and type, and blade circumferential and angular position (e.g., blade-to-blade angle). Accordingly, a direct or indirect relationship may be established between the design elements and the dynamic behavior of the cutting action.

Figure 20:
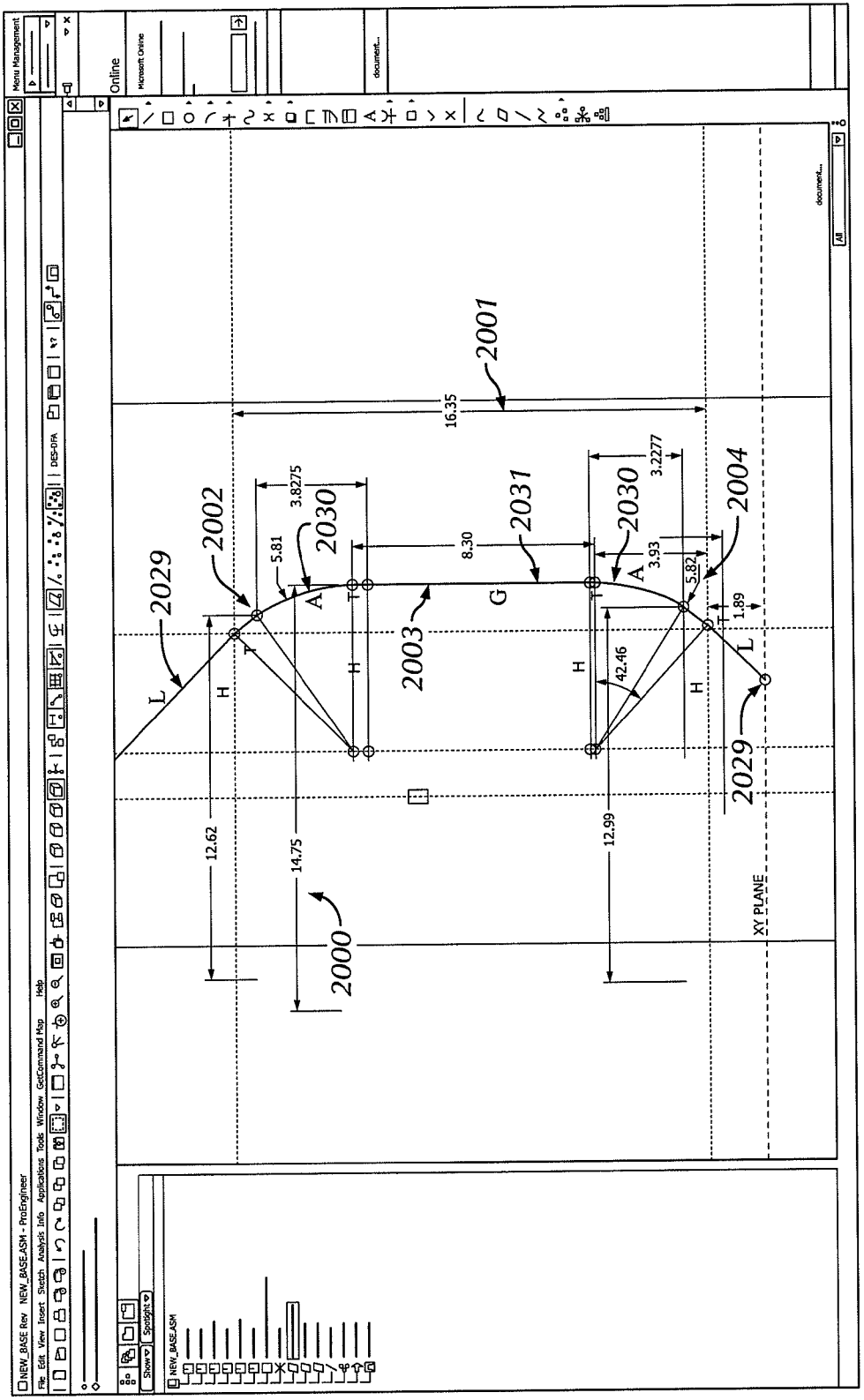
FIG. 20 shows an exemplary input design for a secondary cutting structure in accordance with an embodiment of the present disclosure.

Initially, the design of a secondary cutting structure according to embodiments of the present disclosure includes defining initial design elements for the secondary cutting structure of a bottom hole assembly. Referring to FIG. 20, an exemplary input design for a secondary cutting structure is illustrated. The initial design elements may be input into a computer system capable of performing a dynamic analysis, or may otherwise be input into a computer system and then transferred to a computing system capable of performing a dynamics analysis of the defined secondary cutting structure. In this embodiment, the initial design parameters for the secondary cutting structure include defining a specified profile for a reamer. The defined reamer profile may include a wellbore opening diameter 2000, a total length of the cutting structure profile 2001, a front profile curvature 2002, a gauge length 2003, and a back profile curvature 2004.

In one embodiment, the specified profile may include a line-arc-gauge-arc-line profile ("LAGAL"), wherein a line is defined as a region 2029, an arc is defined as a region 2030, and a gauge is defined as a region 2031. By varying the length of each region 2029, 2030, and 2031, the profile of a blade may be optimized for drilling a specific formation or under certain parameters. Additionally, the specific profile used may be changed, for example, by varying the number of line regions 2029, arc regions 2030, and/or gauge regions 2031. In other embodiments, a blade profile may include a line-arc-line-arc-gauge-arc-line profile, or a line-arc-line-arc-gauge-arc-line-arc-line profile. Those of ordinary skill in the art will appreciate that the specific profile used may be determined based on modeling and simulating the blade during the design process. As such, the distribution of cutting elements along blade may be varied according to a specific blade profile.

The opening diameter 2000 is the diameter of the wellbore that the secondary cutting structure will provide. The total length of the cutting structure 2001 is the maximum length of the blades upon which cutting elements may be placed, thereby defining the total length of the blade used in the secondary cutting. The front profile curvature 2002 defines the portion of the blade upon which front cutters will be disposed, while the back profile curvature 2004 defines the portion of the blade upon which back reaming cutters will be disposed. Similarly, the gauge length 2003 defines the portion of the blade upon which gauge cutters may be disposed. Those of ordinary skill in the art will appreciate that during the design of secondary cutting structures, certain secondary cutting structures may include all of the above regions (e.g., line region 2029, arc region 2030, and gauge region 2031), while other secondary cutting structures may not include certain aspects. For example, in certain embodiments, secondary cutting structures may not include gauge cutters. In still other embodiments, the profile of the secondary cutting structure may be geometrically different from the secondary cutting structure illustrated. For example, in certain embodiments, the profile may include a smaller gauge region 2003 proportional to the front and/or back profile curvatures 2002 and 2004. In other embodiments, the blade profile may include a more detailed profile, such as the line-arc-line-arcgauge-arc-line profile, or the line-arc-line-arc-gauge-arc-line-arc-line profile as compared to the LAGAL profile.

After defining the profile for the secondary cutting structure, a designer may provide other design elements for the secondary cutting structure. Other design elements may include the location for cutters along the secondary cutting structure profile. In addition to providing for cutter location, a designer may also specify the type of cutter being used, for example, by defining a cutting element material type, shape, diameter, etc. The designer may also include the side rake angle and back rake angle of the cutting element on the secondary cutting structure. The initial design elements may be entered into computer software, and a model (e.g., a 2-D or 3-D model) of the secondary cutting structure may be generated by the software. Those of ordinary skill in the art will appreciate that any type of software program known in the art for designing cutting structure for drilling tools may be used, including CAD, as discussed above. Additionally, the defined profile for the secondary cutting structure may be input from known secondary cutting structure designs. For example, a designer may have a library of known or previously modeled secondary cutting structures to choose from when selecting initial design elements.

Figure 21:
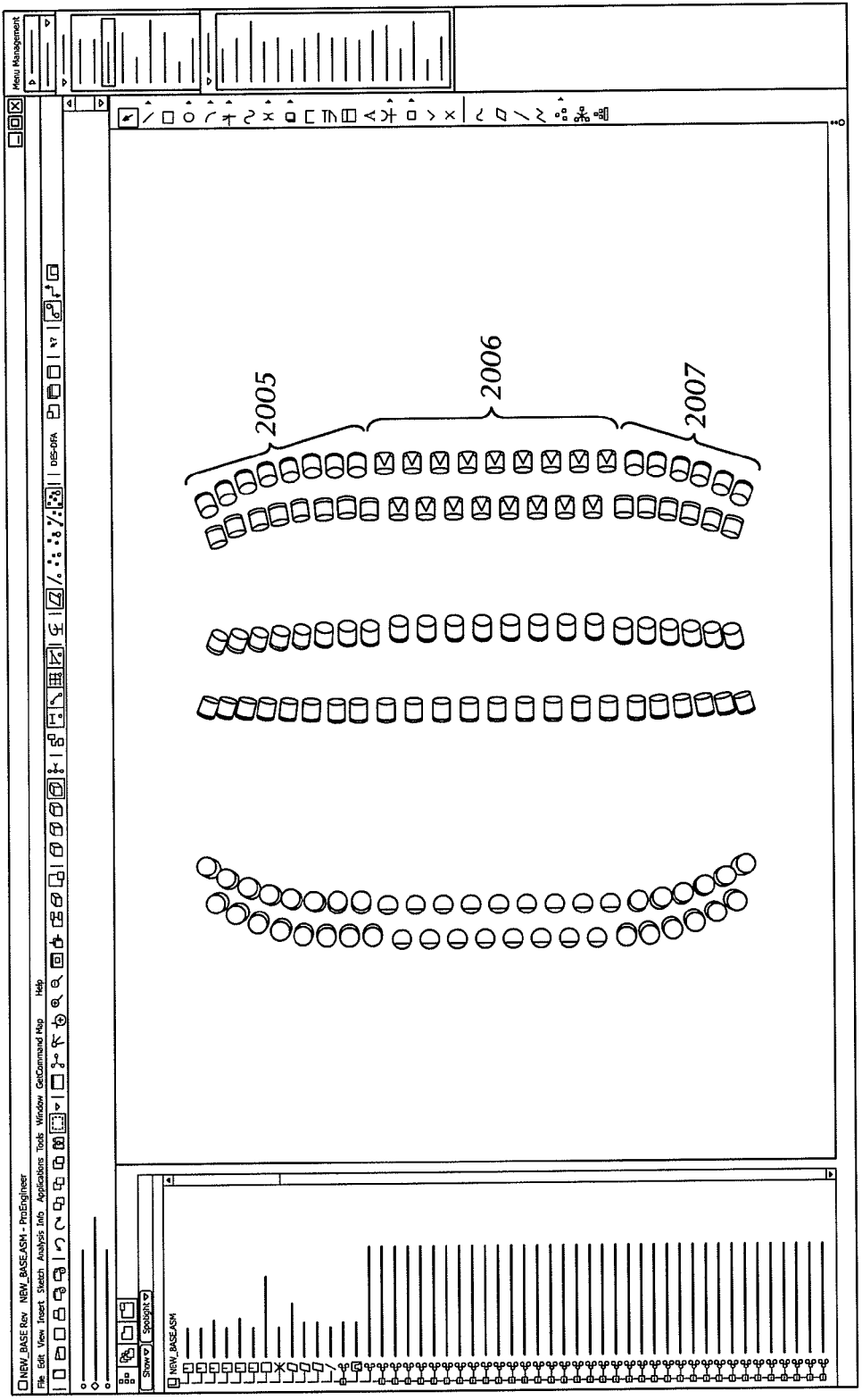
FIG. 21 shows a side view of a model for a secondary cutting structure in accordance with an embodiment of the present disclosure.

Referring to FIG. 21, a side view of a modeled LAGAL profile secondary cutting structure according to embodiments of the present disclosure is shown. In this embodiment, a computer screen including a modeled secondary cutting structure is illustrated as having cutting elements displayed in 3D. Additionally, aspects of the secondary cutting structure may be explicitly defined, such as the placement of front cutters 2005, gauge cutters 2006, and/or back cutters 2007. The defining and subsequent modeling of components of the secondary cutting structure may thereafter be modified by, for example, changing a design element of the secondary cutting structure. Changes to design elements may include modification of the placements of a cutter 2005, 2006, or 2007 along the secondary cutting structure profile. In other embodiments, changes may include changing any design element, such as those expressly described above, as would be known to those of ordinary skill in the art.

Figure 22:
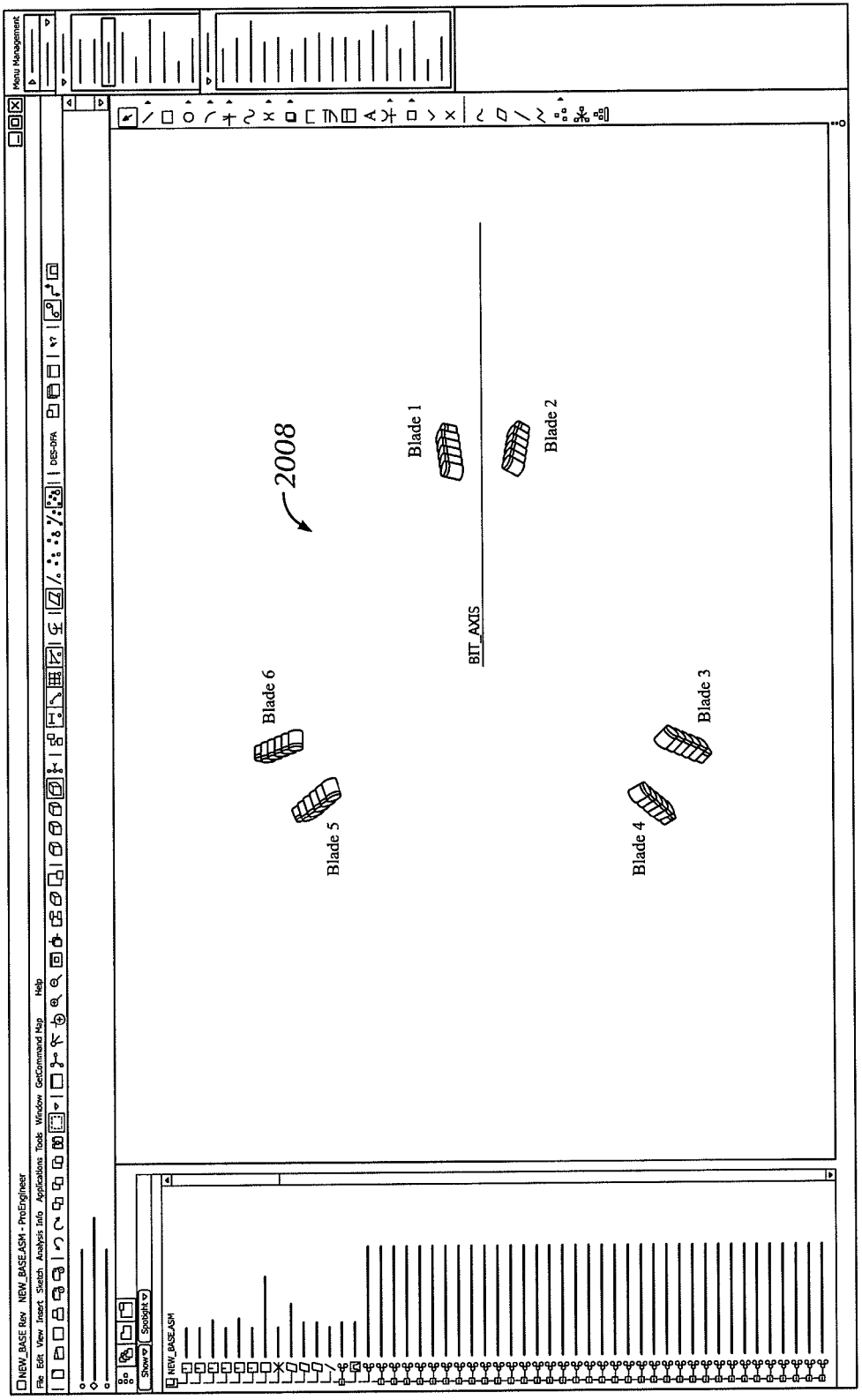
FIG. 22 shows a top view of a model for a secondary cutting structure in accordance with an embodiment of the present disclosure.

Referring to FIG. 22, a top view of the modeled secondary cutting structure according to embodiments of the present disclosure is shown. In this embodiment, the modeled secondary cutting structure from FIG. 21 illustrates the angular position of cutting elements relative to other cutting elements and the angular orientation of individual blades 2008. As illustrated, this embodiment includes the modeling of six blades 2008. However, in alternate embodiments, the secondary cutting structure may have greater than or fewer than six blades, the position of the blades on the secondary cutting structure may be different, and/or the angular orientation of the blades relative to secondary cutting structure, as well as the angular orientation of the individual blades relative to one another may be varied. All of the data used to define the secondary cutting structure may be saved as numerical or tabularized data, such as that data illustrated in FIG. 23. Data saved may include, a cutter number, radius, angle around, height, profile angle, back rake angle, side rake angle, cutter diameter, cutter size and type, and blade on which the cutter is located. In certain embodiments additional data may be saved and subsequently used to model additional secondary cutting structures.

Figure 24:
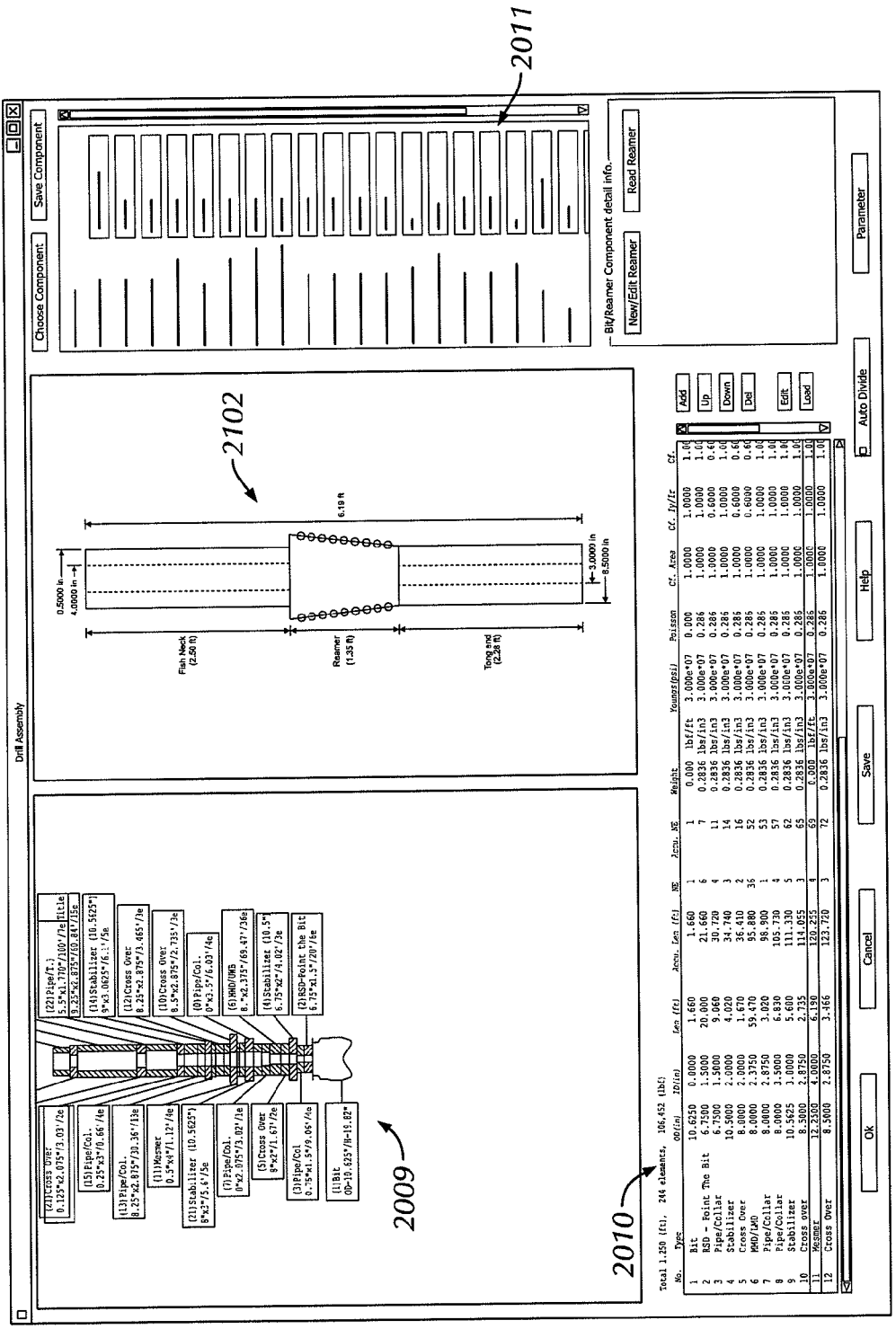
FIG. 24 shows a drilling tool assembly design model in accordance with an embodiment of the present disclosure.

Referring to FIG. 24, a model of a secondary cutting structure disposed on a drilling tool assembly, according to embodiments of the present disclosure, is shown. In this embodiment, the secondary cutting structure 2102 may be modeled on a drilling tool assembly 2009, including additional drilling tool assembly components, such as, for example, a drill bit, stabilizers, measurement-while-drilling and logging-while-drilling apparatuses, stabilizers, directional drilling devices such as rotary steerable systems (e.g., push-the-bit and point-the-bit systems), drill collars, special drilling tools, heavy weight drill pipes, and drill pipes. Varied drilling tool assembly design parameters 2010, such as the location of individual components along the drilling tool assembly may be modified. Additionally, design elements of the secondary cutting structure, such as blade position, length, diameter, etc., may also be modified through the use of input fields 2011. Thus, an analytical model of a drilling tool assembly including a secondary cutting structure may be generated, graphically displayed, and the design elements and drilling tool assembly design parameters modified and/or saved accordingly.

In one embodiment, after the secondary cutting structure is defined, a primary cutting structure, such as a design for a drill bit, may also be input into the model. Thus, a designer may include in the drilling tool assembly model either the secondary cutting structure design or both primary and secondary cutting structure designs, such that the affect of modifying a design element of the secondary cutting structure on both the bit and the drilling tool assembly may be determined. Those of ordinary skill in the art will appreciate that the order of entering any of the above information, including design elements of the secondary cutting structure may be entered or imported into the modeling program in any order. As such, a primary cutting structure may be modeled before, after, or separately from a secondary cutting structure. A secondary cutting structure may also be modeled separately from primary cutting structure, as well as combined with primary cutting structure.

After initial drilling tool assembly design elements are modeled, including the secondary cutting structure, a dynamic response of the drilling tool assembly is simulated. Generally, the dynamic response of the drilling tool assembly may be simulated according to any of the methods described above. The dynamic response of the drilling tool assembly including the secondary cutting structure may include forces, such as axial, lateral, and circumferential forces acting on the secondary cutting structure. In response to the dynamic response of the drilling tool assembly, a design element of the secondary cutting structure may be adjusted.

In certain embodiments, the modeling may include simulating a primary and secondary cutting structure drilling through like formation. However, in other embodiments, the modeling may include simulating the primary and secondary cutting structures drilling through different formations. When a primary cutting structure and a secondary cutting structure are drilling through different formations, resultant optimized drilling operating parameters may be different for the primary cutting structure and the secondary cutting structure. For example, if a primary cutting structure is drilling through a relatively soft formation, while a secondary cutting structure is drilling through a relatively hard formation, traditional drilling parameter optimization would include increasing the weight on bit. However, by increasing the weight on bit for a drilling tool assembly including a secondary cutting structure, the applied weight may be re-distributed between primary and secondary cutting structures. Chatter vibrations and impact fatigue of the cutting elements of the secondary cutting structure may be increased because the weight on bit is substantially on the secondary cutting structure. To address such situations, one option would be to decrease the weight on bit, so as to decrease the weight on the secondary cutting structure. However, an alternate solution is to modify a design element of the secondary cutting structure to increase aggressiveness (i.e., to increase effectiveness of cutting and the amount of formation removed). In still other embodiments, the solution may be to modify at least one design element to balance the forces acting on at least one of the primary and/or secondary cutting structure.

To increase the aggressiveness of the cutting elements of the secondary cutting structure, a designer may change the back rake angle of the cutters. For example, to increase aggressiveness a designer may decrease the back rake angle of one or more cutting elements. In certain embodiments, by decreasing the back rake to less than or equal to 20°, the aggressiveness of the secondary cutting structure may be increased, thereby increasing the stability of the secondary cutting structure and therefore the entire bottom hole assembly. In still other embodiments, the aggressiveness of the secondary cutting structure may be further increased by decreasing the back rake angle of one or more cutting elements to less than 10°, while in still other embodiments, the back rake angle may be decreased to less than 5°.

In other embodiments, the designer may choose to adjust a side rake angle. Thus, by decreasing or increasing the side rake angle of one or more cutters on the secondary cutting structure, the load on the individual cutting elements may be balanced along the cutting edge, thereby decreasing cutter fatigue and increasing the functional life of the secondary cutting structure. In one embodiment, the preferred side rake angle adjustment in order to balance the circumferential cutting force along the cutting element edge ranges between ±10°. While in still other embodiments, the side rake angle may be decreased to 0°.

By modifying design elements of secondary cutting structures, such as side rake and back rake angles, the aggressiveness of the secondary cutting structure may be matched to the aggressiveness of the primary cutting structure. Simulating the dynamic response of a drilling tool assembly including a primary and secondary cutting structure may allow for the design of a secondary cutting structure that is more stable and decreases vibrations, thereby resulting in less damage to the secondary cutting structure. Those of ordinary skill in the art will appreciate that in other embodiments, other design elements of the secondary cutting structure may be adjusted alone or in combination with the detailed adjustments disclosed above.

After a design element is adjusted, the drilling tool assembly may be re-simulated to determine if the adjusted design element improved a condition of the drilling. The drilling condition may include, for example, an improved ROP, decreased secondary cutting structure wear, decreased primary cutting structure wear, decreased axial, lateral, and torsional vibrations, and/or a combination of one or more of the above. The process of simulating, adjusting, and determining may be repeated as many times as necessary until a drilling condition is optimized.

Figure 25A:
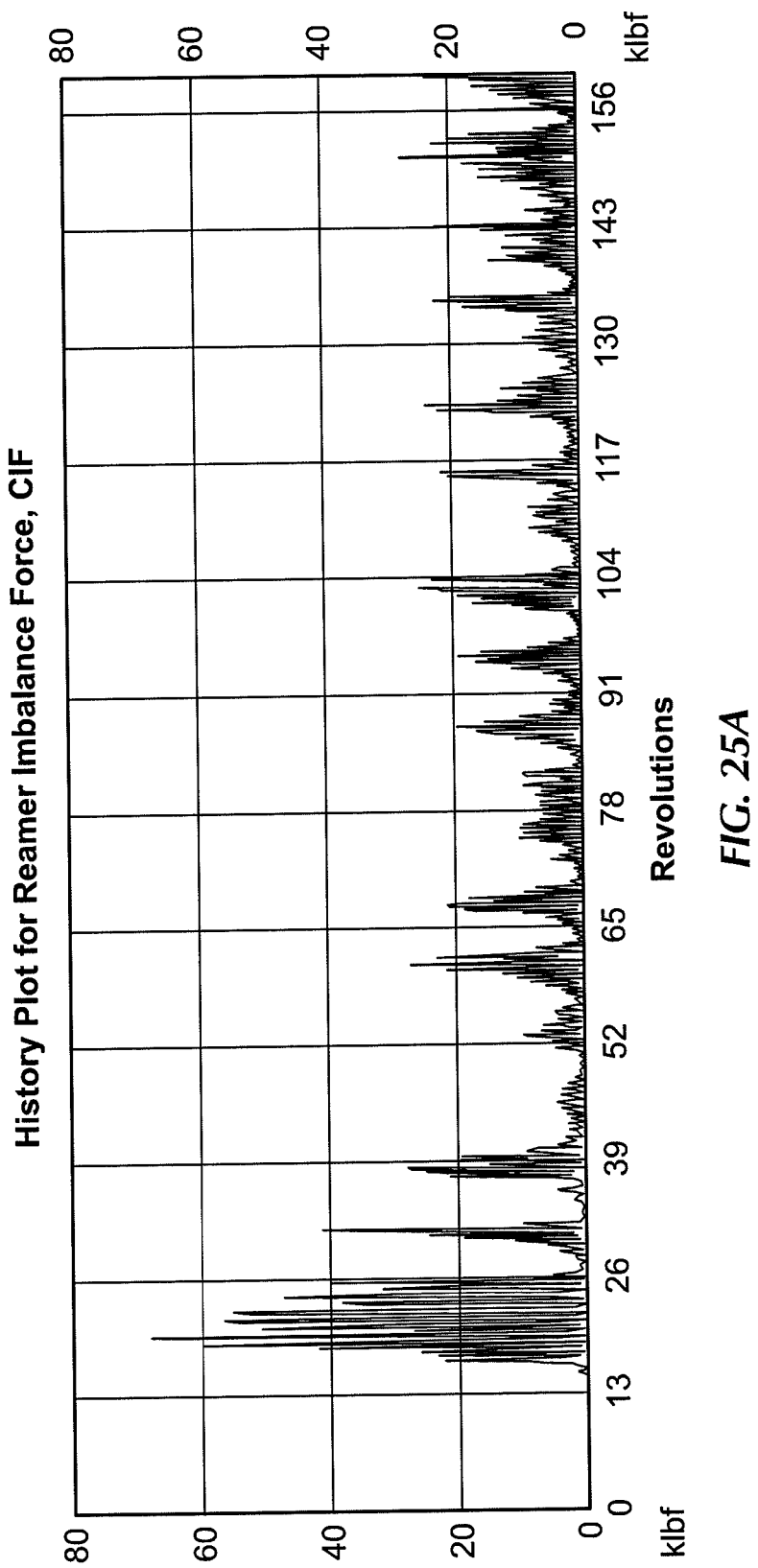
FIGS. 25A and 25B show history plot graphs for simulations in accordance with embodiments of the present disclosure.
Figure 25B:
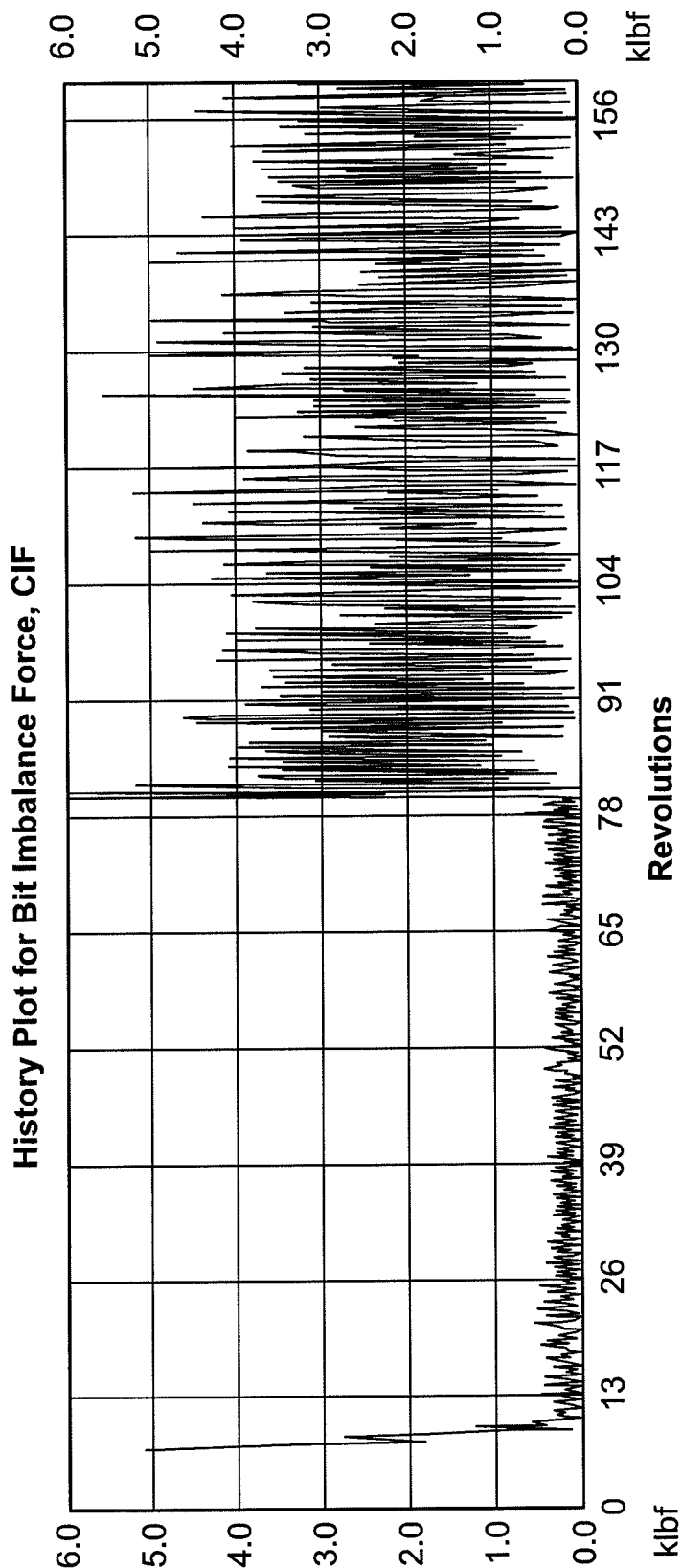

The simulation, as described above, may result in various graphical displays of the dynamic response of the drilling tool assembly, individual components of the drilling tool assembly, as well as the dynamic response of individual cutting elements. For example, referring to FIGS. 25A and 25B, graphical displays according to embodiments of the present disclosure are shown. FIG. 25A is an exemplary history plot for the secondary cutting structure circumferential imbalance forces. The graph illustrates the amount of imbalance force on a secondary cutting structure for each revolution of the cutting structure. Similarly, FIG. 25B shows a history plot for primary cutting structure circumferential imbalance forces (i.e., circumferential imbalance forces on a drill bit). FIGS. 25A and 25B illustrate that imbalance forces for individual components of the drilling tool assembly may differ during the same time increment during drilling. Such evidence may be used to analyze and determine the appropriate solution to the imbalance condition that may result in increased vibrations or an otherwise less than optimal drilling condition.

Figure 26A:
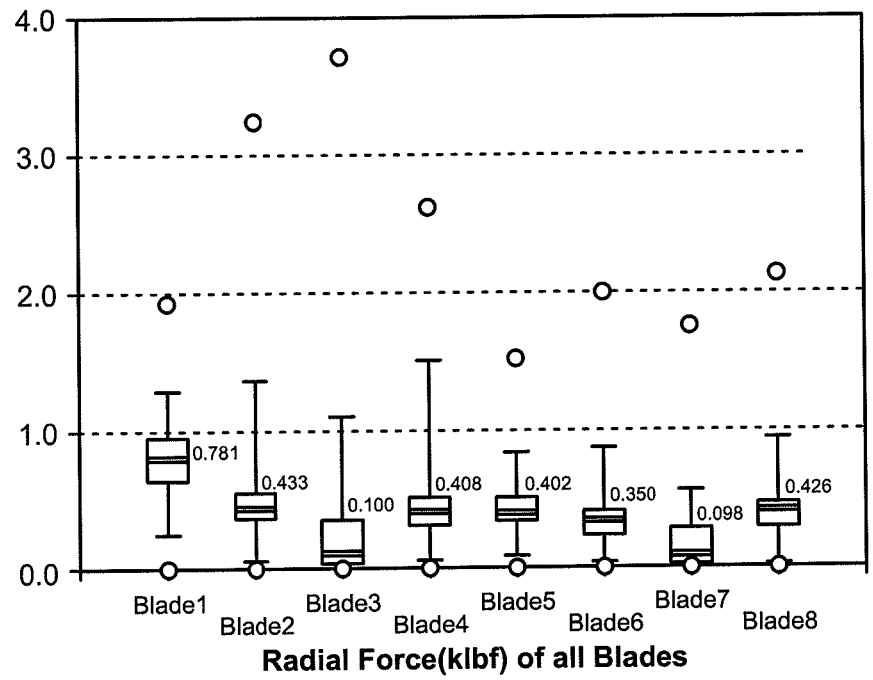
FIGS. 26A-26D show graphical representations of forces on blades of a secondary cutting structure in accordance with embodiments of the present disclosure.
Figure 26B:
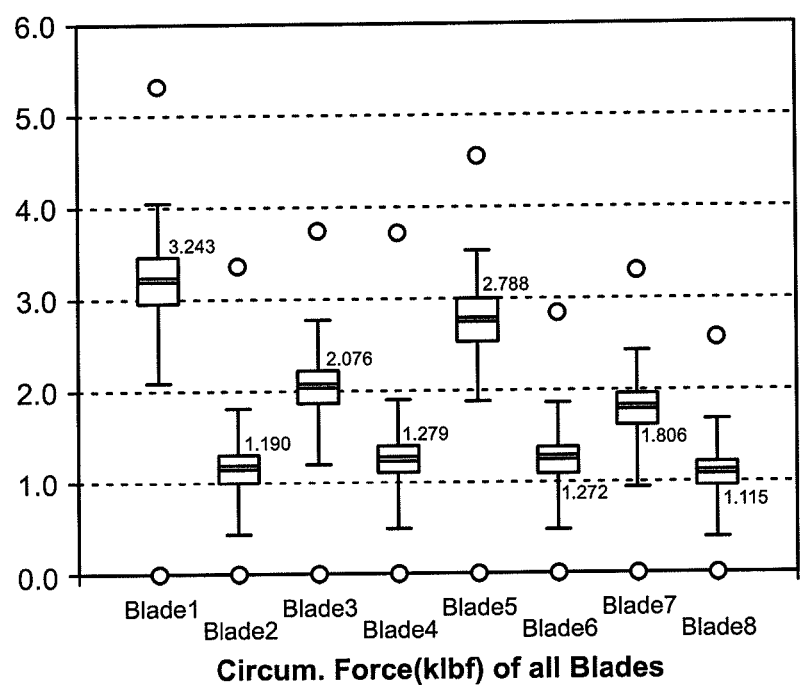
Figure 26C:
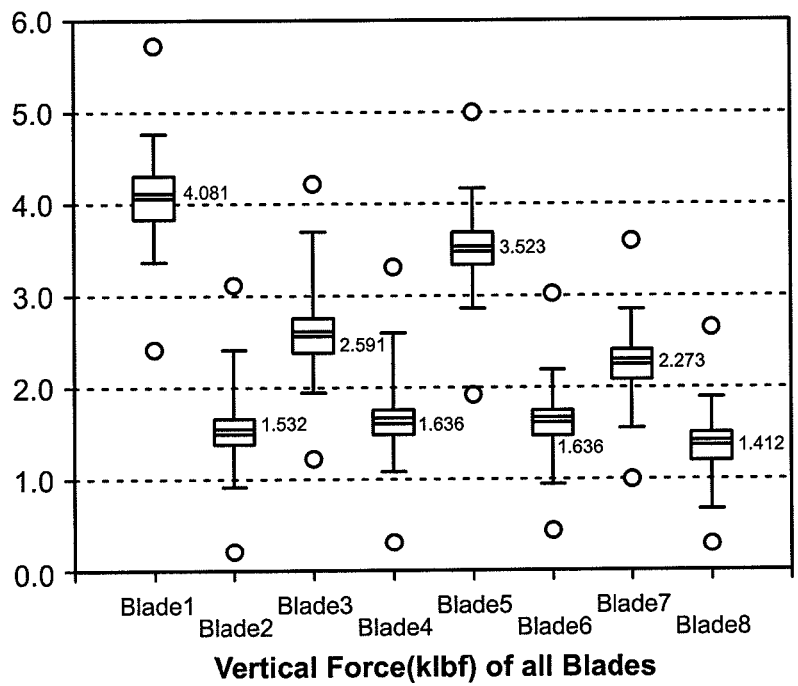
Figure 26D:
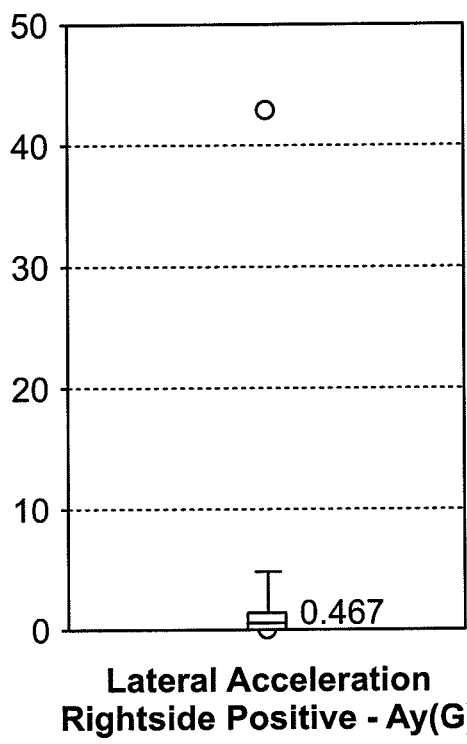

Referring to FIGS. 26A, 26B, 26C, and 26D, graphical displays of forces according to embodiments of the present disclosure are shown. In addition to history plots, embodiments of the present disclosure may provide statistical data that may be displayed with percentile marks as a measurement of possible forces acting on individual blades. For example, FIG. 26A illustrates a graph of radial forces on each blade of primary or secondary cutting structure, and may be used to determine an average radial force on each blade of the cutting structure, as well as the percentile of low and high amount of radial force at each individual blade. Similarly, FIG. 26B may be used to analyze circumferential force, FIG. 26C may be used to analyze vertical or axial force, and FIG. 26D may be used to analyze the lateral acceleration of the primary or secondary cutting structure.

Figure 27A:
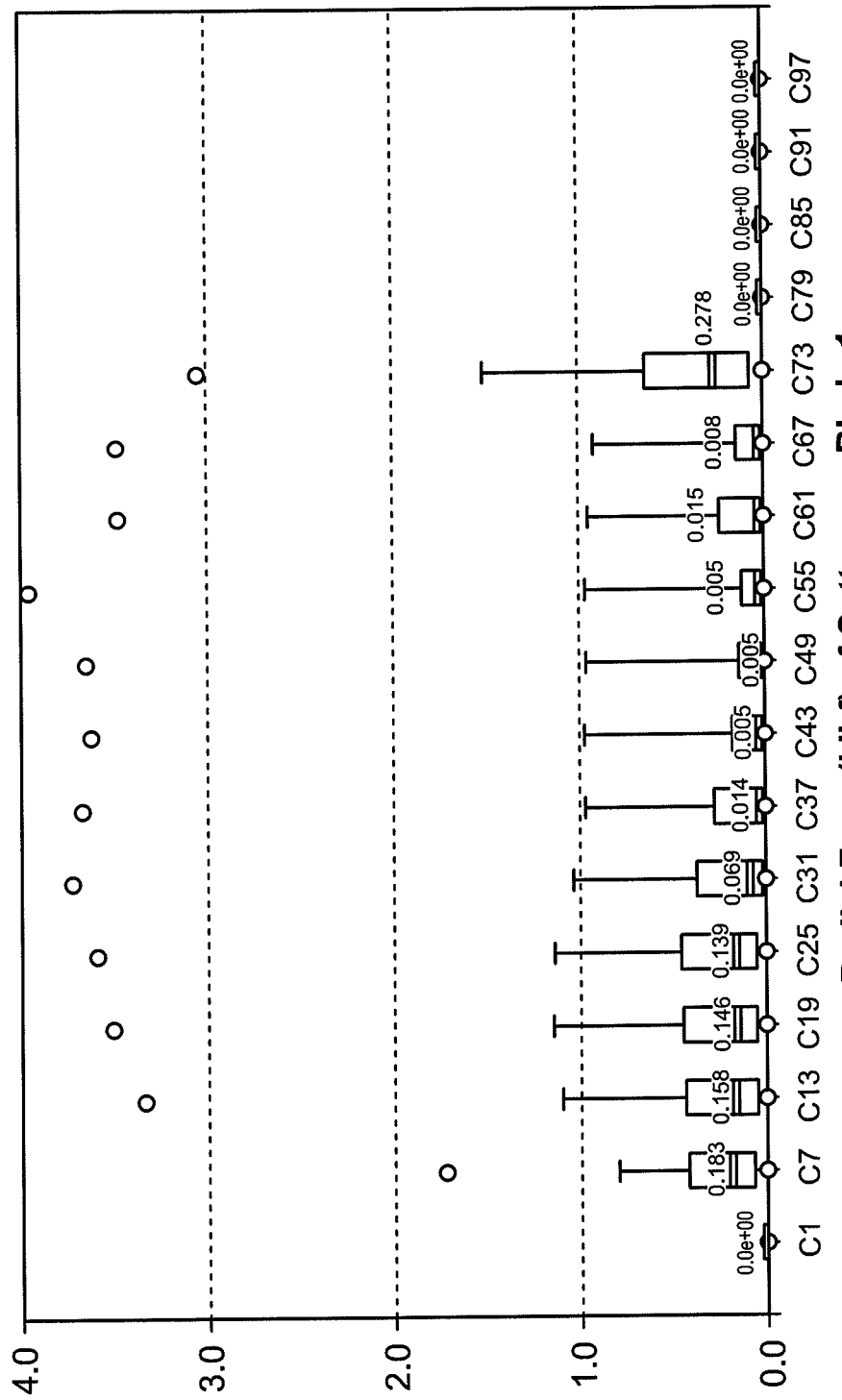
FIGS. 27A-27C show graphical representations of forces on individual cutters of a secondary cutting structure in accordance with embodiments of the present disclosure.
Figure 27B:
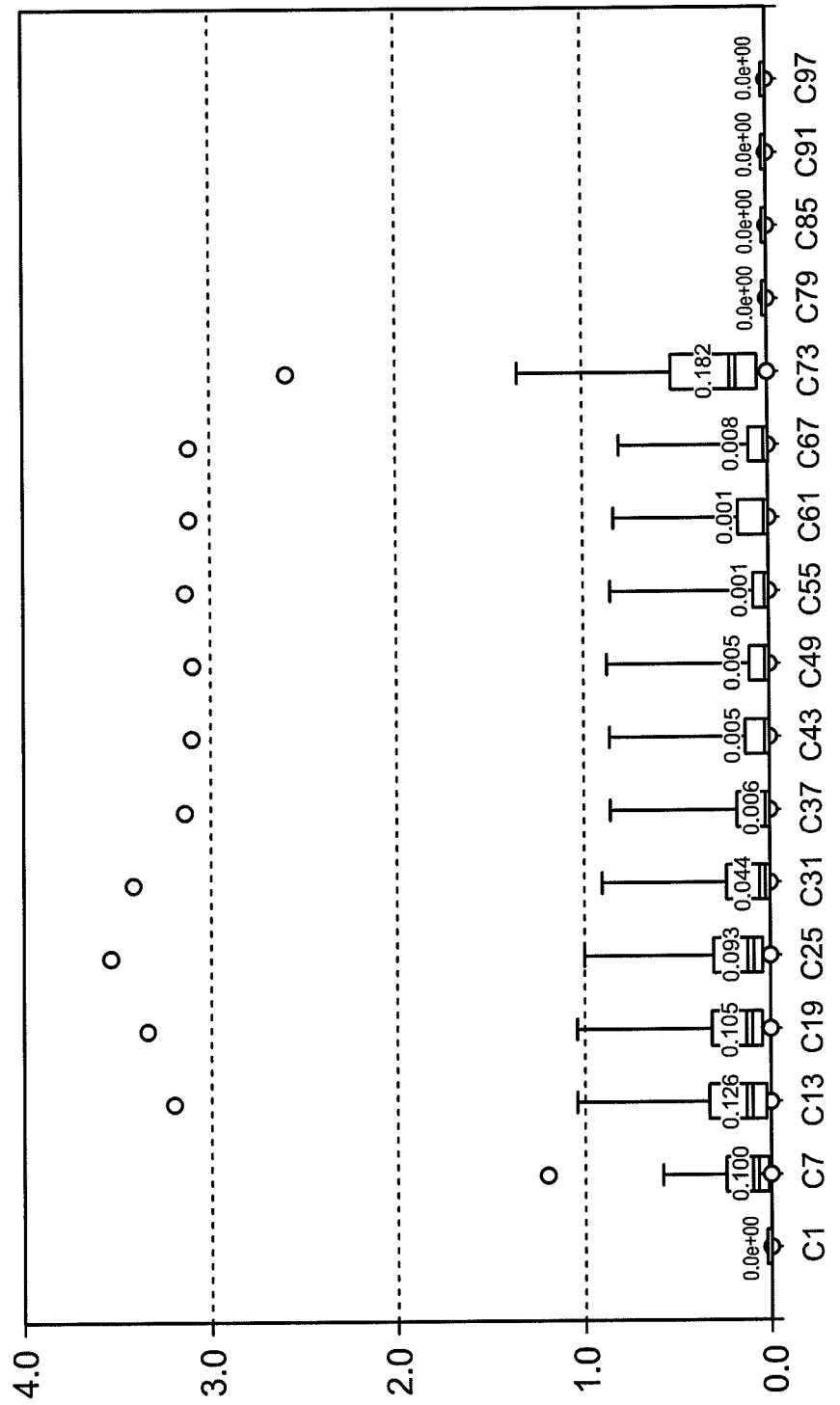
Figure 27C:
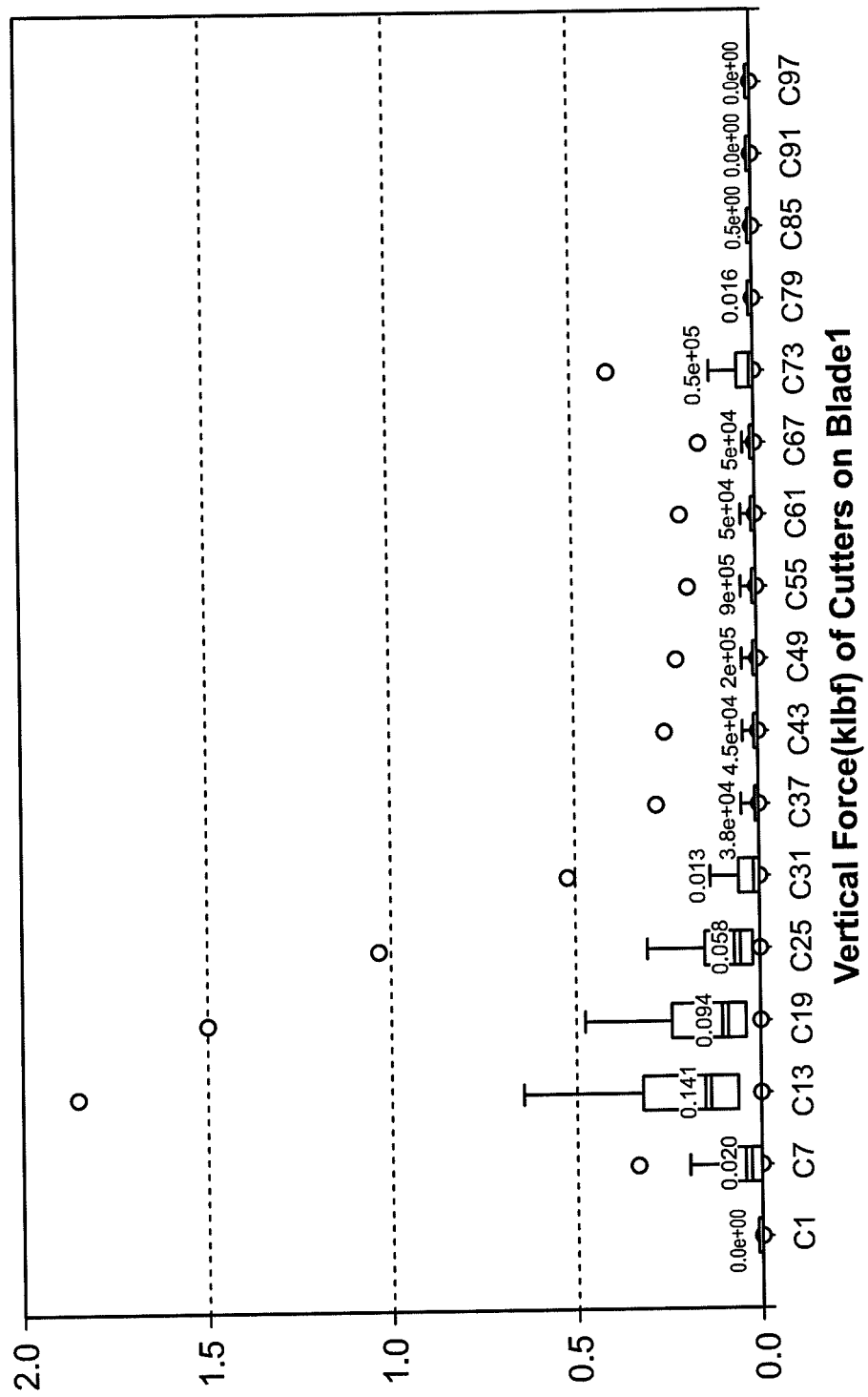
Figure 28A:
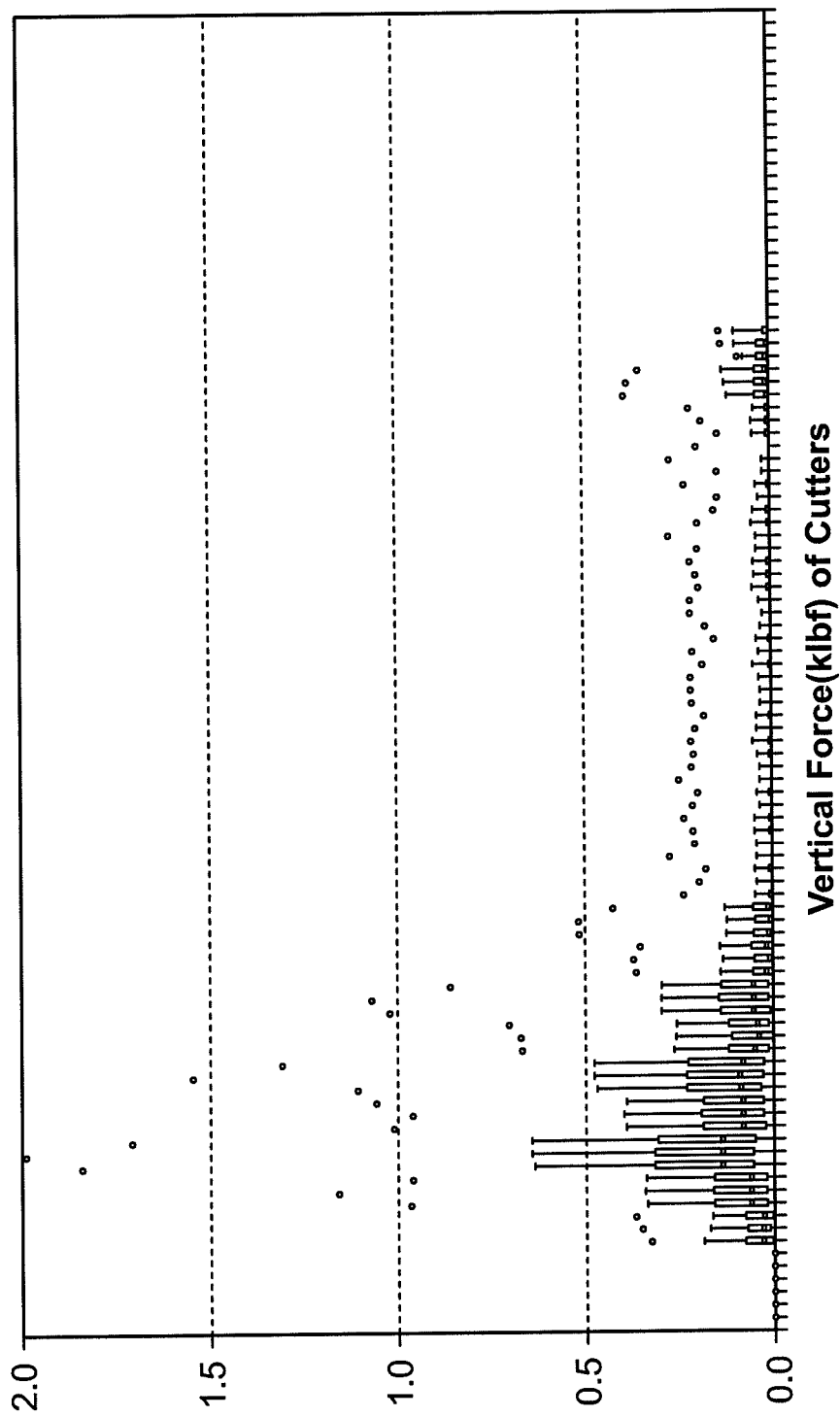
FIGS. 28A-28G show graphical representations of forces on cutters in accordance with embodiments of the present disclosure.
Figure 28B:
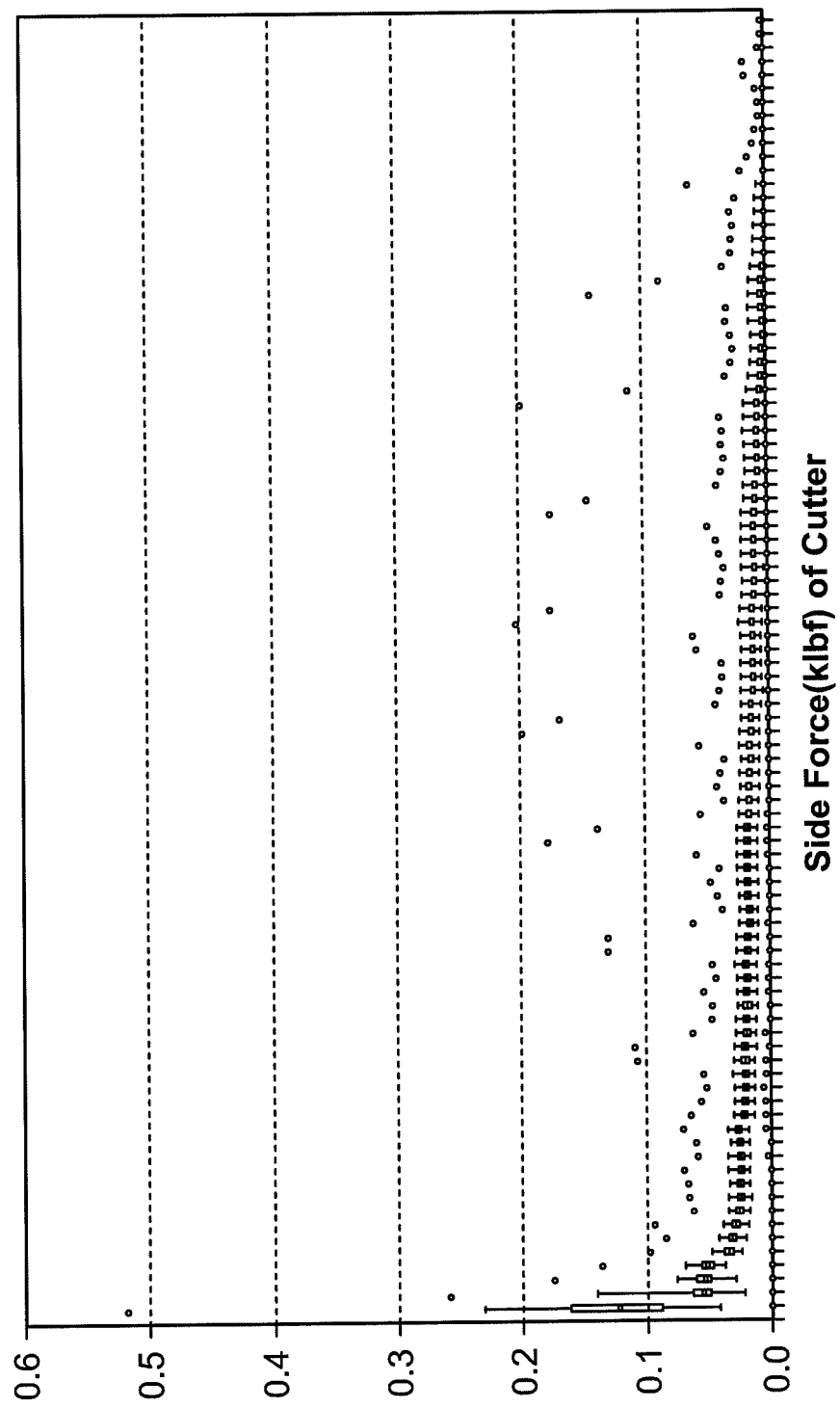
Figure 28C:
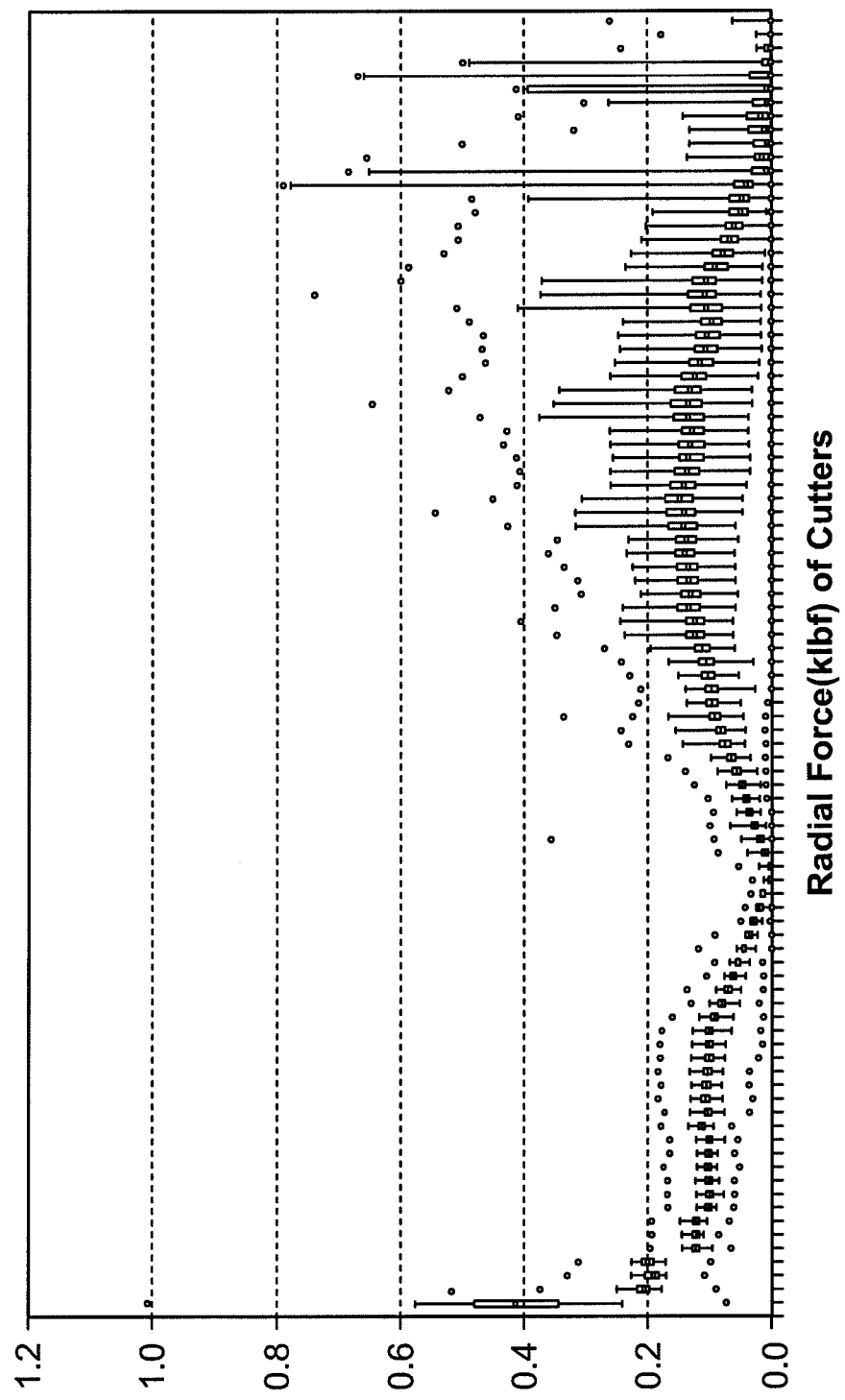
Figure 28D:
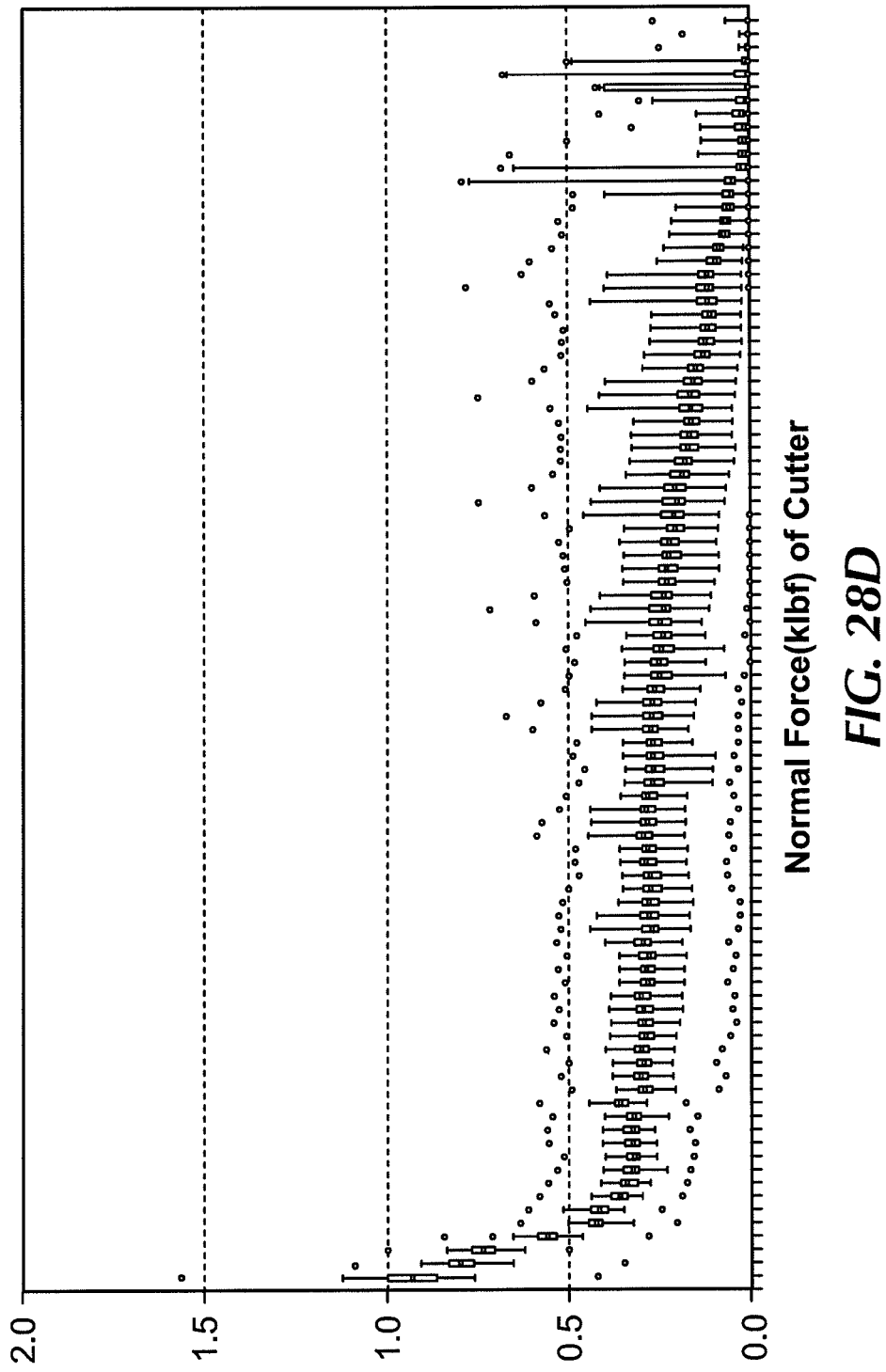
Figure 28E:
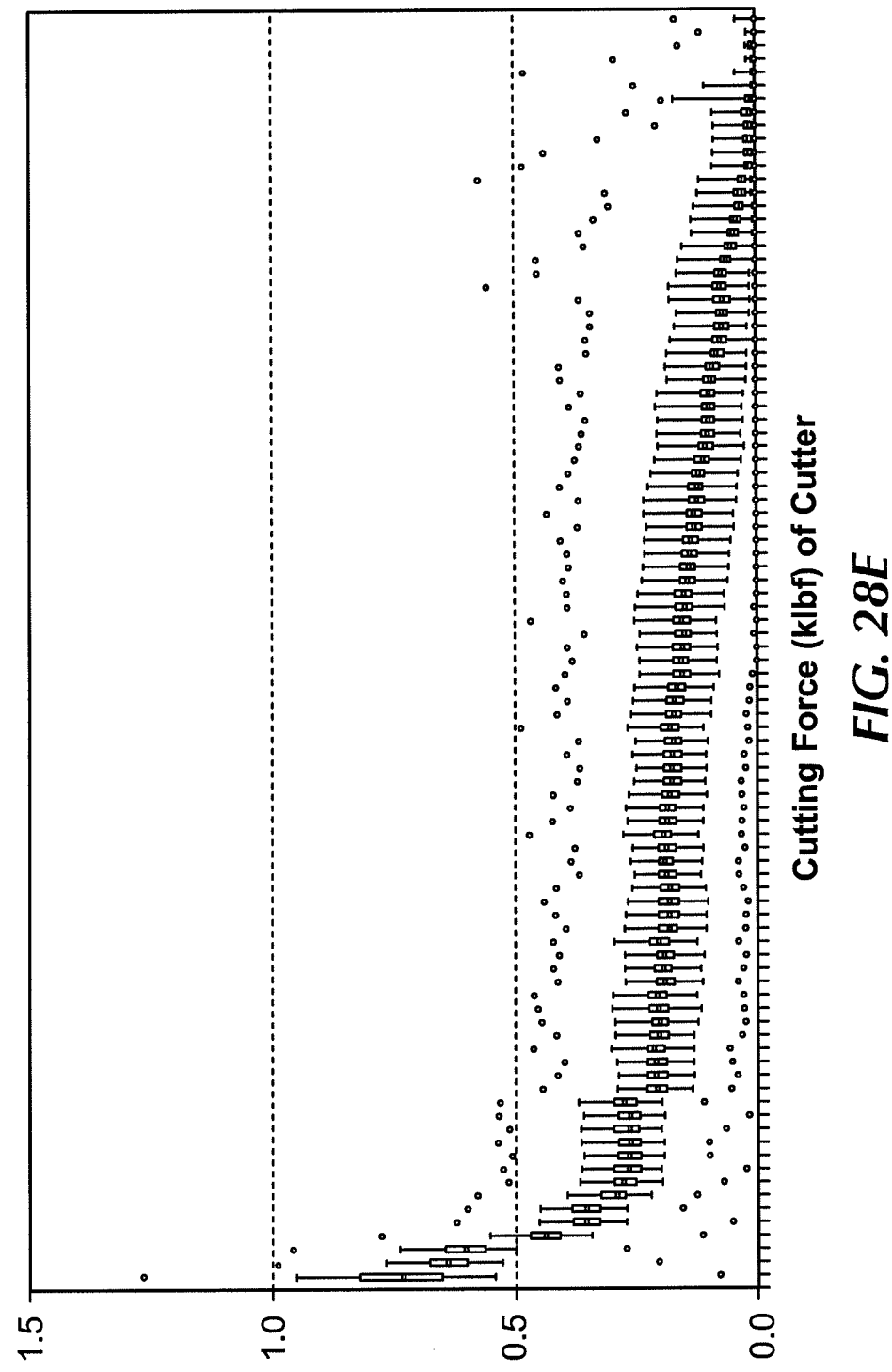
Figure 28F:
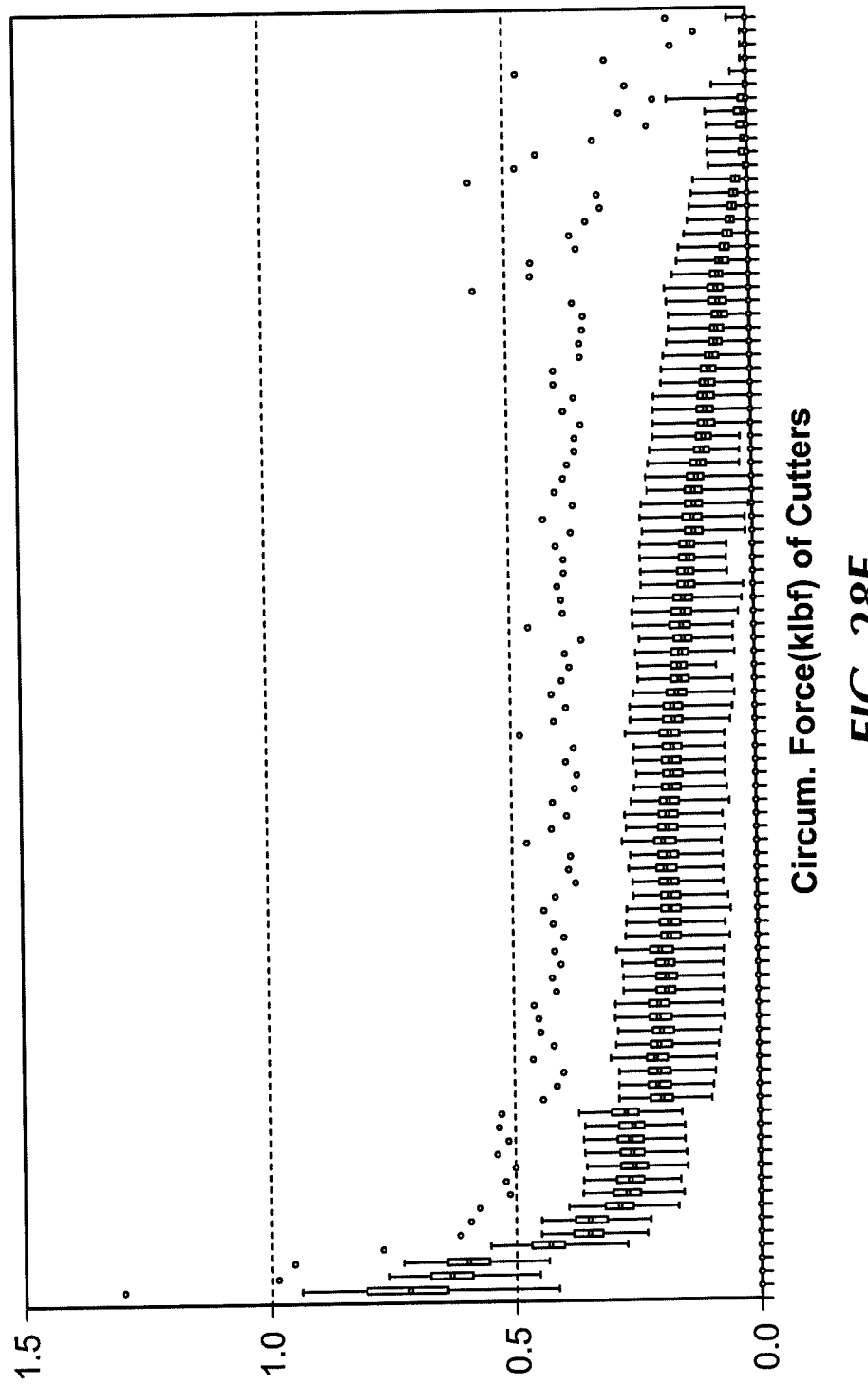
Figure 28G:
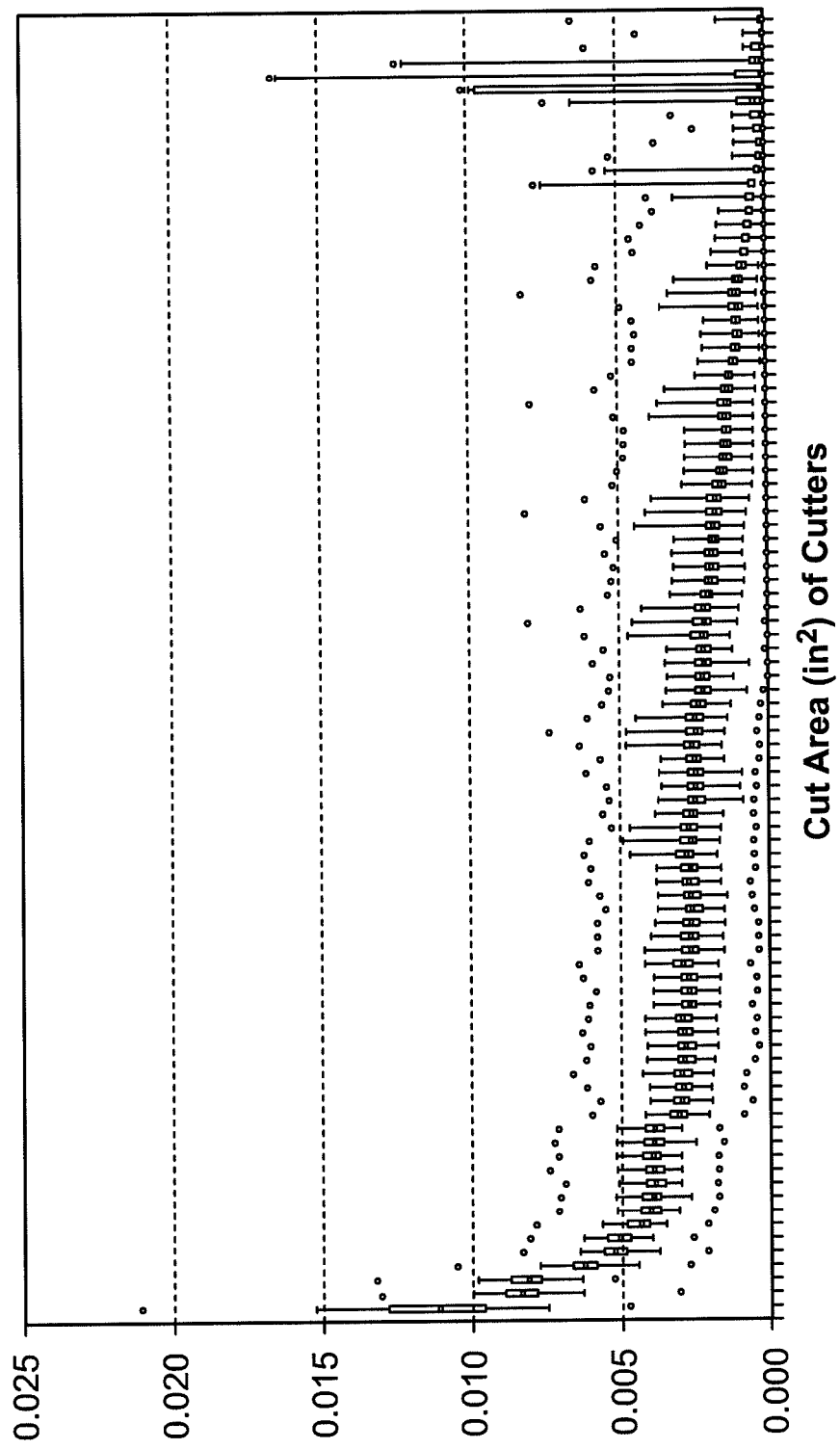

Other statistical data that may be generated and analyzed to determine which design element should be adjusted to alter the forces acting on individual cutters. For example, referring to FIGS. 27A, 27B, and 27C, graphical plots of forces acting on individual cutters, according to embodiments of the present disclosure, are shown. FIG. 27A illustrates the radial forces that act on individual cutting elements of an individual blade of the secondary cutting structure, in this instance, a blade 1. Similar graphical or numerical representations of the radial forces acting on other blades may also be generated, analyzed, and/or compared against one another to determine which design element to adjust. FIG. 27B illustrates the circumferential forces acting on individual cutting elements of specific blades, in this instance, blade 1. FIG. 27C illustrates vertical or axial forces acting on individual cutters of blade 1. Those of ordinary skill in the art will appreciate that the forces acting on individual cutting elements and/or the net forces acting on the blades may be used to determine a design element to adjust.

Additional statistical data that may be gathered and graphically illustrated include forces acting on individual cutting elements, displayed relative to other cutting elements within the same cutting structure, thereby allowing for an overall comparison for the entire cutting structure. For example, FIGS. 28A through 28G represent different types of cutter forces that may be calculated and graphically displayed. Examples include, vertical forces, side forces, radial forces, normal forces, cutting forces, circumferential forces, as well as cut area for each individual cutting element among all cutting elements of the same cutting structure. Any of the above calculations may be analyzed to determine which design element of the secondary cutting structure to modify.

The above described list of forces and parameters that may be used to analyze secondary cutting structures is illustrative only. Those of ordinary skill in the art will appreciate that additional calculations and graphical representations may also be used to further determine an optimal secondary cutting structure. For example, in other embodiments, additional forces and parameters may include torque on the primary and/or secondary cutting structure, weight on the primary and/or secondary cutting structure, and depth of cut of individual cutters.

Any of the above collected data and graphical illustrations may be output in the form of numerical or graphical representations, or otherwise stored for use in later analysis. Additionally, after the secondary cutting structure design is optimized, the design, including the adjusted design element(s), may be output in the form of a secondary cutting structure design or drilling tool assembly design. Alternatively, the adjusted design element may be output individually.

Iterative simulations of the above described secondary cutting structure design methods may be used to optimize secondary cutting structure for drilling in specific formation types or under certain conditions. For example, the secondary cutting structure may be optimized to drill using predefined drilling parameters or with specific predefined components (e.g., measurement-while-drilling, logging-while-drilling, directional drilling systems, and/or a preferred primary cutting structure). Several potential output possibilities for design element adjustment, and resultant secondary cutting structure designs are illustrated in detail below.

Figure 29:
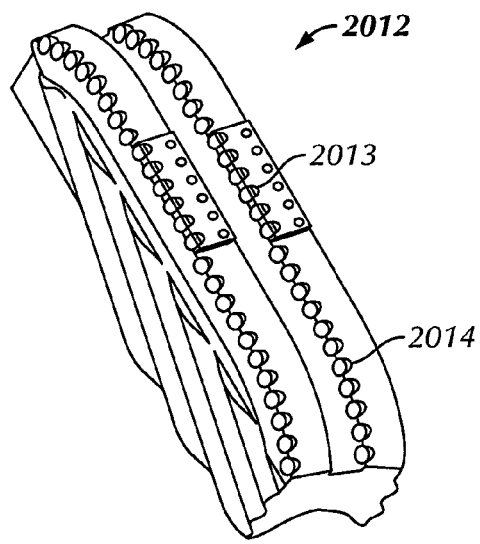
FIG. 29 shows an initial design for a blade of a secondary cutting structure in accordance with an embodiment of the present disclosure.

Referring to FIG. 29, a schematic representation of a portion of a secondary cutting structure that is modeled, simulated, analyzed, and modified according to embodiments of the present disclosure is shown. In this embodiment, the secondary cutting structure design is for a drilling operation wherein a primary cutting structure is drilling through harder formation than the secondary cutting structure. The initial design elements may include a secondary cutting structure having a blade 2012 including a gauge section having pre-flat cutting elements 2013. Additionally, the initial design elements may include cutting inserts disposed along blade 2012 at a back rake angle 2014 at or above 20°.

However, after analyzing the lateral and circumferential forces acting on the secondary cutting structure, it may be determined that pre-flat elements 2013 may induce vibration when the primary cutting structure is in softer formation and the secondary cutting structure in harder formation. Additionally, analysis may reveal that the back rack angle 2014 of greater than 20° may also induce vibration. Thus, to increase the life and effectiveness of the secondary cutting structure, the bake rake angle may be adjusted, for example to equal to or less than 20°, to decrease resultant vibrations. Additionally, in certain embodiments, pre-flat elements may be removed.

Figure 30:
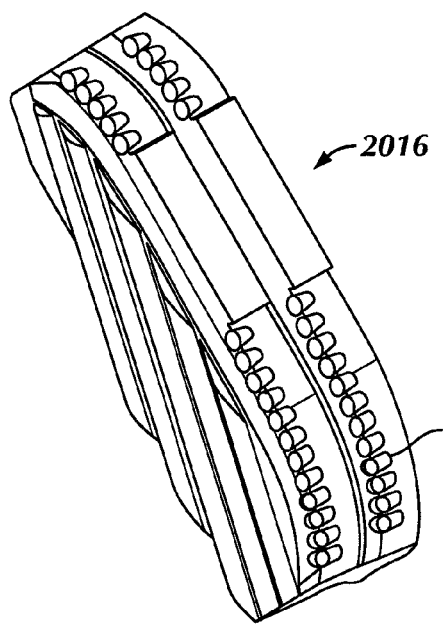
FIG. 30 shows variations of secondary cutting structure designs according to embodiments of the present disclosure.

Referring to FIG. 30, a modified secondary cutting structure, according to embodiments of the present disclosure, is shown. In this embodiment, modifying the design elements includes removing the pre-flats (2013 of FIG. 29), and adjusting the back rake angle of at least some of the cutting elements 2015 to 15°. Additionally, the analysis may reveal that such an embodiment would be particularly suited for use in softer strength interbedded formation, such as sandstones and shale. The design changes may be saved, or stored, in a design library for use in future secondary cutting structure modeling and analysis. Thus, for further secondary cutting structure designs, the initial design elements for a particular secondary cutting structure drilling a similar formation may include design features such as blade 2016.

Figure 31A:
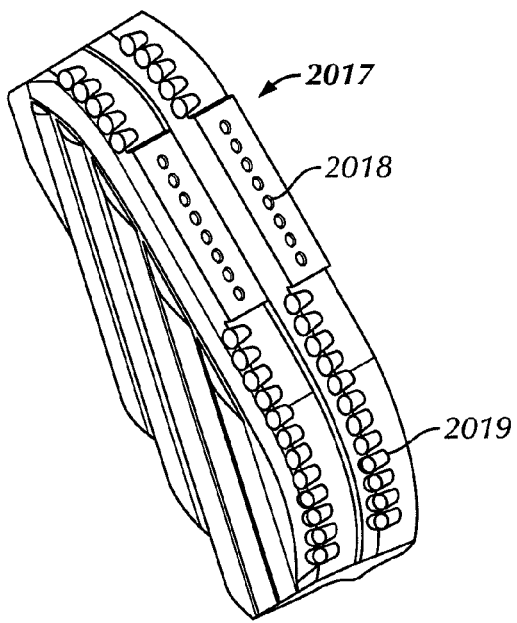
FIG. 31A shows a variation of secondary cutting structure designs according to embodiments of the present disclosure.

Referring to FIG. 31A, an alternative modified secondary cutting structure, according to embodiments of the present disclosure is shown. In this embodiment, the initial design elements for the secondary cutting structure are imported from the initial design of blade 2012 of FIG. 29. However, in this embodiment, the secondary cutting structure was simulated in more abrasive soft formation, such as medium strength rocks, sandstone, and shale, while the primary cutting structure was drilling through a softer formation. In this embodiment, the adjustment of blade 2017 includes adding additional components, such as a plurality of diamond enhanced inserts 2018 for gauge protection along the profile of blade 2017. Additionally, the back rake angle of certain cutting elements 2019 has been adjusted from 20° to 15°.

Figure 31B:
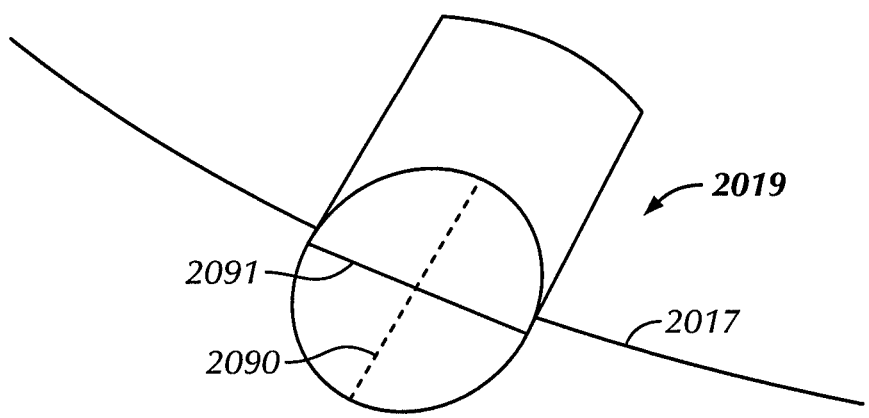
FIG. 31B shows a close perspective view of a cutting element according to embodiments of the present disclosure.

Additionally, to decrease cutting element failure, the exposure of individual cutting elements 2019 has been decreased to less than half of the cutting element diameter. Generally, cutting element exposure refers to the portion of the cutting element extending beyond the blade. Referring briefly to FIG. 31B, a close perspective of a cutting element 2019 according to embodiments of the present disclosure is shown. In this embodiment, cutting element 2019 having a diameter 2090 is illustrated disposed on a blade 2017. As illustrated, cutting element is set into blade 2017, such that less than half of the cutting element diameter 2090 is exposed during drilling, wherein a maximum cutting element exposure is shown by reference character 2091. For example, in a secondary cutting structure having 14.00 mm diameter cutting elements, less than 7.0 mm of the cutting elements is exposed. By decreasing cutting element exposure to less than 50% of cutting element diameter 2090, wear to individual cutting elements 2019 may be controlled, thereby preventing premature cutting element failure.

Figure 32:
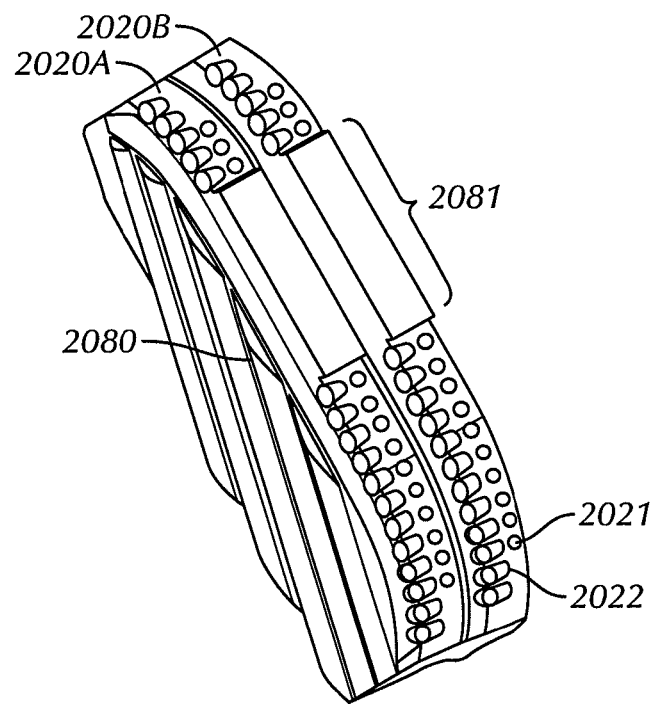
FIGS. 32-34 show variations of secondary cutting structure designs according to embodiments of the present disclosure.

Referring to FIG. 32, another alternative modified secondary cutting structure, according to embodiments of the present disclosure is shown. In this embodiment, the initial design elements for the secondary cutting structure are also imported from the initial design of blade 2012 of FIG. 29. However, in this embodiment, the secondary cutting structure was simulated drilling through a medium strength formation, such as sandstone or shale. In this embodiment, blade 2020 was adjusted after simulation to include a plurality of tungsten carbide inserts 2021 as depth of cut limiters. Similar to the prior secondary cutting structures, the back rake angle of certain cutting elements 2022 was also adjusted to 15°.

Blades 2020 also include a gauge portion 2080 that is passive 2081. In this embodiment, passive gage portion 2080 does not include cutting elements, however, in alternate embodiments, a passive gauge portion 2081 may include elements configured to protect blades 2020, while not actively cutting formation. For example, in certain embodiments, passive gauge portion 2081 may include one or more tungsten carbide inserts configured to prevent direct blade-to-formation contact, thereby protecting the blade from premature wear.

Additionally, in this embodiment, gauge portion 2080 includes a portion that is 45% of the maximum length of the secondary cutting structure. By increasing the gauge portion 2080 to include a greater percentage of the maximum length of the secondary cutting structure, and by including a passive gauge portion 2081, the radial cutting force during normal longitudinal drilling is decreased. Decreasing the radial cutting force allows the dynamic radial imbalance force generated during longitudinal drilling to be decreased as well, thereby decreasing undesirable vibrations during drilling. In still other embodiments, gauge portion 2080 may be 30% to 45% of the maximum length of the secondary cutting structure depending on the formation being drilled, operating parameters used, and/or other design elements of the secondary cutting structure. Furthermore, gauge portion length 2080 may be treated as another design element simulated and analyzed during the methods of secondary cutting structure design discussed above.

Figure 33:
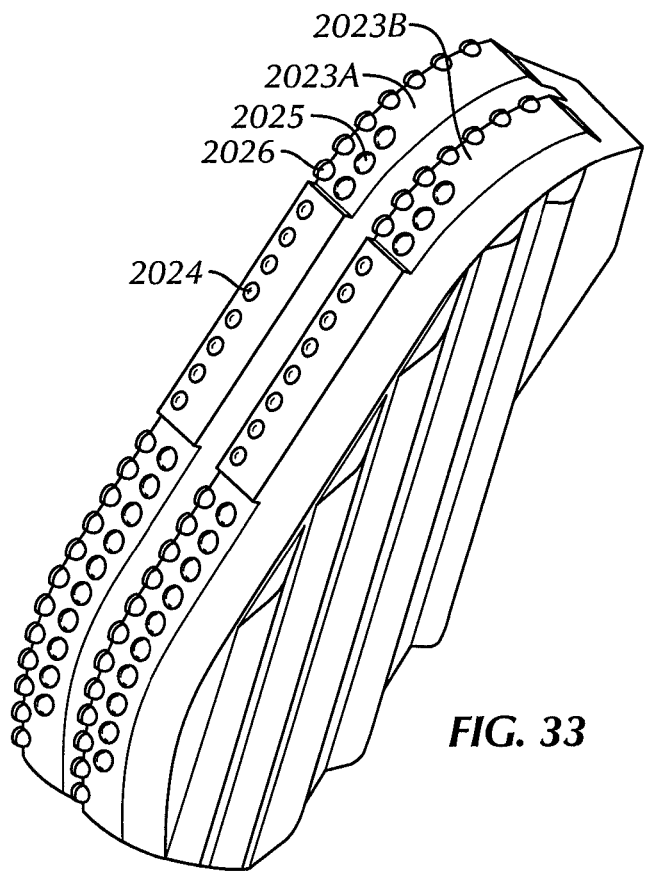

Referring to FIG. 33, another alternative modified secondary cutting structure, according to embodiments of the present disclosure, is shown. In this embodiment, the initial design elements for the secondary cutting structure are also imported from the initial design of blade 2012 of FIG. 29. However, in this embodiment, the secondary cutting structure was simulated drilling through an abrasive medium strength interbedded formation. In this embodiment, blades 2023A and 2023B are modified based on the simulation to include additional components, specifically, diamond enhanced inserts 2024 for gauge protection, and tungsten carbide cutting inserts 2025 as depth of cut limiters. Like the prior discussed adjustments, blades 2023A and B were as also adjusted to include cutting elements 2026 having a back rake angle of 15°.

As illustrated, depth of cut limiters 2025 are disposed behind cutting elements 2026 on both leading blade 2023A and trailing blade 2023B. Depth of cut limiters 2025 may include backup cutters with less exposure than primary cutting elements 2026, diamond enhanced inserts, tungsten carbide inserts, or other inserts that do not have a designated cutting capacity. While depth of cut limiters 2025 do not primarily engage formation during drilling, after wear occurs to cutting elements 2026, depth of cut limiters 2025 may engage the formation to protect the cutting elements 2026 from increased loads as a result of worn cutting elements 2026. Depth of cut limiters 2025 are disposed behind cutting elements 2026, a selected distance such that depth of cut limiters 2025 may remain unengaged with formation until a predicted wear to cutting elements 2026 occurs. The methods of simulating and analyzing, as discussed above, may be used to determine an optimal distance for depth of cut limiters 2025 to be disposed behind cutting elements 2026.

After depth of cut limiters 2025 engage formation, due to wear to cutting elements 2026, the load that would normally be placed upon cutting elements 2026 is redistributed, and per cutter force may be reduced. Because the per cutter force may be reduced, cutting elements 2026 may resist premature fracturing, thereby increasing the life of the cutting elements 2026. Additionally, redistributing cutter forces may balance the overall weight on the secondary cutting structure, thereby increasing the life of the tool. Furthermore, depth of cut limiters 2025 may provide dynamic support during wellbore enlargement, such that per cutter load may be reduced during periods of high vibration may be redistributed, thereby protecting cutting elements 2026 and/or backup cutting elements (not illustrated). During period of increased drill string bending and off-centering, depth of cut limiters 2025 may contact the wellbore, thereby decreasing lateral vibrations, reducing individual cutter force, and balancing torsional variation, so as to increase durability of the secondary cutting structure and/or individual cutting elements 2026.

Figure 34:
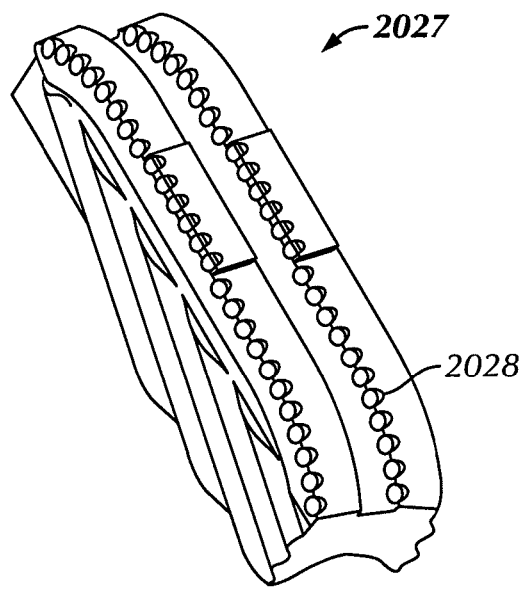

Referring to FIG. 34, another alternative modified secondary cutting structure, according to embodiments of the present disclosure, is shown. In this embodiment, the initial design elements for the secondary cutting structure are also imported from the initial design of blade 2012 of FIG. 29. However, in this embodiment, the secondary cutting structure was simulated drilling through a softer formation, such as a salt, sandstone, or shale. Additionally, unlike the prior embodiments, in this embodiment, the primary cutting structure and the secondary cutting structure were simulated drilling through homogeneous formation. After simulation, the recommended adjusted design elements include keeping the pre-flat gauge cutters 2027, while increasing the back rake angle of certain other cutters 2028.

Those of ordinary skill in the art will appreciate that the above examples are illustrative in nature, and as such, additional design element adjustments may also be made depending on specific aspects of the drilling operation and formation being drilled. Additionally, while only a blade was illustrated in the above examples, multiple blade analysis using any of the above discussed data generated by the dynamic analysis model may be used to adjust design elements of a secondary cutting structure. For example in certain embodiments, cutters on multiple blades may be compared to one another, and design elements of such cutters or blades may be adjusted to achieve backup cutter type function between the different blades, such as providing a plural set or backup cutters. In still other embodiments, individual cutter placement may be adjusted based on resultant forces on different blades, such that unique sets of cutting elements are generated, such as single set. Accordingly, the dynamics of the cutting action of individual cutters may be used to determine an optimal position for the cutters on the secondary cutting structure. As such, the relationship between design elements of secondary cutting structure and the cutting action of individual cutting elements may be determined and used to produce balanced cutting structures.

In certain embodiments, a drilling company may request an optimized secondary cutting structure for a particular drilling operation. Initial design parameters for the specified drilling tool assembly, as well as preferred design elements for a secondary cutting structure, are submitted to a designer. The designer may then use the design elements for the secondary cutting structure to produce a model of the secondary cutting structure. The model may be analyzed, for example, by simulation, to determine individual forces acting on the secondary cutting structure, as well as forces acting on individual blades and cutters. The results of the simulation may then be used to modify at least one design element of the secondary cutting structure, and an effect of the modifying, both the secondary cutting structure and a primary cutting structure may be analyzed to determine if an improved condition for the entire drilling tool assembly is achieved. In one embodiment, the improved condition may be an increased ROP, while in other embodiments, an improved condition may be a decrease in vibration. The process of simulating, analyzing, and modifying, may be repeated until an improved condition is met. The design may thereafter be output from the simulator in the form of either numerical data, a graphical illustration, or as a design of the secondary cutting structure including the modified design element. The design may then be manufactured, transacted to a secondary cutting structure manufacturer, or transacted to the drilling company.

In other embodiments, a particular design for a secondary cutting structure may cause vibrations of a drilling tool assembly during a drilling operation. The drilling company may then provide a designer the specification for the drilling tool assembly, or secondary cutting structure being used. The designer may then simulate, analyze, and modify, the secondary cutting structure to determine the type of modification to the cutting structure that may result in an improved condition. In certain embodiments, the improved condition may be achieved by adjusting secondary cutting structure design, replacing the secondary cutting structure, or modifying a drilling parameter due to the effect of the drilling parameters on the secondary cutting structure. For example, in one embodiment, the analysis may result in the determination that the primary cutting structure and the secondary cutting structure are drilling through inhomogeneous formation, thereby resulting in increased loads to the secondary cutting structure. One solution may include decreasing the WOB, while an alternative solution may be to change the secondary cutting structure to include a more aggressive cutting action, as described in detail above. After a solution to the drilling problem is determined, the solution may be transacted to the drilling company, or in other embodiments, a drilling tool assembly or secondary cutting structure may be manufactured according to the adjusted design elements.

Methods for designing secondary cutting structure for a drilling tool assembly may also include defining a cutting element profile for an individual blade, as discussed above, and then modifying subsequent blade design based on the cutting element profile. Typically, secondary cutting structure design includes one or multiple cutting element blocks disposed around a tubular body of the tool. In certain embodiments, the blocks of cutting elements may be disposed in equal angle distance along the 360° circumference of the tool, such that for a tool having three blocks, the blocks may be disposed at approximately 120° increments around the circumference of the tool.

Referring back to FIG. 32, a block including two blades 2020A and 2020B, each blade having a plurality of cutting elements 2022 disposed thereon, is shown. In this embodiment, cutting elements 2022 of leading blade 2020A are arranged in a redundant pattern to the cutting elements 2022 of trailing blade 2020B, thereby providing for a plural set blade pattern. In such plural sets, each cutting element on trailing blade 2020B is redundant to a corresponding cutting element 2022 on preceding, leading blade 2020A. In plural set blade pattern, the leading blade 2020A may include cutting elements 2022 in positions in addition to those on trailing blade 2020B, but the reverse is not true. Therefore, each cutting element 2022 on trailing blade 2020B has a corresponding cutting element 2022 on leading blade 2020A that has generally equivalent radial and axial spacing. The arrangement of cutting elements 2022 between leading blade 2020A and trailing blade 2020B are therefore redundant.

Redundant cutting elements 2022 may provide for increased durability of individual cutting elements 2022. Because each redundant cutting element 2022 follows essentially the same path as the corresponding cutting element 2022, the cutting element 2022 of the leading blade 2020A clears some formation for the redundant cutting element 2022, thereby subjecting the redundant cutting element 2022 to less resistance, and thus less wear. By decreasing the resistance placed on redundant cutting elements 2022, mechanical failure, such as cracking of the cutting elements 2022, may be decreased.

In addition to the selection of single or plural set profiles, another option for a designer in accordance with embodiments disclosed herein is a modified plural set profile. In such a profile, trailing blade 2020B includes redundant cutting elements 2022 corresponding to cutting elements 2022 of leading blade 2020A, however, trailing blade 2020B may be modified to change, for example, an exposure of cutting elements 2022 of trailing blade 2020B.

Figure 35:
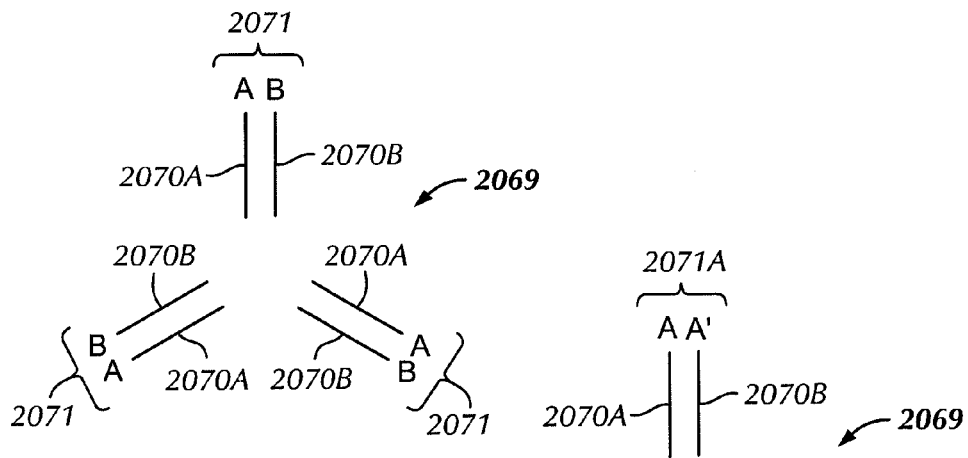
FIGS. 35-36C show schematic representations of blade configuration according to embodiments of the present disclosure.

Referring to FIG. 35, a schematic representation of a secondary cutting structure design according to embodiments of the present disclosure is shown. In this embodiment, secondary cutting structure 2069 includes three blocks 2071, each block including two blades, a leading blade 2070A and a trailing blade 2070B. During counterclockwise rotation, leading blade 2070A contacts formation first, while trailing blade 2070B subsequently contacts formation. Traditionally, blade design for secondary cutting structures 2069 provided for a first arrangement of cutting elements on leading blades 2070A and a second arrangement of cutting elements on trailing blade 2070B. For example, secondary cutting structure 2069, having three leading blades 2070A and three trailing blades 2070B would include two cutting arrangements. All leading blades 2070A would have a first cutting arrangement, while all trailing blades 2070B would have a second cutting arrangement. Illustration of first cutting arrangement is designated by reference character "A" and illustration of second cutting arrangement is designated by reference character "B." Such a secondary cutting structure design is referred to as a 2-3 set design (i.e., AB-AB-AB), wherein two unique cutting element arrangements are placed in a single block and are each repeated three times. While such cutting element arrangements provide for each block 2071 to be substantially the same, the secondary cutting structure 2069 may not be optimized for drilling under specific drilling conditions or through specific formation types.

Figure 36A:
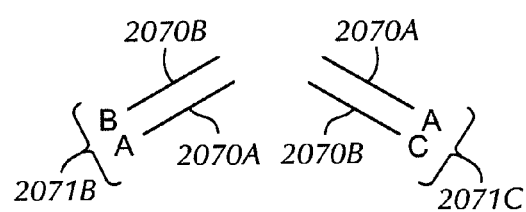

Referring to FIG. 36A, a schematic representation of a secondary cutting structure design according to embodiments of the present disclosure is shown. In this embodiment, secondary cutting structure 2069 also includes three blocks 2071, with each block having two blades, a leading blade 2070A and a trailing blade 2070B. However, instead of having a first and second cutting element arrangement in an AB-AB-AB pattern, such as that of FIG. 35, FIG. 36A illustrates a modified plural set arrangement, wherein each leading blade 2070A is of a same cutting element arrangement (represented by reference character "A"), while each trailing blade 2070B includes a different cutting element arrangement (represented by reference characters "A'", "B" and "C"). Blocks 2071B and 2071C include a first cutting arrangement A for each of leading blades 2070A, however, trailing blade 2070B cutting arrangements are unique for each blade.

For example, in one embodiment cutting arrangement A may include twenty total cutting elements disposed in a particular pattern across the length of the blade, while cutting arrangement B includes twenty-one cutting elements, and cutting arrangement C includes twenty-two cutting elements. In other embodiments, design elements that may be varied for each cutting element arrangement include cutting elements spacing, cutting element material type, number of cutting elements, blade profile design, and other design elements discussed above and known to those of skill in the art. Additionally, cutting elements may be arranged in single set, plural set or spiral set and the arrangements may vary across blocks 2071 and/or blades 2070.

Block 2071A includes a leading blade cutting element arrangement A and a trailing blade cutting element arrangement A'. Cutting element arrangement A' includes identical cutting element position on blades 2070A and 2070B, thereby providing for redundancy, such as in a plural set. However, in addition to providing redundancy through identical cutting element positioning, A' has been modified. Modification may include, for example, changing the exposure of cutting elements of the leading blade 2070A or the trailing blade 2070B, while retaining cutting element positioning, and thus redundancy.

Figure 36B:
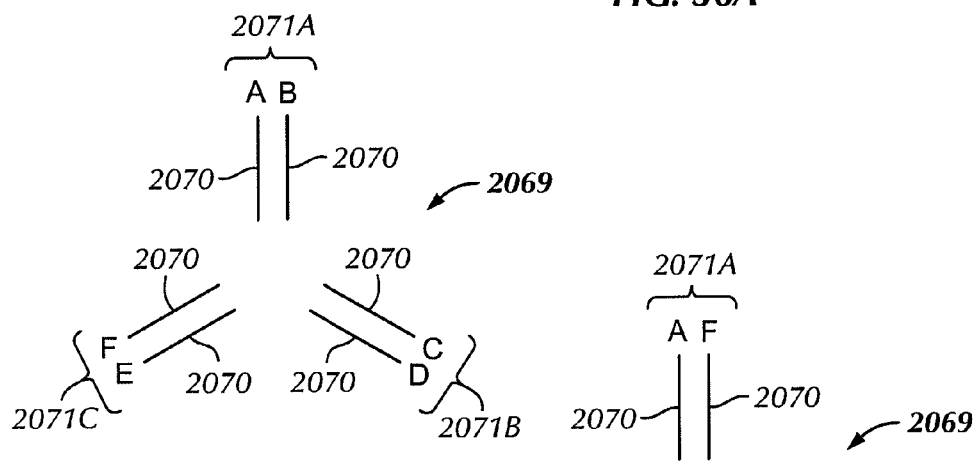
Figure 36C:
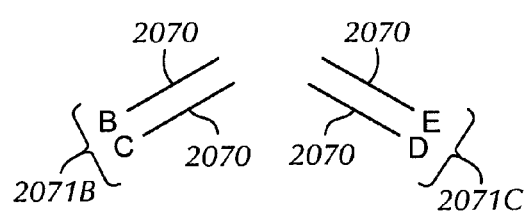

Referring to FIG. 36B, a schematic representation of a secondary cutting structure design according to embodiments of the present disclosure is shown. In this embodiment, secondary cutting structure 2069 includes a forward spiral configuration (clockwise configuration), wherein the arrangement of cutting elements on each blade is unique, such that no cuttings arrangements are duplicated. As such, each block 2071A, 2071B, and 2071B have two different blades 2070, wherein each blade has a unique cutting element arrangement, represented as arrangements A-F. Similarly, referring to FIG. 36C, a schematic representation of a secondary cutting structure design according to embodiments of the present disclosure is shown. In this embodiment, secondary cutting structure 2069 includes a reverse spiral configuration (counterclockwise configuration), wherein the arrangement of cutting elements on each blade is unique, such that no cuttings arrangements are duplicated. Accordingly, each blade 2070 includes a unique cutting element arrangement (represented as reference characters A-F), and the blades 2070 are disposed around the tool a counterclockwise configuration.

Figure 37A:
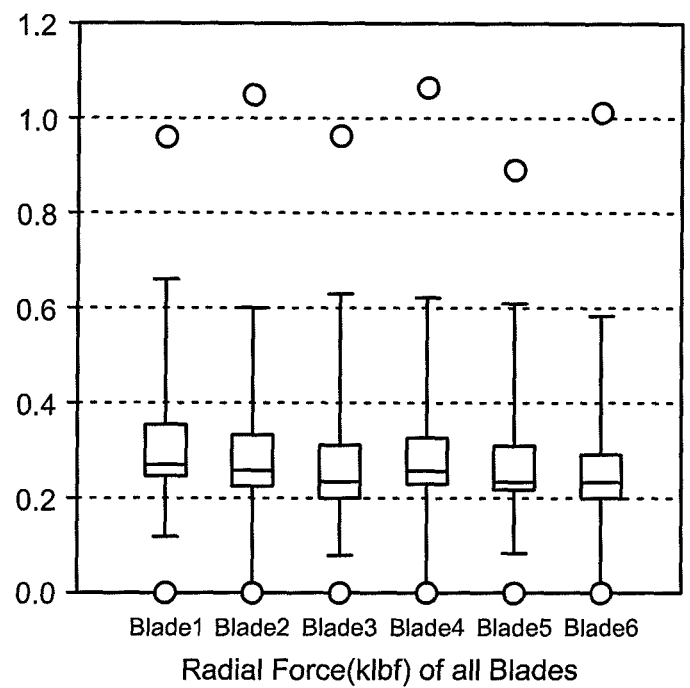
FIGS. 37A-38C show graphical representations of forces on blades in accordance with embodiments of the present disclosure.
Figure 37B:
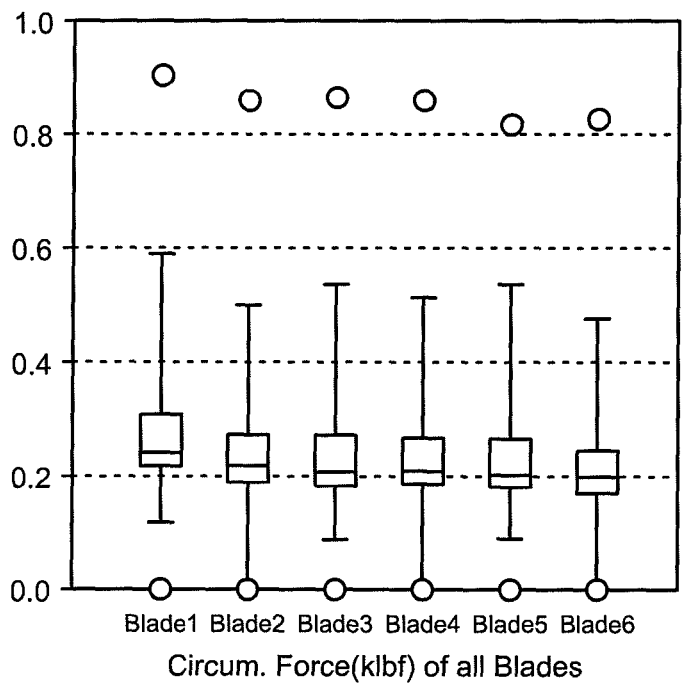
Figure 37C:
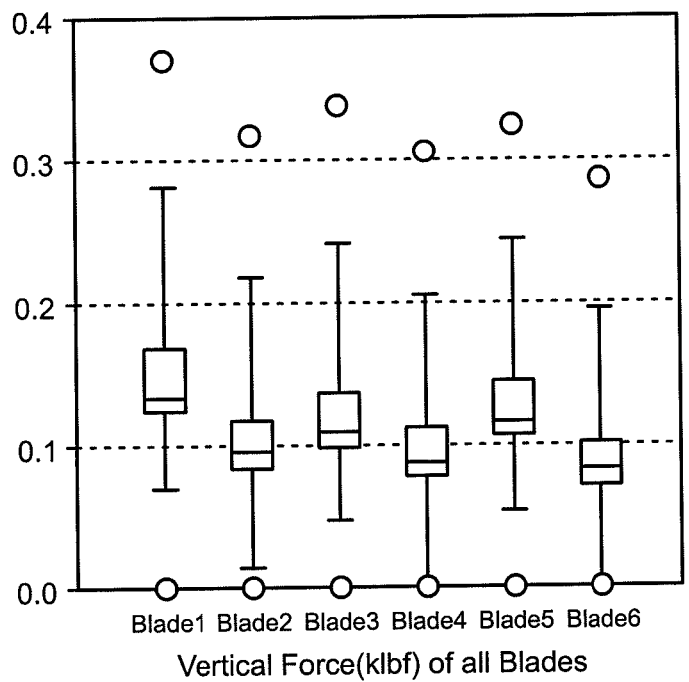

In certain embodiments, the exposure of trailing blade 2070B may be increased, or the exposure of leading blade 2070A may be decreased, such that upon contact with formation, the load distribution of cutting elements of both leading blade 2070A and trailing blade 2070B is substantially balanced. Such a configuration may be referred to as a balanced exposure, because trailing blade 2070B is exposed so as to balance the load on cutting elements of leading blade 2070A and trailing blade 2070B during use. Referring to FIGS. 37A-37C, graphical plots of forces on blades of a secondary cutting structure having a balanced exposure according to embodiments of the present disclosure are shown. Specifically, FIG. 37A illustrates radial forces on blades, FIG. 37B illustrates circumferential forces on blades, and FIG. 37C illustrates vertical/axial forces on blades. In this embodiment, leading blades 1, 3, and 5 have a 0.010" less exposure than trailing blades 2, 4, and 6. The result of decreasing leading blade exposure is a substantially balanced radial, circumferential, and vertical/axial force load between all blades, as is illustrated in FIGS. 37A-37C.

Figure 38A:
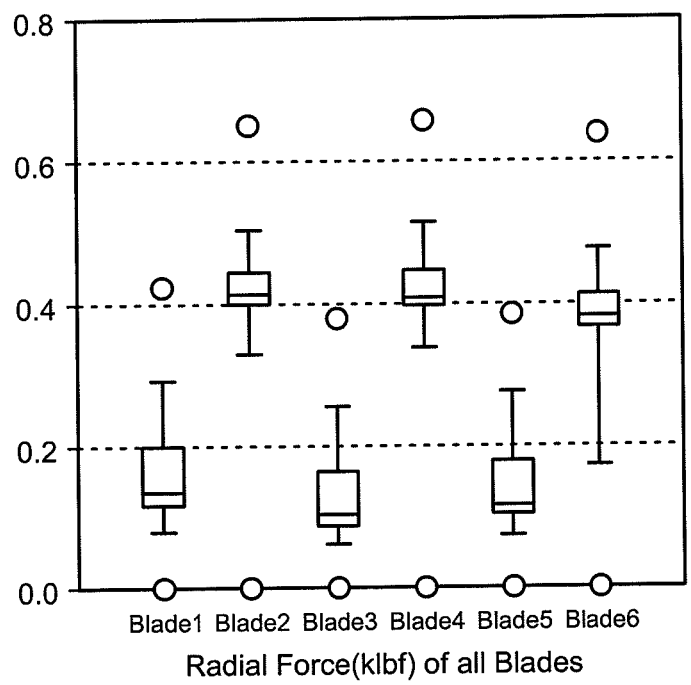
Figure 38B:
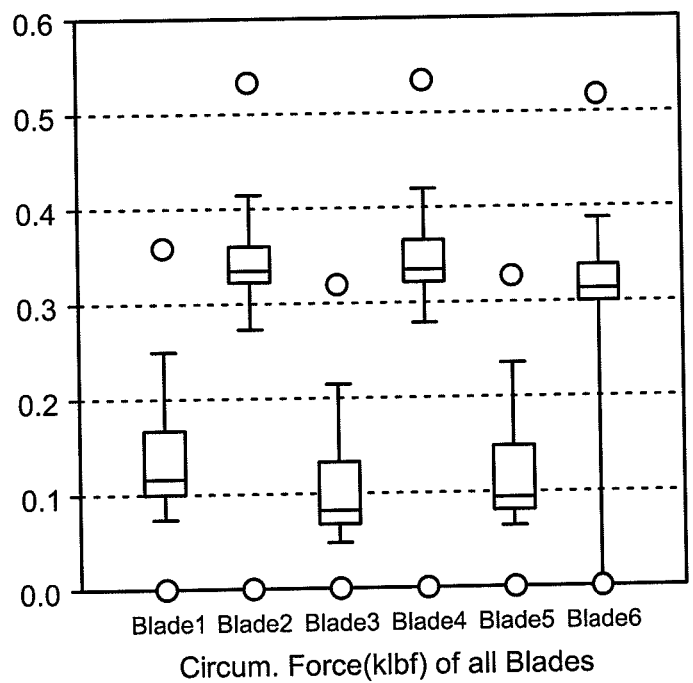
Figure 38C:
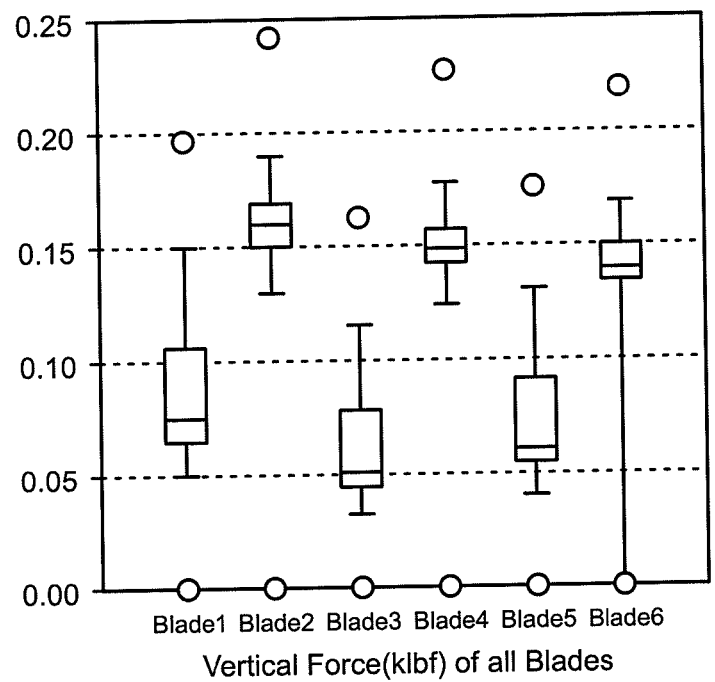

In other embodiments, leading blade 2070A may be exposed less than trailing blade 2070B, such that the forces on trailing blades are increased relative to the forces on leading blades. Referring to FIGS. 38A-38C, graphical plots of forces on blades of a secondary cutting structure having a reversed exposure according to embodiments of the present disclosure are show. Specifically, FIG. 38A illustrates radial forces on blades, FIG. 38B illustrates circumferential forces on blades, and FIG. 38C illustrates vertical/axial forces on blades. In this embodiment, leading blades 1, 3, and 5 have a 0.020" less exposure than trailing blades 2, 4, and 6. The result of decreasing leading blade exposure is a reversed radial, circumferential, and vertical/axial force load between leading and trailing blades, as is illustrated in FIGS. 38A-38C. Determining the amount of exposure for leading and/or trailing blades may include simulating, determining, and analyzing the blades, as discussed above.

Figures 23, 39:
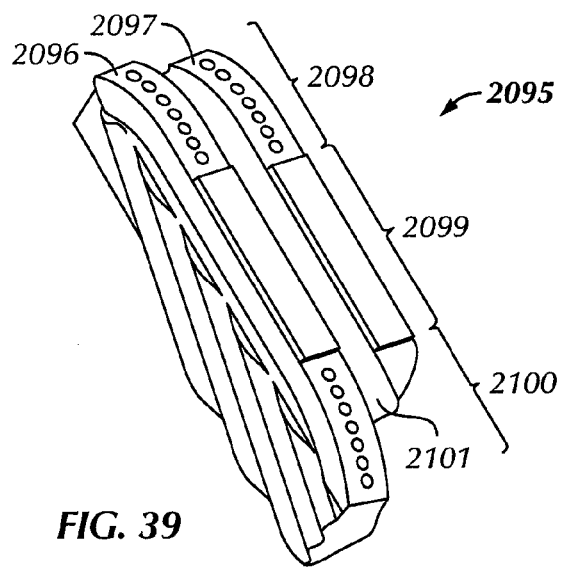
FIG. 23 shows numerical data for a secondary cutting structure in accordance with an embodiment of the present disclosure.
FIG. 39 shows a variation of a secondary cutting structure design according to embodiments of the present disclosure.

In still other embodiments, secondary cutting structures in accordance with embodiments disclosed herein may include a distribution of cutting elements on a block with one blade, multiple blades, wherein the blades may include partial blades, as well as backup cutter blades. Generally, partial blades may include blades extending less than the total length of a corresponding blade. For example, a trailing blade may have a blade length of less than a corresponding leading blade. Referring briefly to FIG. 39, a secondary cutting structure according to embodiments of the present disclosure is shown. In this embodiment, a block 2095 has a leading blade 2096 and a trailing blade 2097, wherein trailing blade 2097 is a partial blade. As illustrated, partial blade 2097 has a first cutting portion 2098 and a gauge portion 2099, but does not include a second cutting portion 2100, as found with respect to leading blade 2096.

Additionally, block 2095 includes a flow channel 2101 disposed between leading blade 2096 and trailing blade 2097. Flow channel 2101 allows drilling fluid, including drill cuttings removed by the secondary cutting structure and/or a drill bit, to pass through the secondary cutting structure directly. Flow channel 2101 may thereby provide for enhanced hydraulic flow, increasing cuttings evacuation from the wellbore, as well as provide increased cooling and lubrication to cutting elements of the secondary cutting structure.

Embodiments of the invention may provide one or more of the following advantages. Embodiments of the invention may be used to evaluate drilling information to improve drilling performance in a given drilling operation. Embodiments of the invention may be used to identify potential causes of drilling performance problems based on drilling information. In some cases, causes of drilling performance problems may be confirmed performing drilling simulations. Additionally, in one or more embodiments, potential solutions to improve drilling performance may be defined, validated through drilling simulations, and selected based on one or more selected drilling performance criteria. Further, methods in accordance with one or more embodiments of the present invention may provide analysis and monitoring of a drilling tool assembly. In particular, embodiments of the present invention have particular applicability to dynamically controlling vibrations of a drilling tool assembly.

Advantageously, one or more embodiments of the present invention provide a method for dynamic vibrational control of a drilling tool assembly. In this embodiment, a vibrational control device may be assembled to a drilling tool assembly to reduce the vibration of the drilling tool assembly. A vibrational control device in accordance with an embodiment of the invention may be actuated in response to a predicted vibration from a simulation of the drilling tool assembly.

Advantageously, one or more embodiments of the present invention may improve the fatigue life of tubulars in the BHA and drill string by minimizing or reducing vibrations and minimizing surface wear on tubulars and cased hole wellbore intervals attributed to excessive lateral movement and vibration. One or more embodiments of the present invention may enhance performance of other BHA components such as MWD, LWD, rotary steerable tools (push and point), other drive tools (PDM and turbine). These benefits may be achieved through analysis and determination of tool design and placement in assembly so as to reduce vibrations (modes and levels) as per drilling specifics of programs, formation characteristics and/or directional considerations.

In still other embodiments, aspects of the present disclosure may advantageously provide for stabilized secondary cutting structures that provide for balanced forced during drilling. Additionally, secondary cutting structures may be adjusted to optimize individual design elements, thereby resulting in decreased failure rates and premature wear to cutting elements and/or secondary cutting structures. Furthermore, the secondary cutting structure design methods disclosed herein may allow for secondary cutting structure designs that are optimized relative to specific primary cutting structure designs. Thus, optimized drilling tool assemblies may be designed to have higher ROPs, increased life, and are less likely to experience premature wear.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed:

1. A method for designing a secondary cutting structure for a drilling assembly, the method comprising:
    defining a first cutting element arrangement for a first blade of a block;
    modifying a design element of the first cutting element arrangement to produce a second cutting element arrangement for a second blade; and
    disposing the first and second blades on the block, wherein the first and second cutting element arrangements are redundant.

2. The method of claim 1, wherein the design element comprises a cutting element exposure.

3. The method of claim 2, wherein the cutting element exposure is one selected from a group consisting of balanced exposure and reverse exposure.

4. The method of claim 1, further comprising:
defining a third cutting element arrangement for a third blade of a second block, wherein the third cutting element arrangement is unique.

5. The method of claim 4, further comprising:
defining a fourth cutting element arrangement for a fourth blade of a third block, wherein the fourth cutting element arrangement is unique.

6. The method of claim 5, further comprising:
arranging the first, second, and third blocks around a tubular body in an about equal distant configuration.

7. The method of claim 3, wherein balanced exposure comprises an about equal distribution of load on the first blade and the second blade.

8. The method of claim 3, wherein reverse exposure provides forces on the first blade that are increased relative to forces on the second blade.

9. The method of claim 3, wherein reverse exposure provides forces on the second blade that are increased relative to forces on the first blade.

10. A method for designing a secondary cutting structure for a drilling assembly, the method comprising:
defining a first cutting element arrangement for a first blade of a block;
modifying a design element of the first cutting element arrangement to produce a second cutting element arrangement for a second blade; and
disposing the first and second blades on the block in a plural set blade pattern.

11. The method of claim 10, wherein the plural set blade pattern includes a plurality of first cutting elements of the first blade arranged to correspond with a portion of a plurality of second cutting elements of the second blade.

12. The method of claim 10, wherein the plural set blade pattern includes a plurality of first cutting elements of the first blade arranged having about the same radial and axial spacing as a portion of a plurality of second cutting elements of the second blade.

13. The method of claim 10, wherein the plural set blade pattern comprises a pattern wherein each cutting arrangement is different.

14. A method for selecting a drilling tool assembly, comprising:
defining first initial design elements for a secondary cutting structure of a bottom hole assembly (BHA);
performing a first dynamic simulation of the BHA based on the first initial design elements;
presenting a first dynamic response of the BHA calculated from the first dynamic simulation.

15. The method of claim 14, wherein the first dynamic simulation includes simulating additional drilling tool assembly components, wherein additional drilling tool assembly components include at least one selected from a group consisting of a drill bit, stabilizers, measurement-while-drilling and logging-while-drilling apparatuses, stabilizers, directional drilling devices, drill collars, special drilling tools, heavy weight drill pipes, and drill pipes.

16. The method of claim 14, further comprising:
defining second initial design elements for the secondary cutting structure of the BHA;
performing a second dynamic simulation of the BHA based on the first and second initial design elements; and
presenting a second dynamic response of the BHA calculated from the second dynamic simulation.

17. The method of claim 14, further comprising:
modifying a design element of the secondary cutting structure and performing the dynamic simulation until a drilling condition is optimized.

18. The method of claim 17, wherein the drilling condition is at least one selected from a group consisting of Rate of Penetration (ROP), cutting structure wear, and axial, lateral, and torsional vibrations.

19. The method of claim 17, wherein the design element is at least one selected from a group consisting of cutting element profiles, positioning of cutting elements, type of cutting elements, cutting element materials, side rake angle of cutting elements, back rake angle of cutting elements, use of single, plural, or spiral sets of cutting elements, design of blade pattern and type, and blade circumferential and angular position.

* * * * *